United States Patent
Cruchon-Dupeyrat et al.

(10) Patent No.: US 7,034,854 B2
(45) Date of Patent: Apr. 25, 2006

(54) METHODS AND APPARATUS FOR INK DELIVERY TO NANOLITHOGRAPHIC PROBE SYSTEMS

(75) Inventors: Sylvain Cruchon-Dupeyrat, Chicago, IL (US); Michael Nelson, Libertyville, IL (US); Robert Elghanian, Wilmette, IL (US); Joseph S. Fragala, San Jose, CA (US); Igor Touzov, Cary, NC (US); Debjyoti Banerjee, Fremont, CA (US)

(73) Assignee: Nanoink, Inc., Chicago, IL (US)

( * ) Notice: Subject to any disclaimer, the term of this patent is extended or adjusted under 35 U.S.C. 154(b) by 172 days.

(21) Appl. No.: 10/705,776

(22) Filed: Nov. 12, 2003
(Under 37 CFR 1.47)

(65) Prior Publication Data

US 2005/0035983 A1    Feb. 17, 2005

Related U.S. Application Data

(60) Provisional application No. 60/508,286, filed on Oct. 6, 2003, provisional application No. 60/425,252, filed on Nov. 12, 2002.

(51) Int. Cl.
*B41J 2/005* (2006.01)
(52) U.S. Cl. .................................................. 346/140.1
(58) Field of Classification Search ...................... None
See application file for complete search history.

(56) References Cited

U.S. PATENT DOCUMENTS

| | | | |
|---|---|---|---|
| 5,904,824 A * | 5/1999 | Oh | 204/601 |
| 6,635,311 B1 * | 10/2003 | Mirkin et al. | 427/256 |
| 2003/0228411 A1 * | 12/2003 | Tai et al. | 427/58 |
| 2004/0223886 A1 * | 11/2004 | Liu et al. | 422/100 |
| 2004/0238484 A1 * | 12/2004 | Le Pioufle et al. | 216/27 |

FOREIGN PATENT DOCUMENTS

| WO | WO 00/41213 A1 | 7/2000 |
|---|---|---|
| WO | WO 01/43876 A1 | 6/2001 |

OTHER PUBLICATIONS

Copy of International Search Report dated Jul. 2, 2004.

* cited by examiner

*Primary Examiner*—Huan Tran
(74) *Attorney, Agent, or Firm*—Foley & Lardner LLP

(57) ABSTRACT

Inkwells adapted for use in direct-write nanolithography and other applications including use of wells, channels, and posts. The wells can possess a geometry which matches the geometry of tips which are dipped into the inkwells. The channels can be open or closed. Hydrophilicity and hydrophobicity can be used to control ink flow. SEM can be used to characterize the inkwells. Ink flow can be monitored with video. Hydrophobic material layers can be used to prevent cross contamination. Microsyringes can be used to fill reservoirs. Satellite reservoirs can be used to prevent bubble formation.

20 Claims, 43 Drawing Sheets

Ink-wells for Dip-Pen Nanolithography

Testing DPN Ink-wells using fluorescent dye.

(A) Phase contrast image of the ink-wells containing a fluorescent dye. (B) Fluorescence microscopy image of the same sample, showing the fluorescent ink flowing inside the micro ink-wells.

Satellite reservoir with channels, inkwells and alignment marks

Fabrication (SEM Pictures)

Overview of inkwell layout, reservoir and alignment marks

Close up of inkwell layout, reservoir and alignment marks

Close up of inkwell layout and alignment marks

METHODS AND APPARATUS FOR INK DELIVERY TO NANOLITHOGRAPHIC PROBE SYSTEMS

RELATED APPLICATIONS

This application claims the benefit of provisional application Ser. No. 60/425,252 filed Nov. 12, 2002 to Cruchon-Dupeyrat et al. (083847-0188) and Ser. No. 60/508,286 to Fragala et al. filed Oct. 6, 2003 (083847-0227); both of these provisional applications are incorporated herein by reference in their entirety including claims and figures.

INTRODUCTION

Recent advances have been made wherein tips are used to apply inks to surfaces at both the microscopic and nanoscopic scale. For example, tips can be non-hollow and coated with the ink on the tip surface before application of the ink to the surface. Alternatively, tips can be hollow and the ink can pass through the hollow region of the tip to the surface. The result is excellent molecular level control of a printing process. In many cases, the tips or nanoscopic tips and can be used for both ink transfer and for imaging of patterns by scanning probe microscopic methods including atomic force microscopic methods. Physical and chemical interactions between the ink and the surface can be used to engineer the printed structure. Moreover, the meniscus between a nanoscopic tip and the surface can be used to facilitate printing. The processes can be adapted for single tips or multiple tips using single inks or multiple inks. Alignment can be excellent. However, many technical challenges arise with these printing processes at small scale, including the nanoscale, which do not arise with larger scale printing.

In these printing processes, ink is delivered to the tip in a continuous or non-continuous manner. Advanced ink delivery methods and devices are needed which allow these printing processes to be commercialized. Existing commercial products do not allow for this advanced ink delivery and, generally, little is known about commercial use of ink wells and microfluidics for nanolithographic printing. Moreover, they are not adapted for use with instruments and printing equipment, particularly at the commercial scale.

The present invention addresses these and other problems.

U.S. Pat. No. 6,635,311 to Mirkin et al. describes nanolithographic printing with tips and inks including nanoplotter systems using micron-scale wells.

U.S. Patent Applicaton Publication 2002/0063212 to Mirkin et al. (May 30, 2002) further describes nanolithographic printing with tips and inks including multiple tip arrays in a nanoplotter format (see for example Example 6).

U.S. Pat. No. 6,642,129 to Liu et al. (Nov. 4, 2003) further describes use of multiple tips which are individually movable.

U.S. Pat. No. 6,573,369 to Henderson et al. (Jun. 3, 2003) purports to describe deposition of compounds from tips.

U.S. Patent Application Publication Nos. 2002/0123135 (Sep. 5, 2002) and 2002/0076927 (Jun. 20, 2002) to Henderson et al. further purport to describe an apparatus for deposition of compounds from tips.

U.S. Pat. No. 6,270,946 to Miller purports to describe nanoscale delivery devices.

U.S. Pat. No. 6,386,219 describes a fluid handling system.

SUMMARY

The present invention is summarized in this section in a non-limiting manner. Multiple embodiments exist including embodiments for delivering ink to dipping wells for ink transfer to one or more tips and embodiments for directly delivering ink to the one or more tips.

In one embodiment, for example, the present invention provides an ink delivery device for direct-write nanolithographic printing of inks with use of a tip or tip array comprising:
  ink reservoirs,
  microfluidic channels connected to the ink reservoirs;
  dipping wells connected to the microfluidic channels,
  wherein the dipping wells have a geometry for dipping the tip or tip array into the dipping wells.

In another embodiment, the present invention provides a delivery device for direct-write nanolithographic printing using a tip array comprising:
  reservoirs,
  microfluidic channels connected to the reservoirs;
  an array of dipping wells connected to the microfluidic channels,
  wherein the array of dipping wells has a geometry which matches the arrangement of the tip array.

In another embodiment, the present invention provides a method of creating an array of inked probes for performing direct-write nanolithographic printing, the method comprising the steps of:
  (a) providing an array of wells, channels, or posts, wherein at least some of the wells, channels, or posts have an ink therein;
  (b) providing an array of tips, wherein the tips are adapted to be associated and aligned with said wells, channels, or posts;
  (c) transferring ink in at least some of the wells, channels, or posts having ink therein onto the tips or probes associated therewith by:
    (c1) immersing the tips or probes in the wells or channels associated therewith; or
    (c2) contacting the tips or probes with the posts associated therewith.

The present invention also provides a system comprising:
  an array of probes;
  at least one ink source having an ink therein;
  a microfluidic delivery system adapted to carry said ink to said array of probes;
  device for transferring the ink onto selected probes; and
  a substrate adapted to be contacted by said array of probes, and wherein when the array of probes is in contact with the substrate, those probes having ink thereon will deposit the ink onto the substrate.

The present invention also provides a substrate comprising:
  an array of wells and channels,
  wherein the wells and channels are adapted to be associated and aligned with an array of tips for direct-write nanolithographic printing of ink on the tips.

The present invention also provides a microfluidic device comprising:
  a substrate comprising a surface and a plurality of microchannels which are hydrophilicly surface treated, and
  at least one hydrophobic barrier layer on the surface between the microchannels which prevents cross contamination between the plurality of microchannels when liquid flows through the microchannels.

Also provided is a microfluidic device comprising:

a substrate comprising a surface and a plurality of microchannels, and at least one hydrophilic barrier layer on the surface between the microchannels which prevents cross contamination between the plurality of microchannels when liquid flows through the microchannels.

In another embodiment, the invention provides a microfluidic device comprising:

a substrate comprising a surface and a plurality of microchannels, wherein an ink has a contact angle of less than 90 degrees on the microchannel surface, and at least one barrier layer on the surface between the microchannels, wherein the ink has a contact angle of more than 90 degrees with the barrier layer.

The invention also provides a microfluidic device comprising:

a substrate comprising a surface and a plurality of microchannels which are hydrophilicly surface treated, and at least one hydrophobic barrier layer on the surface between the microchannels which prevents cross contamination between the plurality of microchannels when liquid flows through the microchannels.

Also provided is an inkwell device adapted for use for dipping of a nanoscopic tip to transfer ink from the inkwell device to the tip, wherein the inkwell device comprises at least one hydrophobic barrier layer on a substrate surface which prevents ink from travelling out of a microchannel disposed next to the hydrophobic barrier layer.

Also provided is an inkwell device adapted for use for dipping of a nanoscopic tip to transfer ink from the inkwell device to the tip, wherein the inkwell device comprises at least one hydrophilic barrier layer on a substrate surface which prevents ink from travelling out of a microchannel disposed next to the hydrophilic barrier layer.

The invention also provides a method for keeping liquid inside a microchannel as it flows through the microchannel and prevent cross contamination comprising the steps of:

providing a patterned photoresist on a substrate,
etching the substrate to form a microchannel,
removing photoresist, and
deposition of hydrophobic barrier layer on the substrate surrounding the microchannel.

The invention also provides a method for keeping liquid inside a microchannel as it flows through the microchannel comprising the steps of:

(A) providing a patterned photoresist on a substrate, wherein the substrate comprises an underlying substrate layer and an oxidized overlayer which contacts the photoresist,
(B) etching of the oxidized overlayer,
(C) removing the photoresist, and
(D) depositing of hydrophobic barrier layer on the substrate surrounding the microchannel.

The invention also provides a method for keeping liquid inside a microchannel as it flows through the microchannel and prevent cross contamination comprising the steps of:

deposit a hydrophobic barrier layer onto a substrate,
pattern a photoresist onto the hydrophobic barrier layer,
etch microchannels into the substrate, and
remove the photoresist.

Another embodiment is a method for preventing cross contamination in closely spaced microchannels in a microfluidic device comprising the step of forming a hydrophobic barrier layer between the microchannels, wherein the hydrophobic layer is disposed on the substrate surface surrounding the microchannels.

The present invention provides a method of fabricating an inkwell device comprising etching microchannels into a substrate, and depositing a hydrophobic barrier layer on surfaces next to the microchannels, wherein the same instrument is used for both the etching step and the depositing of the hydrophobic barrier layer.

The present invention also provides a nanolithography kit comprising an inkwell device, wherein the inkwell device is surface treated with a hydrophobic barrier layer to prevent cross contamination. The kit can comprise other articles described in this application. For example, the kit can further comprise a micropositioner with a microsyringe.

Basic and novel features of the invention include adapting features of inkwells, including microfluidic inkwells, for direct-write nanolithographic printing with use of tips and generally avoiding features undesirable or extraneous to nanolithographic printing.

DETAILED DESCRIPTION

Figure 1:
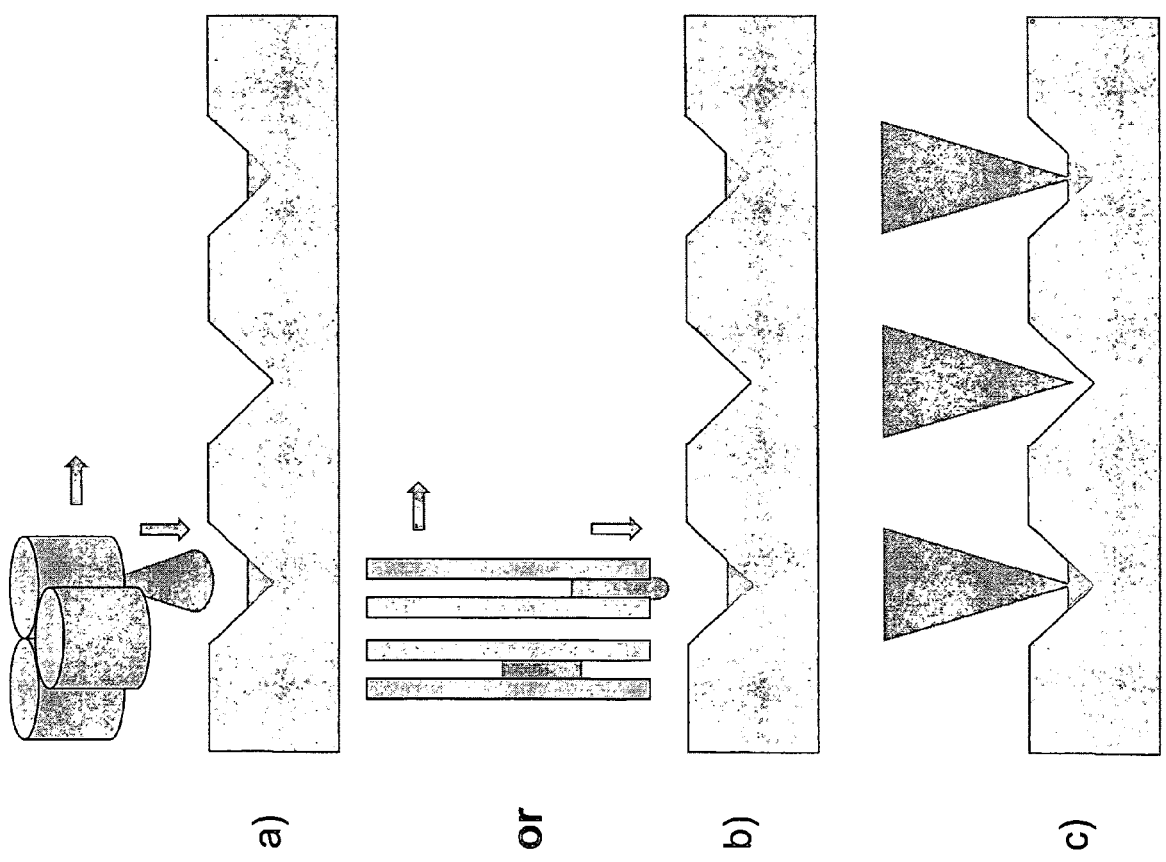
FIG. 1 depicts a probe inking in an array of wells and method of ink delivery to the well array.

The present invention generally relates to methods and devices for the delivery of one or more "inks" to systems capable of at least one type of deposition nanolithography, including DIP PEN NANOLITHOGRAPHY™ printing (DPN™ printing) (trademarks of NanoInk, Inc., Chicago, Ill.).

DPN™ printing and deposition methods are extensively described in the following patent applications and patent publications (List A), each of which is hereby incorporated by reference in its entirety to support the disclosure for the present inventions, in particular, with respect to the experimental parameters for carrying out nanolithography deposition:

(1). U.S. Provisional Patent Application Ser. No. 60/115,133 filed Jan. 7, 1999 ("Dip Pen Nanolithography");

(2). U.S. Provisional Patent Application Ser. No. 60/157,633 filed Oct. 4, 1999 ("Methods Utilizing Scanning Probe Microscope Tips and Products Therefor or Produced Thereby");

(3). U.S. patent application Ser. No. 09/477,997 filed Jan. 5, 2000 ("Methods Utilizing Scanning Probe Microscope Tips and Products Therefor or Produced Thereby");

(4). U.S. Provisional Patent Application Ser. No. 60/207,713 filed May 26, 2000 ("Methods Utilizing Scanning Probe Microscope Tips and Products Therefor or Produced Thereby");

(5). U.S. Provisional Patent Application Ser. No. 60/207,711 filed May 26, 2000 ("Methods Utilizing Scanning Probe Microscope Tips and Products Therefor or Produced Thereby");

(6). U.S. patent application Ser. No. 09/866,533 filed May 24, 2001 ("Methods Utilizing Scanning Probe Microscope Tips and Products Therefor or Produced Thereby");

(7). U.S. Patent Publication No. 2002/0063212 A1 published May 30, 2002 ("Methods Utilizing Scanning Probe Microscope Tips and Products Therefor or Produced Thereby");

(8). U.S. Patent Publication No. 2002/0122873 A1 published Sep. 5, 2002 ("Nanolithography Methods and Products Produced Therefor and Produced Thereby");

(9). PCT Publication No. WO 00/41213 A1 published Jul. 13, 2000 based on PCT Application No. PCT/US00/00319 filed Jan. 7, 2000 ("Methods Utilizing Scanning Probe Microscope Tips and Products Therefor or Produced Thereby");

(10). PCT Publication No. WO 01/91855 A1 published Dec. 6, 2001 based on PCT Application No. PCT/US01/17067 filed May 25, 2001 ("Methods Utilizing Scanning Probe Microscope Tips and Products Therefor or Produced Thereby");

(11). U.S. Provisional Patent Application Ser. No. 60/326,767 filed Oct. 2, 2001, ("Protein Arrays with Nanoscopic Features Generated by Dip-Pen Nanolithography");

(12). U.S. Provisional Patent Application Ser. No. 60/337,598 filed Nov. 30, 2001, ("Patterning of Nucleic Acids by Dip-Pen Nanolithography").

(13). U.S. Provisional Patent Application Ser. No. 60/341,614 filed Dec. 17, 2001, ("Patterning of Solid State Features by Dip-Pen Nanolithography");

(14). U.S. Provisional Patent Application Ser. No. 60/367,514 filed Mar. 27, 2002, ("Method and Apparatus for Aligning Patterns on a Substrate");

(15). U.S. Provisional Patent Application Ser. No. 60/379,755 filed May 14, 2002, ("Nanolithographic Calibration Methods"); and (16). U.S. Provisional Patent Application filed Oct. 21, 2002 ("Nanometer-scale engineered structures, methods and apparatus for fabrication thereof, and applications to photomask repair and enhancement").

In particular, reference (3) above describes different types of tips (pages 7–8), different ways of coating the tips (pages 14–16), and the use of a nanoplotter (page 18), which are hereby incorporated by reference. Also, reference (6) describes a nanoplotter at pages 23–24 and FIGS. 17 and 18, including working example 6, pages 58–64, which are hereby incorporated by reference. Reference (14), which is hereby incorporated by reference, describes acquiring images of the probe(s) and substrate from a CCD camera output and annotating them with markers and patterns, this technique being useful for alignment in direct-write nanolithography and multi-ink patterning methods. See, also, U.S. Patent Application Publication No. 2003/0185967 to Eby et al. (Oct. 2, 2003). Printing equipment and supplies can be obtained from NanoInk, Inc. (Chicago, Ill.).

In addition, the following documents relating to DPN printing can be used in the practice of the present invention (List B):

1. Piner, R. D., Zhu, I. Xu, F., Hong, S. & Mirkin, C. A. Dip-pen nanolithography. *Science* vol. 283, 661–663 (1999).

2. Demers, L. M. et at. Direct patterning of modified oligonucleotides on metals and insulators by dip-pen nanolithography. *Science* vol. 296, 1836–1838 (2002).

3. Maynor, B. W., Li, Y. & Liu, J. Au "ink" for AFM "dip-pen" nanolithography. *Langmuir* vol. 17, 2575–2578 (2001).

4. Li, Y., Maynor, B. W. & Liu, J. Electrochemical AFM "dip-pen" nanolithography. *J. Am. Chem. Soc.* Vol. 123, 2105–2106 (2001).

5. Noy, A. et at. Fabrication of luminescent nanostructures and polymer nanowires using dip-pen nanolithography. *Nano Lett.* Vol. 2, 109–112 (2002).

6. Liu, X., Fu, L., Hong, S., Dravid, V. P. & Mirkin, C. A. Arrays of magnetic nanoparticles patterned via "dip-pen" nanolithography. *Adv. Mater.* Vol. 14, 231–234 (2002).
7. Su, M, Liu, X, Li, S. -Y, Dravid, V. P. & Mirkin, C. A. Moving beyond molecules: patterning solid state features via dip-pen nanolithography with sol-based inks. *J. Am. Chem. Soc.* Vol. 124, 1560–1561 (2002).
8. McKendry , R. et al. Creating nanoscale patterns of dendrimers on silicon surfaces with dip-pen nanolithography. *Nano Lett*. Vol. 2, 713–716 (2002).
9. Zhang, M. et al. A MEMS nanoplotter with high-density parallel dip-pen nanolithography (DPN) probe arrays. *Nanotech.* Vol. 13, 212–217 (2002).
10. U.S. Provisional application 60/379,755 filed Aug. 9, 2002, "Apparatus, Materials, and Methods for Fabrication and Catalysis"
11. U.S. Provisional application 60/379,755 filed Aug. 9, 2002, "Apparatus, Materials, and Methods for Fabrication and Catalysis"
12. Demers et al. *Angew Chem. Int. Ed. Engl.* 2001, 40(16), 3069–3071.
13. Demers et al. *Angew Chem. Int. Ed. Engl.* 2001, 40(16), 3071–3073.
14. Liu et al. *Adv. Mater.* 2002, 14, No. 3, Feb. 5, 231–234.
15. L. M. Demers et al., "Direct Patterning of Modified Oligonucleotides on Metals and Insulators by Dip-Pen Nanolithography," *Science,* 2002, Jun. 7, 296, pages 1836–1838.
16. Hong et al., *Science,* 15 Oct. 1999, Vol. 286, pgs. 523–525.
17. Hong et al., *Science,* 9 Jun. 2000, Vol. 288, pgs. 1808–1811.
18. Hong et al., *Langmuir,* 13 Oct. 1999, Vol. 15, pgs. 7897–1900.
19. Ivanisevic et al., *J. Am. Chem. Soc.,* 19 Jul. 2001, Vol. 123, pgs. 7887–7889.
20. Demers et al., *Angew Chem. Int. Ed. Engl.* 2001, 40(16), pgs. 3069–3071.
21. Demers et al., *Angew Chem. Int. Ed. Engl.* 2001, 40(16), pgs. 3071–3073.

In addition, the present invention can be adapted as needed to be used with the deposition methods described, without experimental support, in the following patent publications to Henderson et al.: (1) 2002/0123135 published Sep. 5, 2002, (2) 2001/0044106 published Nov. 22, 2001, and (3) 2002/0076927 published Jun. 20, 2002.

Deposition nanolithography includes a plurality of techniques in which one or more inks may be transferred from the nanolithography device to a substrate in the form of a predetermined pattern. Ink deposition leads to: (1) the formation of a thin or thick film on the sample; or (2) the modification of the substrate (i.e., by reaction of the ink with the substrate, the surrounding ambient, or both).

Ink delivery to the probe prior or during nanofabrication is an important step towards successful nanolithography. Ink delivery methods may ultimately control the fabrication throughput, the maximum duration of the fabrication experiment (given the lifetime of the ink to be deposited) and the chemical complexity of the nanofabricated features. Also, the patterned area is ultimately limited by the amount of material that is initially applied to the probe, unless ink replenishment occurs.

Ink delivery generally has been a manual, and at times, time-consuming process. Examples of known ink delivery methods include: (1) dipping of the probe in a solution containing the molecule(s) of interest (or pipetting of the solution on the tip), followed by evaporation of the solvent; and (2) sublimation of the molecule(s) of interest onto the probe by way of gentle heating of an ink source placed together with the tip assembly in an appropriate enclosure.

Two main approaches to ink delivery can be distinguished: (a) continuous ink replenishment; and (b) periodic ink replenishment. A continuous ink replenishment system would deliver ink to the probe using a fluidics system connected to an ink source, and allow the tip to continue writing until such time that the ink source was depleted. A periodic ink replenishment system requires the tip to be refilled or recoated with ink from time to time. Writing would be temporarily interrupted and then restarted after the ink on the tip was replenished and the tip realigned with the current pattern. In the periodic ink replenishment case, it may be necessary to physically remove the probe assembly from the instrument hosting it, or move the probe assembly from the vicinity of the area being fabricated.

Inking procedures of specific interest to industrial (deposition) nanolithography processes include, in order of technical difficulty: (a) the deposition of one ink on a (potentially large) number of tips; (b) the systematic deposition of a small number of inks on a plurality of tips along a pre-defined, repetitive pattern; (c) the deposition of a plurality of inks on a plurality of tips in a non-repetitive manner from experiment to experiment; (d) the deposition of a large number of inks on a large number of tips, including the delivery of one ink per tip.

Specific examples include the delivery of: (1) a single metallic precursor, such as an organometallic compound, to one or a few probes, in order to repair a defect in a photomask, large volumes (μL) of ink may be necessary to deposit multiple layers or cover a large area; (2) a few solutions of immuglobulin-coated nanoparticles to a one-dimensional array of cantilevers, to fabricate electrically-transduced nanobiosensors; (3) one or more compound(s), such as a gold colloid solution or a conducting polymer, to an array of actuated cantilevers, to fabricate a large number of nanotransistors onto a microchip; and (4) a large set (e.g., thousands) of aminoacid or nucleotide or enzyme inhibitor precursors to as many tips to form ultrahigh-density combinatorial arrays.

Desirable ink delivery procedures should: (1) deposit few or many ink(s) to few or many tips; (2) proceed rapidly and precisely, in a repeatable and reproducible manner, preferably in an automated or semi-automated way; (3) deliver inks of varied chemical composition and physical state; (4) deliver ink either after probe manufacturing but before shipping to customers, or just before or during the nanolithography run; (5) be easily combined with probe cleaning/washing methods, after or during the nanolithography run, resulting in reuse of the tip or tip array; and/or (6) operate in a controlled environment (including humidity and temperature).

This invention describes means to replenish or continuously supply ink(s) to the probe(s). In particular, the invention relates to systems for DIP PEN NANOLITHOGRAPHY™ (DPN™) printing and deposition. DIP PEN NANOLITHOGRAPHY™ and DPN™ are trademarks for NanoInk, Inc., Chicago, Ill. These nanolithographic systems are used to fabricate nanometer-scale patterns on a substrate. During the patterning process, ink is transferred from a nanolithography means, hereby referenced as a probe or tip, onto a surface of interest. This is generally done by positioning the probe or tip over the substrate so that it is sufficiently close to or contacts the substrate to allow for transfer of ink from tip to substrate. DPN™ printing and deposition-related products, including hardware, software, and instrumentation are also available from NanoInk, Inc. (Chicago, Ill.).

The nanolithography systems described herein can be capable of, but are not limited to, the controlled production of features of characteristic dimension: (a) inferior to about 90 nanometers but superior to about 50 nm; (b) inferior to about 50 nm but superior to about 10 nm; or (c) inferior to about 10 nm. This does not, however, exclude systems also capable of microscopic or mesoscopic-scale lithography.

The "inks" discussed herein can be one or a plurality of chemical and/or biological compounds to be delivered in a controlled manner at the nanometer scale. Inks may be fluids, gases, solid matters, or compositions thereof. They may be monophasic or multiphasic, homogeneous or heterogeneous in nature, and may include solvents, tensioactive compounds and other adjuvants. Examples of inks include: (1) small organic molecules, and specifically molecules capable of forming self-assembled monolayers, including thiols, disulfides, silane, amines, carboxylic acids and metal bisphosphonate derivatives; (2) molecules of biological interest, such as antibodies, proteins, compounds comprising nucleic acids, DNA, RNA, lipids, and fragments thereof, as well as their ligands, receptors or dyes; (3) organometallic and inorganic compounds, including metal salts and complexes, including those of iron, nickel, chromium, platinum, palladium, copper, silver, and gold, and reducing or oxidizing agents, including borohydrides, amines, borane, and borane complexes, aluminum and tin compounds, and peroxides; (4) solutions of nanoparticules, including metallic clusters, polymeric particles, and core-shell particles, such as gold colloids and latex spheres, and derivatives thereof; graphite-rich and diamond-like forms of carbon, including carbon black powders; (5) polymeric compounds, or precursors to polymeric compounds; (6) sol-gels and their precursors, including tetramethylorthosilicate or tetraethylorthosilicate, (7) materials of interest in microelectronics processing, including photolithographic resists, strippers and etchants; (8) electroless deposition and electroplating solutions; (9) catalysts; and (10) solutions, dispersions, and mixtures thereof.

Examples of deposition nanolithography described herein include, but are not limited to, Scanning-Probe Microscopy-based and in particular Atomic Force Microscopy-based techniques (such as DIP PEN™ nanolithographic printing, meniscus nanografting and NanoPen Reader-Writer), as well as other methods based on the use of a stamp or mold as the nanometer-scale templating element. This invention also relates to methods of ink delivery, where the ink is a facilitator of, rather than the main actor in, the nanolithography process. Possible uses of the ink include, but are not limited to, reaction medium, lubricant, and protective or regenerative coating of the probe, actuator, stamp, or other nanolithography device involved.

DPN™ printing is a versatile direct-write, deposition nanolithography technique which can be carried out with hollow or non-hollow tips. In a common example of DPN™ printing, a very sharp tip, or probe, coated with one or more ink(s) is brought in contact with the substrate to pattern. The ink diffuses from the tip to the substrate. Precise control of the position and motion of the inking tip relative to the sample affords patterns, such as a combination of dots and line segments. DPN™ printing routinely achieves about 10–15 nm line widths, while its ultimate resolution likely is dictated by the apex diameter of the probe and deposition conditions.

The nanolithography device may comprise, among other devices: (1) a tip, i.e., a sharp protrusion, which may be part of, or attached to, a holding and/or manipulation system; (2) the extremity of a sharpened wire or a scanning tunneling microscope tip; (3) the extremity of an optical fiber (coated or not, cantilevered or not); (4) the extremity of a micropipette, needle, capillary tube or other hollow device; (5) a sharp crystalline fragment, such as a diamond shard mounted on a cantilever; or (6) a microfabricated device, such as: (a) a cantilevered device, e.g., an atomic microscopy probe; (b) a non-cantilevered microfabricated device, including, but not limited to, whisker-shaped, membrane-shaped, or beam-shaped designs, (c) an actuated device, of the cantilevered or non-cantilevered design, (d) a nanofluidic or microfluidic delivery device (actuated or not, cantilevered or not), for example a hollow cantilever or a FIB-milled AFM cantilever, or (e) a more complex micromechanical/nanoelectromechanical system (MEMS/NEMS), such as arrays of passive or actuated cantilevers or tips [Zhang, Bullen, Chung, Hong, Ryu, Fan, Mirkin, Liu, *Nanotechnology* 13, 212 (2002), which is hereby incorporated by reference as well as references therein].

The tip(s) may be integrated (fabricated concurrently) with a holding system. Further, the holding system may be associated with microelectronic circuits, mesoscopic-scale translation and scanning mechanisms, such as a MEMS actuated flexure stage, and/or microfluidic and electrical interconnection devices. In addition, the holding system may be generally associated with a combination of control hardware and software. To measure, regulate, and control the spatial position and motion of the tip(s), feedback loops can be provided; the feedback loops may include piezoelectric actuators, sensors (such as photodiode position-sensitive detectors capable of tracking the deflection of the cantilever), and control electronics, such as those found in scanning probe microscopes.

The tip may be terminated by one or more sharp points, including bundles of sharp tips. The tip may be further sharpened by termination with objects, such as carbon nanotubes or nanobundles, needles (such as those formed by electron-beam decomposition of an alkane or by focused-ion beam), or (poly)crystalline deposits.

The tip may be composed (in whole or in part) of, or coated with, a spongy or porous material, such as: (1) a polymer; (2) a rubber or elastomeric material; (3) a gel; or (4) a porous semiconductor, in oxidized form or not.

DPN™ printing is a direct-write lithography technique based upon the transport of mobile chemical materials (also referred to herein as an "ink" or "patterning compound") from (a) sharp probe(s) or tip(s) (the "pen(s)") onto a surface of interest (i.e., the "paper"). In some embodiments, the tip may be coated with a patterning compound and the coated tip may be contacted with the substrate so that the patterning compound may be applied to the substrate. Further, the probe motion may be controlled so that desired patterns with submicrometer dimensions may be produced. For example, octadecanethiol ("ODT") may be applied to an AFM tip. When the tip is brought into contact with a gold-coated substrate, the ODT molecules may be transferred to, and self-assemble on, the gold surface; the tip may be moved across the surface, affording nanometer-scale patterns of ODT, which may be used to protect the surface locally during a subsequent etching step, affording, e.g., gold nanostructures.

Useful applications of DPN™ printing include, but are not limited to: (a) the fabrication of miniaturized biosensors and chemosensors; (b) the fabrication of oligonucleotide or protein arrays for diagnostics and high-throughput screening applications; (c) microelectronics, nanoelectronics, and photonics; and (d) photomask repair.

An account of pre- and post-inking operations, including hardware and software methods and apparatus that facilitate the transfer and realignment of the probe assembly, may be found after a description of ink delivery methods and apparatus outlined in Table 1. Table 1 summarizes preferred embodiments of the present invention that satisfies some or all of the requirements previously detailed. This table is not intended to be exhaustive.

TABLE 1

| TECHNIQUE | STRENGTH | APPLICATION EXAMPLES |
|---|---|---|
| Dipping in arrays of micromachined wells. | Pre-inked arrays. Integration with microfluidics and lab-on-a-chip systems. | Standard molecule libraries. Interfacing with liquid handling/microspotting robots. |
| Mechanical contacting with a (spotted) membrane or gel. | Direct-from-synthesis, direct-from-separation inking. Potentially low cost. | Compounds prepared in small quantities (proteins, DNA). |
| Mechanical contacting by an inky stamp (or probe system). | Inking with a few inks in a predefined arrangement. | Combinatorial synthesis arrays for drug discovery. |
| Integrating microfluidic circuitry within the tip array. | Continuous, in situ delivery. | Patterning of large areas. Fragile, short-lived compounds. |
| Non-contact (inkjet) dispensing. | Rapid delivery of a few inks (1–8) to medium-sized arrays. | Resist lithography. Custom, small-series patterning. |
| Thermal sublimation or ablation. | Insoluble compounds. | Conductive polymer circuits. Molecular electronics. |
| Contact with a free-form fluid. | Integration with syringe and micropipette dispensing systems. | Sampling of analytical/synthetic instrument outputs. |
| Reactive inking. | Short-lived compounds. | Electrochemistry, radical chemistry. |
| On-the-probe or in-the-well synthesis. | Molecular libraries. | Pharmaceutical research. |
| Droplet or cluster delivery via electrostatic or magnetic guiding. | Delivery of powdered inks. Potentially very fast. | Very large probe arrays. |

Ink Delivery by Way of Dipping or Mechanical Contacting

Ink may be delivered by dipping or mechanical contacting, as follows: (a) manual dipping of an AFM cantilever in a vial containing liquid, optionally followed by blow drying by compressed gas, drying in air, or rinsing with one or more solvents; (b) placing an AFM cantilever tip in contact with a fragment of absorbent paper placed at the fringe of the sample; (c) moving the AFM cantilever to a specified location of the sample where a small droplet of the ink of interest has been placed, e.g., using a micropipette. Methods are disclosed in, for example, Piner, Hong, Mirkin, *Langmuir* 15, 5457 (1999); Piner, Zhu, Xu, Hong, Mirkin, *Science* 283, 661 (1999), which are hereby incorporated by reference.

Ink Delivery Through Well Arrays

A microfluidic dispensing device, such as an array of recessed features of micrometer dimension (for example, wells, channels, or posts) may be fabricated in a proper substrate, for example a silicon, quartz, alumina, silicon oxide-coated, or silicon nitride-coated wafer. Preparation methods include standard microelectronic/microfluidic technology (including resist spin-coating, dry or wet etching, chemical or physical vapor deposition) or (excimer) UV-laser ablation. A possible process to fabricate these wells includes the patterning of an oxide-covered silicon wafer, followed by the isotropic etching of the exposed silicon areas to form shallow rounded wells. An oxide layer may be optionally grown to afford hydrophilic wells.

An alternative embodiment of this device is an array of microfabricated channels, wells, or posts filled with a soft, spongy or porous filler capable of retaining ink with minimum evaporation. The filler may be deposited by spin-coating of a precursor on the micromachined well array, followed by removal of the excess and curing.

The geometry of the well array may match the arrangement of the tip in the tip array to be inked through translation and/or rotation. Multiple well arrays may be fabricated within a substrate, as separate entities or in an interleaved manner, forming an array of arrays or a multidimensional array. After filling the wells, channels, or posts of the array with one or more appropriate solutions, the tip or array of tips may be brought in close proximity with the well array, so that the tip or cantilever extremities may be dipped in the solution(s). A fraction of the tips within the array may be immersed, either by tilting the arrays with respect to each other, by deliberately leaving some wells dry, or by using arrays of (individually) actuated cantilevers. After a controlled immersion time, the tip array may be retracted and optionally dried before repetition of the cycle, if necessary, and use.

The geometry of the channels or wells may be designed such that evaporation may be minimized and the fluids stored for a significant amount of time. Buried channels, narrow openings may provide for significant volume and low evaporative surfaces. On the other hand, solvent evaporation may be favored by design. If the solvent evaporates out of the solution and the remaining solute would precipitate, such well arrays could be used for long-term storage and shipping of small molecule libraries. Later exposing the array to the vapor of an appropriate solvent or depositing solvent droplets in wells would redissolve the solute just before use.

The surface chemistry of the wells, channels, posts or of their surrounding areas (specifically, their hydrophilicity and hydrophobicity) may be manipulated to anchor, repel, or otherwise guide the dispensed fluid(s) in precise locations of the array. Precise control of the contact angle at well edges allows control of the radius of curvature of the liquid in the well and, therefore, control of its evaporation rate.

Surface chemistry modification may be achieved by such techniques as the self-assembly of trichloro/trialkoxysilanes (e.g., on $Si-SiO_2$) or thiol-functionalized molecules (e.g., on GaAs and most metals) with appropriate terminal groups (e.g., $-OH$, $-COOH$, $-(OCH_2CH_2)_n$ for hydrophilic surfaces, $-CH_3$, $-CF_3$ for hydrophobic surfaces). The well array surface may also be selectively coated with a Teflon-like material by deposition from a $CF_4$ plasma, followed by deposition of a thin metal layer as a resist, patterning of the metal, and etching of the exposed Teflon-like film areas by an $O_2$ plasma. Alternatively, polyimide films may be applied by spin-coating polyamic acid, gelling, masking, etching, and cleaning, or by screen printing (e.g., using Epotek 600). More generally, inorganic or organic materials can be used including hydrophobic polymers to modify surface energies.

Means of filling (or keeping filled) wells, channels, or posts with a variety of fluid(s) include: (a) external devices, such as inkjet printing heads, automated micropipetting, pin-and-ring or microcapillary deposition systems, or titer plate samplers (FIG. 1); and (b) integrated microfluidic circuitry (FIG. 2).

In the latter case, a set of microfabricated reservoirs and/or interfaces to one or more macroscopic fluid dispensing devices may be connected via microchannels to the inking wells. Fluid dispensing in the microchip may be insured, for example, through capillary, pneumatic, electrophorectic or micromechanical pumping. Actuated microvalves insure that fluids may be mixed or delivered sequentially as appropriate. The microfluidic circuitry may be fabricated, among other ways, by conventional photolithographic processes, as previously described, or by using stacked laminates. Two possible processes to produce closed channels include: (1) the etching of channels in a wafer followed by wafer bonding; (2) the negative patterning of, e.g., silicon dioxide on the top of a silicon wafer to form $SiO_2$ stripes, which are then coated with silicon nitride. In a final step, the remaining sacrificial silicon oxide may be etched to create hollow channels.

Ink Delivery by Contact with a Free-Form Fluid

Figure 3:
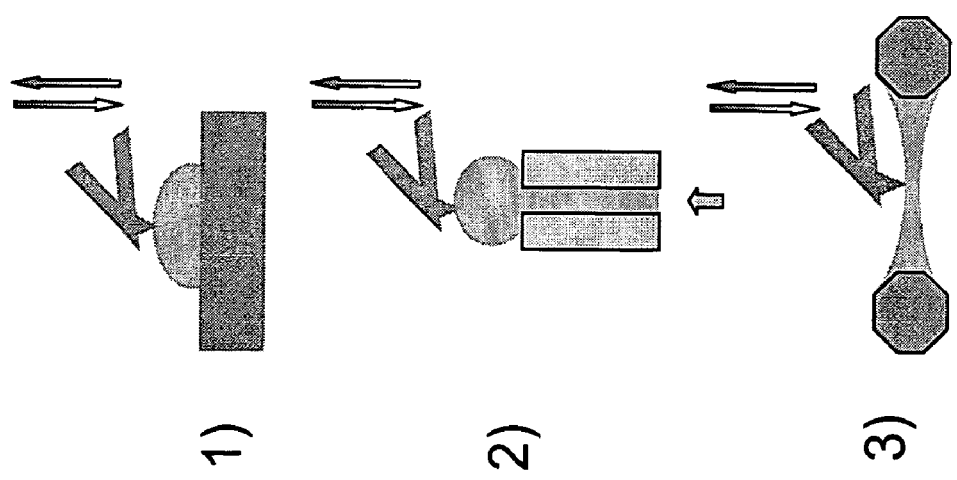
FIG. 3 shows three methods of ink delivery from free-form fluids.

Ink may also be delivered by contact between the probe(s) and a free-form fluid, i.e., a fluid primarily shaped by gravity and its own surface tension. The fluid may: (a) be contained in a large reservoir (e.g., tens of microliters or more in volume), including microtiter plates, (b) be spotted as sessile droplets on a (glass) slide or other flat surface, (c) be suspended as a droplets at the end of a syringe needle, micropipette, or similar device, (d) be suspended by capillary tension between posts, (e) be stretched as a thin film by capillary tension on a (metal wire) frame, forming a minimal surface of desired shape, (f) be available as a continuous or pulsed fluid stream or jet, or (g) form a liquid-liquid interface with an immiscible solution surrounding the probe(s). Methods (a), (b), (c), (g) are also available for the delivery of semi-solids or solid inks, such as highly viscous polymeric solutions. FIG. 3 illustrates some of these concepts.

Examples of apparatuses designed to operate along these principles include: (1) one or more wire rings, U-shaped wires or sharp needles attached to XYZ manipulator(s) (methods (d), (e)). The shaped wire or needle traps fluid, when plunged in a fluid reservoir. It is then brought in proximity to the target probe so that the probe extremity dips into the trapped fluid. (2) One or more (automated) syringes terminated by a thin needle may be used to present droplets, into which probes can be dipped (methods (b), (c)). (3) One or more gravity-fed capillaries, equipped or not with a valve and/or a electromechanical hammer, may be used to dislodge the droplet and renew it after use (methods (c), (f)). (4) A fluid cell containing (i) a liquid medium in contact with the probe or probe array; or (ii) the ink, in this case a second fluid containing the compounds of interest and immiscible with the first, which may have been deposited in a groove or well in the cell (method (g)).

Conductive ink droplets may be placed on (individually addressed) electrodes. Biasing the electrode may induce a deformation of the droplet shape due to electrocapillary effects. This deformation may be used to bring the actuated droplet in contact with an adjacent probe.

Ink Delivery by Way of Mechanical Contacting with a Membrane or Gel

Ink may be delivered by contacting probes with an ink-rich substrate, such as a spongy polymeric stamp, a membrane or a gel. The use of stamps replicated from a microfabricated mold (such as a microcontact printing or nanoimprinting stamp) enables the rapid inking of large arrays of passive probes with a few inks along a predetermined pattern, as well as easy combinatorial inking of probe arrays. One or several stamps may be prepared that contain an array of posts or protruding wells (i.e., wells fabricated on top of a post) with the same pitch as the probes in the probe array. The stamps may be inked by immersion in an appropriate solution or by contact with a polymeric block saturated with the ink of choice, among other techniques (See FIGS. 4 and 5). Contacting the probes with the stamp transfers the ink. If the stamp features are a subset of the probe array, only selected probes will be inked. The process may be repeated with different stamps to ink all probes or deposit multiple inks per probe.

Figure 6:
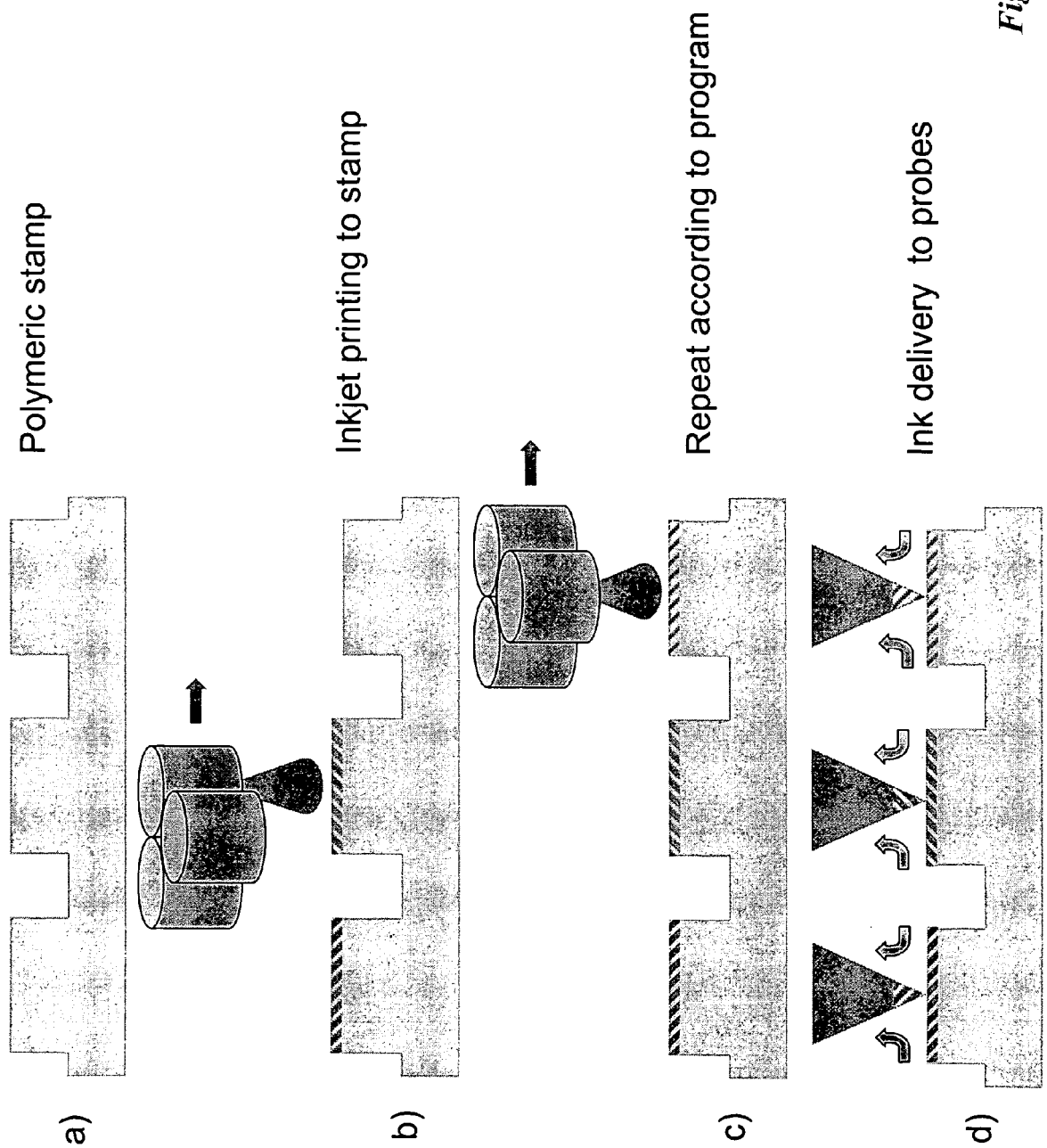
FIG. 6 shows custom probe inking using stamps and inkjet technology.

Stamps or membranes may have been previously spotted by other devices, such as commercial inkjet printers and robotic micropipetters, before use as an ink palette (FIG. 6). This would enable easy interfacing of the inking system with commercial devices, such as (automated) pipettes, which would deliver overwhelming amounts of fluids if directly used to ink the probe(s). In an associated embodiment, porous strips placed on the walls of high-density titer plate wells (or similar vessels) may extract, by capillary action, some of the fluid in the well, therefore allowing direct interfacing with high-throughput plate-handling robots.

Alternatively, the membrane may be part or all of a one- or two-dimensional electrophoresis (polyacrylamide, agarose) gel, thin-layer chromatography plate, ultracentrifuge filtration membrane, hybridization or blotting membrane, culture medium (e.g., agar gel) or other similar substrate. The compounds of interest may then be transferred by contacting the probe(s) with the membrane, with or without the help of a solvent(s), electric field applied between the probe and an electrode underneath the membrane, probe heating, probe shaking, or similar methods. These direct-from-synthesis or direct-from-separation methods allow the direct inking of the tip(s) with rare or small-quantity compounds, such as proteins, without unnecessary transfer steps and minimum (cross)contamination.

An automated image acquisition, image processing/recognition system may be used to contact the appropriate probe(s) with the membrane at appropriate locations in the required sequence. A possible implementation would include: (1) an optical fluorescence microscope equipped with a camera, frame grabber and motorized sample stage; (2) a probe assembly holder and manipulator; (3) control electronics to actuate individual probes within the array, if an active array; and (4) software adapted to identify fluorescing spots, catalog them according to their position on the membrane, identify them either against a database or by calculating their physicochemical properties (e.g., pI and size), and control the motion of the probe array and of individual probes within the array. Alternative spot detection methodologies include, but are not limited to, colorimetry (associated or not with staining techniques) and Raman or infrared microscopy.

Ink Delivery by Means of Another Probe or Probe Array

Ink(s) may also be delivered by actuated mechanical devices that are mesoscopic or microscopic in scale. Microelectromechanical systems (MEMS) are an example of the later.

In a first embodiment, a rolling cylinder or sphere may be brought in close proximity with the probe array to ink, and (groups of) probe(s) may be contacted with the cylinder. The cylinder may be inked by microfludics circuits connected with ink reservoirs or may be patterned e.g., by rolling the cylinder on an inked microcontact printing stamp.

A second embodiment may be comprised of a device similar to a dot matrix printer head or a pin-and-ring microspotter. Spring-loaded pins terminated by a cusp or a spongy tip (acting as an ink reservoir) may be electromechanically actuated. The pin assembly may be brought in close contact with the probe assembly, so that ink may be delivered by mechanical contact between the pin head and a probe.

In the pin-and-ring design, a ring is dipped in an initial ink reservoir (e.g., microtiter plates) and stores some of the fluid to be delivered by capillary action. The pin is then coated with ink by plunging it through a fluid disc.

A third embodiment may use another inked probe, a probe array, or a series of probe arrays to ink the probe or probe array to be used in the nanolithographic apparatus.

Non-Contact (Inkjet) Delivery

In this embodiment of the invention, the probe or probe assembly to be inked may be brought in proximity of a dispensing system that releases a controlled amount of fluid in the form, for example, of an ink droplet, bubble or (exceptionally) of a powdered aggregate. The ink droplet(s) may be directed towards the tip or an associated structure, from which the ink may be transported to the tip.

Figure 7:
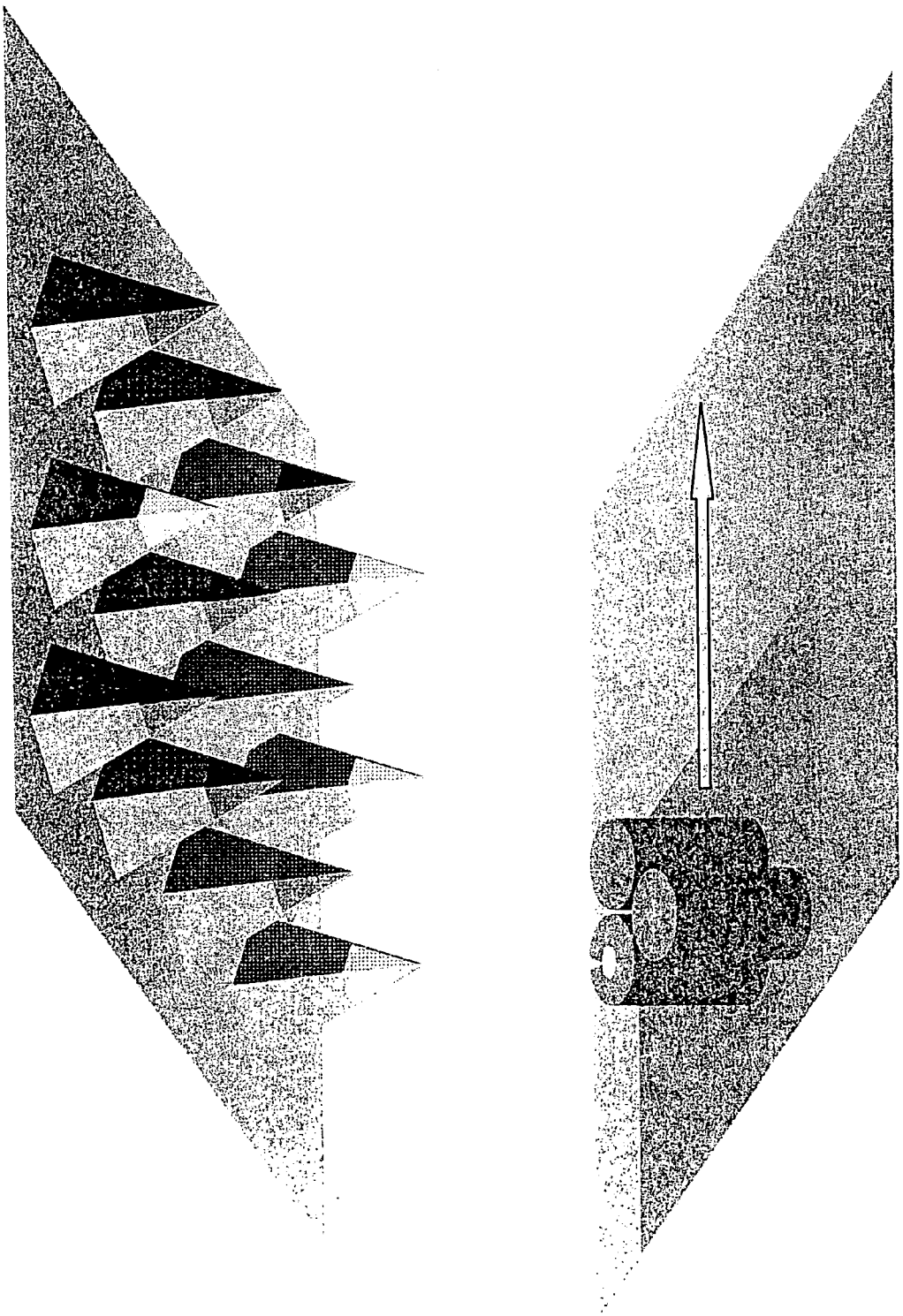
FIG. 7 shows an example of non-contact inking of a probe array.

The dispensing system may include one or more fluid dispensing nozzles, operating with one or more inks (FIG. 7). Dispensing by the fluid nozzle may be driven by a mechanical actuator, such as a piezoelectric ceramic, an electrorheologic constrictive device, a solenoid plunger, or an actuated membrane [Lemmo, Rose, Tisone *Cur. Opinion Biotech.* 9, 615 (1998)]. Among other possible appropriate means, it may also be thermally driven. In this case, the sudden heating or boiling of the ink in the nozzle by an integrated resistor expulses the liquid [see for example U.S. Pat. No. 5,053,100 (1991) and *Calvert Chem. Materials* 13(10), 3299 (2001)].

The ink dispensing system may be comprised, in whole or in part, of one or more micromechanical ("MEMS") devices, incorporating nozzles, fluidic channels, pumps, and, if required, control electronics.

It may be fixed or mobile relative to the probe or probe array. In the later case, a translation mechanism, such as motor-driven or belt-driven systems, or a flexure stage, may move the fluid dispensing system with respect to the tip (array) or vice versa.

The ink may be directed towards the tip, the cantilever, or another landing area or receptacle, from which it may diffuse or be directed towards the cantilever and probe. The landing area or receptacle may be fabricated in the probe array assembly. Diffusion between landing areas may be prohibited by depositing a Teflon-like film in exclusion areas (as mentioned in the well array section) or/and by erecting barriers. A possible probe fabrication process may involve the anisotropic etching of pyramidal pits in a silicon wafer followed by silicon nitride deposition, patterning, Pyrex wafer bonding and etching of the sacrificial silicon. Grooves may be etched during the first step of that process, which will form, after silicon nitride (SiNx) deposition and wafer bonding, triangular barriers.

Alternatively, the fluid may be ejected parallel to the probe array, so that only minute amounts are delivered by grazing contact between the droplet and the probe. This method may be especially relevant for active cantilever probes, which may be individually actuated in order to place the tip in the trajectory of an ink droplet.

The inkjet nozzle may also act directly as an ink well. In this case, ink may be dispensed into a waste receptacle to form a fresh droplet of ink at the apex of the nozzle. The probe tip can then be moved into alignment with the nozzle and dipped into the ink as previously described in the ink dipping invention.

Ink Delivery by Way of Sublimation or Ablation

Inks insoluble in convenient solvents may be delivered directly from the solid state by means of controlled thermal sublimation. Potential applications include the delivery of high-molecular-weight substances, such as oligothiophenes, pentacene or parylene and other compounds of interest in the field of conductive polymers or molecular electronics.

In one possible embodiment of this invention, a thin film of the ink to be deposited may be prepared on a substrate, such as a thin polymeric film. The substrate may be brought in contact with a head formed of multiple miniature heating elements, which may be heated in a controlled sequence while the head moves relative to the probe assembly. Multiple inks may be delivered by changing the substrate or the head.

In an alternative embodiment, a beam of light with an appropriate wavelength and intensity (e.g., a laser beam) may be focused on an ink deposit brought in close proximity to the tip or tip array to be coated. Local sublimation or ablation of the deposit may provide for precise delivery to the tip. The beam-emitting device may be associated to a scanning or rastering mechanism or a translation stage.

These techniques may result in the coating of adjacent tips if in dense arrays. In such case, the thermal sublimation head may be equipped with devices preventing the diffusion of ink to adjacent tips. A possible embodiment of such device would be an array of high-aspect-ratio tubules placed in front of the tip assembly, with a geometry matching their spatial arrangements.

It should be readily apparent that any of the sublimation or ablation embodiments may be performed in ambient or vacuum conditions.

Ink Delivery by Way of Electrostatic or Magnetic Interactions

Charged ink droplets or charged solid agglomerates may be selectively delivered to an array of conductive tips by way of individual electrical addressing (e.g., selective grounding).

Charged droplets may be produced by an electrospray nozzle or a charge electrode system [Microfab technical note 99-01 "Background on ink-jet technology" (1999)], which may be mobile with respect to the tip array and, therefore, rastered in front of it, or by an array of nozzles matching the tip array geometry. Charged agglomerates may be produced by exposure of a powder to, e.g., a corona wire.

The charged droplets or solid aggregates may also be steered towards the appropriate location using a deflection device, such as an electrical quadrupole filter or electrostatic deflection plates [Ng, Ford et al. *Rev. Sci. Ins.* 71, 6 (2000)].

Individual electrical addressing of the probes may be achieved by connecting a computer-controlled multiplexer to their metallized ends. Ink may also be delivered in a LaserJet-like fashion by means of laser-induced selective photoconduction. A modulated, tightly focused laser beam may be directed towards previously charged, photoconductive tips in rapid succession. The remaining charged tips may attract oppositely charged droplets.

Extremely small amount of isotopically purified "ink" may be delivered electrostatically to a probe serving as an anode in a (ultrahigh) vacuum mass separation system, such as a mass spectrometer.

Ink with ferromagnetic properties, such as some metal and oxide nanoparticle powders and their suspensions in a solvent, may be delivered to an individually magnetized tip. Such magnetization may be provided by incorporation of a MEMS-like coil within, or in close proximity to, the tip and/or by individual magnetization of a soft magnet associated or integrated with the tip. The magnetization of the magnet may be controlled, for example, by a coil mounted on a scanning arm, in a hard-drive-like fashion.

Ink Delivery by Way of a Microfluidic Dispensing Network Integrated within the Nanolithography Device In this embodiment, microfluidic circuitry, as described above, may be integrated directly within the probe holding device (e.g., cantilever array MEMS). Inks may be delivered directly to the probe from reservoirs through microfluidic channels. The nanolithography probe may have built-in means of continuous ink deposition to the surface. For example, it may be: (a) a micropipet or nanopipet [Lewis, Kheifetz et al. *Applied Physics Letters* 75, 17 (1999)] [Bruckbauer, Ying et al. *J. Am. Chem. Soc.* 124(30) 8810–8811 (2002)], the complete disclosures of which are hereby incorporated by reference; (b) an aperture NSOM tip; (c) a micromachined AFM tip (e.g., using focused-ion beam); or (d) a cantilever incorporating a microfluidic channel and terminated by a tip which can be a hollow and apertured tip or the microcantilever can be hollow and apertured to deliver ink to the tip. Ink may thus flow directly from the ink source to the substrate. This design may be attractive for delivery of large volumes (μL) or delivery of a miscible or immiscible ink while the probe is immersed in a liquid. See, for example, the Lewis and Bruckbauer references earlier in this paragraph as well as: Taha, Marks et al., *Applied Physics Letters,* 83(5), 1041 (2003); Bruckbauer et al., *J. Am. Chem. Soc.,* 125, 9834 (2003); and Ying et al., *Anal. Chem.,* 74, 1380 (2002), the complete disclosures of which are hereby incorporated by reference.

Figure 8:
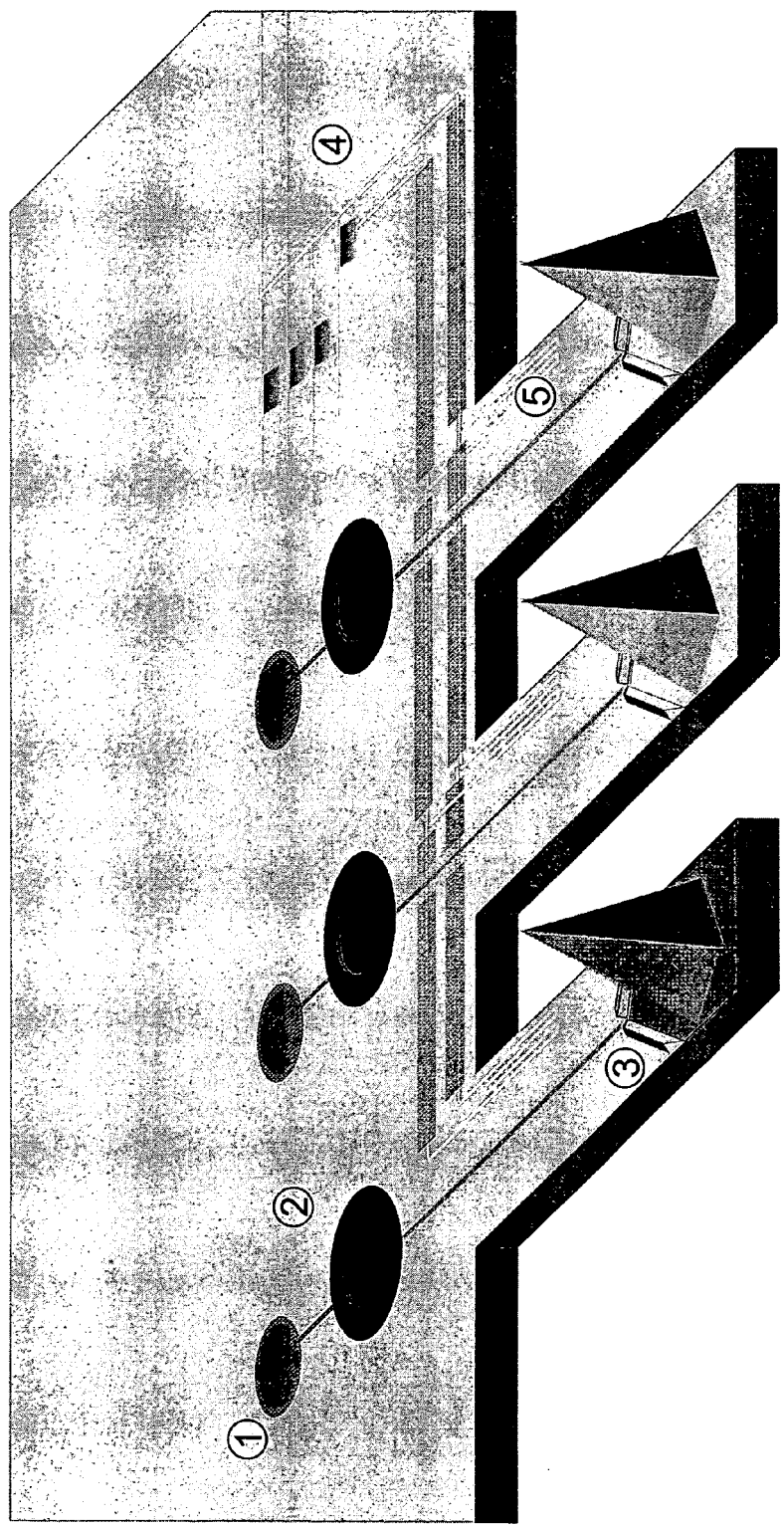
FIG. 8 shows possible implementation of a cantilever array with integrated microfluidics.

The microfluidic channels may be associated with micro-actuators/valves and microelectronic circuitry (built in the same chip or connected to it within a hybrid chip module), to sequence ink delivery or perform other actuation functions. Thorsen et al. have demonstrated a combinatorial valve array that could serve as the fluid distribution component within such a microfluidic chip ["Microfluidic large-scale integration" Thorsen, Maerkl, Quake *Science* 2002], the complete disclosure of which is hereby incorporated by reference. See also Childs, Nuzzo *J. Am. Chem. Soc.* 2002, 124, 13583, which is hereby incorporated by reference. FIG. 8 presents a design for a one-dimensional array of active cantilevers with integrated microfluidics. In this case, the ink may be delivered in proximity to and diffuse to the probe extremity, from where it may be transferred to the substrate of interest.

Reactive Ink Delivery

Compounds with nanolithography-unfavorable physico-chemical properties, such as unstable or reactive compounds, or inks that may not be delivered by other means, may be created in situ on the probe by (electro)chemical reaction or physical transformation. For example, Muller et al., *Applied Physics, A* 66, S453–S456, 1998, discloses copper deposition using a scanning ion conductance microscope, which is hereby incorporated by reference.

For example, gaseous or low-boiling point compounds may be delivered to the tip using a microvalved needle placed near the tip. Reaction of the emitted gas with an appropriate precursor on the tip may form the appropriate ink. High-melting-point compounds may be deposited using one of the methods previously described before being heated (using a probe-integrated heating element) to a temperature at which significant diffusion of the ink from the tip to the surface may occur. Short-lived intermediates may be generated in the water or solvent meniscus that forms at the tip-sample junction by reaction between the ink on the tip and a chemical precursor on the sample surface. Local electrochemistry between biased, conductive tip and substrate may produce reactive species, such as radical anions. Finally, the ink, tip or surface may act as a catalyst initiating the reaction generating the compound of interest. See, for example, Muller et al., *Science,* 268 (5208), 272 (1995). One embodiment is delivering catalyst or catalyst coated tip to cause reaction on a functionalized substrate.

Ink Delivery While Operating in a Fluid

In a first embodiment, part or all of an ink may be delivered directly from a fluid surrounding the probe. For example, a hollow probe (as previously described) may deliver a first chemical compound to the substrate, which combines with a second compound present in the surrounding liquid and forms the desired deposit. Direct deposition of one or more compound(s) from the solution onto the substrate after local removal of a resist has been disclosed by Xu et al. [U.S. Pat. No. 5,922,214 Liu, Xu, 1999], the complete disclosure of which is hereby incorporated by reference.

In a second embodiment, a tip may be coated with an ink through any of the aforementioned methods and may be immersed in a liquid immiscible with the ink while patterning. For example, the ink may be dissolved in a non-polar organic solvent and the operating liquid may be aqueous or vice versa.

Solid-Phase Synthesis of Inks on the Probe Surface

In this embodiment of the invention, solid-phase synthetic methods may be applied to the probe surface as the means to generate the desired ink on the probe or tip surface. A library of molecules may be synthesized directly onto the probe surface by successive delivery and/or by processing of a multiplicity of reagents (using any method previously disclosed, or a combination thereof) in a combinatorial fashion. Reagent processing may include, but is not limited to, irradiation with electromagnetic radiation or electrochemical treatment, including reaction with electrochemically synthesized species [Montgomery, Donald, U.S. Pat. No. 6,444,111 (1999), which is hereby incorporated by reference, and references cited therein].

In a final step, the synthesized molecules may be released from the probe surface by the appropriate reagent(s) or by processing before being delivered to the sample of interest by deposition nanolithography.

The probe surface may be preliminarily modified by such treatments as coating (by thermal evaporation or sputtering), plasma cleaning, and self-assembly, to afford surface terminal groups compatible with the solid-phase chemistry being envisioned.

An alternative approach may attach solid-phase synthesis beads (e.g., controlled pore glass, polystyrene, or any other polymer having appropriate functionality for combinatorial synthesis) to the probe using appropriate linkers before or after combinatorial synthesis.

Solid-Phase Synthesis of Inks on a Plate or in Array of Wells Prior to Ink Delivery onto Tips In this embodiment of the invention, solid-phase synthetic methods may be applied to a substrate distinct from the probe or probe array as the means to generate the desired ink. This includes, but is not limited to, an array of wells or spots on a flat plate. A library of molecules may be synthesized directly in the well by successive delivery and/or processing of a multiplicity of reagents in a combinatorial fashion, followed by release, as previously discussed. The well surface may be preliminarily modified by such treatments as coating (by thermal evaporation or sputtering), plasma cleaning, and self-assembly, to afford surface terminal groups compatible with the solid-phase chemistry being envisioned. The plate or well array may have hydrophobic areas that prevent cross-talk between the contents of the wells if a hydrophilic ink is being synthesized, or it may have hydrophilic areas that prevent cross-talk if a hydrophobic ink is being synthesized.

As in the previous section, the compounds of interest may be solid-phase synthesized on beads (e.g., controlled pore glass, polystyrene or any other polymer having appropriate functionality for combinatorial synthesis) and transferred and/or attached to the wells or spots before or after combinatorial synthesis.

Fluid Handling

A fluid management system may be attached to the ink delivery system proper, to sequence the delivery of ink (precursors) and auxiliary fluids. It may include: (a) fluid storage means, for example removable or fixed reservoirs or cartridges; (b) fluid delivery and mixing means, such as automated or manual valves, pumps and syringes; (c) fluid extraction means, including interfaces to other lab instrument(s), analytical, synthetic, preparative or separative in nature (examples include couplers to preparative HPLC, DNA synthesizers, dialyzers, and microtiter plate samplers); (d) auxiliary fluids regulation and delivery, including cleaning solution dispensing; and/or (e) environmental control means, including inert gas dispensing, stirring and temperature control of the stored fluids. Further, the fluid handling device may be contained in a glove box or air-tight/light-tight isolation chamber. For example, a hermetically-sealed and optically isolated chamber can be used.

In one embodiment of this invention, the fluid management system may include a set of removable cartridges equipped with automatic stoppers. Inert gas pressurization (or a gravity feed) drives the inks from the cartridges to manifold(s) controlled by computer-actuated valves. Tubules connect the manifolds with an inkjet printer head or directly to the microfluidics system of the MEMS cantilever array.

A solvent/cleaning solution dispensing system may irrigate the manifold and ink delivery head and flush it in a waste reservoir to clean the system between uses with different inks. Specialized cleaning solutions may be used to remove contaminants. For example, biological inks may be removed using denaturizing or enzyme solutions. Similarly, metal ions may be trapped with chelatants. One or more rinsing step(s) may be required. Alternatively, parts or all of the overall system may be disposable after one or more use(s).

Similar technology may be used to deliver fluids to the probe assembly, if it integrates microfluidics. Alternatively, fluid storage wells within the probe assembly may be stocked with the appropriate inks by using one or more of the ink delivery technologies previously described or by using commercial robotic or manual fluid handling, depending on the number of inks and volumes thereof to be delivered.

Interfaces with Standard Fluid-Handling Equipment

Another aspect of the invention relates to interfacing the ink delivery means (e.g., a well array or a microfluidic cantilever array) with standard fluid handling means, including, but not limited to, standard 96-, 384- and 1536-well plates used in high-throughput screening and robotic instrument handling them. Such robots are available commercially from Beckman Coutler, ThermoCRS, Gilson, or Tecan, among other manufacturers.

A PREFERRED EMBODIMENT 1

Well Plate Interface

Figure 9:
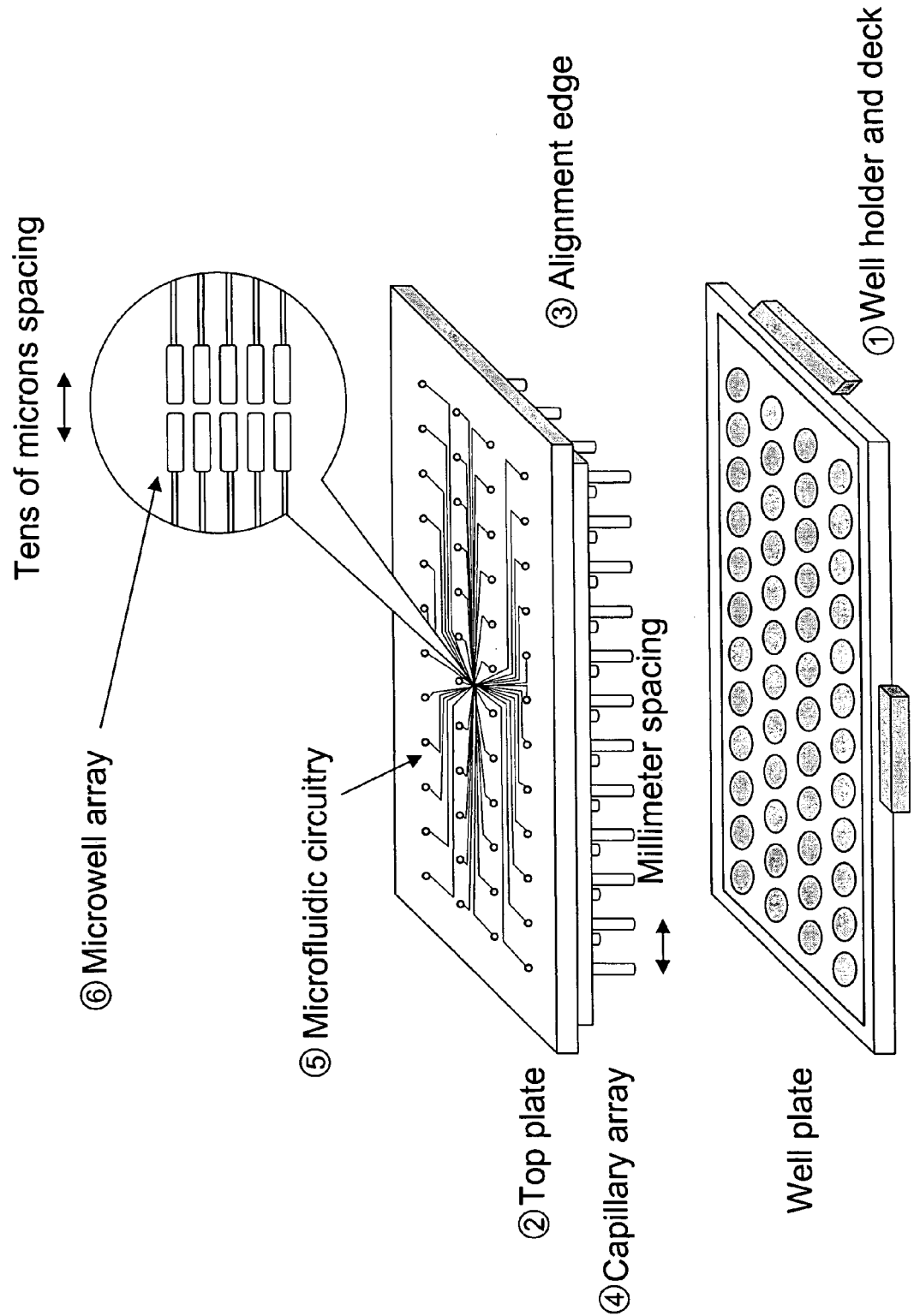
FIG. 9 shows a schematic diagram of a well plate interface.

A preferred embodiment, as illustrated in FIG. 9, includes: a well plate holder and well plate deck 1; a top plate 2; an alignment mechanism 3 that positions the top plate 2 in registry with the well plate underneath. The top plate 2 is equipped with: a fluid aspiration means 4, such as an array of capillaries dipping into the well plate; and microfluidic circuitry 5 that transports the fluids from the capillaries to an ink delivery mechanism 6 (e.g., a microwell array or cantilever array with integrated microfluidics). Fluid transportation may be initiated, e.g., by capillary pumping or by pressurization of the gap between the top plate and the well plate.

The well holder could be: (a) a recess with internal dimensions corresponding to the exterior dimensions of the well plate; (b) a set of corners holding the well plate in place; or (c) any other similar device. The well holder is intended to be compatible with commercial plate handling robots, such as the ThermoCRS CataLyst Express or other well plate hotel, carousel, or storage system. Such systems are necessary, if large quantities of well plates need to be handled and placed into the plate holder in sequence, or if the well plate must be processed quickly after ink synthesis or processing. In the later case, the handling robot may link the synthesis equipment (which is available commercially) and the aforementioned storage system and the nanolithography equipment.

The alignment mechanism 3 can be: (a) as simple as an manual alignment frame that fits a complementary shape on the well plate (optionally incorporating a seal) or a passive alignment mechanism (i.e., where plunger rods fit holes in the well plate or well plate holder); or (b) as complex as a robot. In one embodiment, a motorized vertical translation mechanism may move the top plate 2 up and down. The top plate is preferably in the upward position to free access to the well plate holder, whenever the well plate needs to be placed or retrieved. It may then be lowered into the well plate to deliver the ink to the ink delivery mechanism proper.

The top plate 2 may be disposable; alternatively, a washing and drying mechanism may be provided to reuse the plate. It may consist of a solvent-filled washing vessel of overall dimension similar to these of the well plates. The top plate would be placed on the washing vessel forming a seal and the interstitial space alternatively depressurized and pressurized to empty the capillaries or flush it with fresh solvent.

The top plate 2 may or may not be integrated with the ink delivery mechanism. If it is, the ink delivery mechanism could be, among other possibilities, a well microarray directly microfabricated in the top plate, as illustrated in FIG. 9.

The capillary array 4 may be adapted to pierce a plastic film sealing the well plate. In such a case, the capillary may be terminated by a sharp tip or needle.

The following is an example of a possible fabrication process. Vias (through-holes) with a pitch similar to that of the target well plate are fabricated with deep reactive ion etching in a silicon wafer. A microarray of wells is separately formed by isotropic etching of silicon after formation of silicon dioxide layer by thermal oxidation and etching of appropriate windows in it.

Microfluidic channels connecting the vias to the wells are etched in another wafer, which is bonded to the first one and thinned by lapping/polishing. A window through the wafer affords access to the well array. The well array side may optionally be coated with Teflon-like film around the wells to form a liquid stop that will prevent spills across adjacent wells. Capillaries made of glass or metal may be glued or soldered in place on top of the vias, or a plate containing the capillaries may be bonded to the wafer. A possible process may use flanged capillaries that fit in corresponding bored holes formed by dual deep RIE including dual step deep RIE.

Alternatively, short capillaries could be formed before via fabrication by the LIGA process, which involves the deposition of a thick resist, X-ray lithography and thick metal electrodeposition.

A PREFERRED EMBODIMENT 2

Delivering Fluid from a Well Plate to an Ink Deposition Means Using Surface Tension Control A substrate (e.g., wafer) may be patterned, e.g., using optical lithography or microcontact printing, to expose two or more surface chemistries with differences in their ability to be wet. Examples include, but are not limited to, patterns of thiols or silanes with different $\omega$-functional groups [Kumar, Biebuyck, Whitesides, *Langmuir* 10 (5): 1498 (1994); Tarlov et al. U.S. Pat. No. 5,514,501 (1996)], the complete disclosures of which are hereby incorporated by reference]. The patterned surface chemistries circumscribe the spreading fluid in contact with the substrate to certain locations on the substrate [Drelich, Miller et al., *Colloids and Surfaces* 93:1–13 (1994); Gorman, Biebuyck, Whitesides, *Chemistry of Materials* 7(2):252 (1995), the complete disclosures of which are hereby incorporated by reference], and/or guide the fluids from one location to another, e.g., by establishing a surface tension gradient. Multiple (independent) fluid pathways may be written on the substrate to mimic a microfluidic network of channels and wells.

In the following example, Compound A forms hydrophilic films and Compound B forms hydrophobic films that repel the aqueous fluid to be delivered. A substrate patterned with regions of A and B is placed face down (patterned side) towards the well plate forming a seal. Compound A is patterned in areas of the substrate that match the well plate. The well plate/substrate assembly is flipped over, so that the fluids in the wells wet the substrate. It is then flipped back while ensuring that droplets of liquid stay on the substrate. The substrate is separated from the well plate. The liquid in wetted areas of Compound A does not spread in surrounding areas of Compound B, because Compound B is hydrophobic. Instead, some of the fluid spreads along channels patterned with the Compound A from the wetted area towards areas of interest, e.g., spots which will be later contacted with the probe(s).

In an alternative embodiment, fluid may be micropipetted or otherwise deposited directly on the patterned substrate, from where it may diffuse to an area of interest. The deposition nanolithography device, e.g., probe array, may also be integrated with the patterned substrate.

Environmental Control During Inking

The ink delivery and inking systems may be respectively equipped with appropriate environmental controls. The ink delivery apparatus may be enclosed in a chamber or glove box, in which the temperature, humidity, solvent vapor pressure, and/or other parameter(s) may be controlled or modulated. For example, one may introduce a solvent vapor in the enclosure of a pre-inked well array-based system before nanolithography, to induce solvent condensation in the ink wells and the re-dissolution of the dried solutes.

An enclosure may also be provided to prevent adverse contamination or exposure of the solutions or ink delivery/inking system. Possible examples include, but are not limited to, a light-tight and/or air-tight enclosure and a HEPA filtration device for removing dust particles.

Alignment Mechanisms

With the exception of ink delivery mechanisms that employ microfluidic channels which deliver ink directly to the probe tips, most of the inking methods require some means to position and align the nanolithography device(s) relative to the ink dispensing means at regular time intervals for ink replenishment.

Accurate positioning can be provided via: (1) a manual or automated stage, which could be motorized or piezo-actuated; (2) an external positioning device, such as a piezoelectric transducer or an inchworm actuator, including the positioning device used during nanolithography; or (3) an integrated (MEMS) positioning means. For example, well array-based or stamp-based inking systems may be mounted on a high-precision rotation and translation stage (or piggybacked coarse- and fine-motion stages), which may be the sample translation stage. In another example, an ink well array may be fabricated on an electromagnetically actuated MEMS stage, which is moved in proximity to the probe (array) when necessary.

Accurate alignment of the ink source and probe assembly may be achieved by precise sensing of their relative position and control of the positioning means by an appropriate combination of software and hardware. The alignment mechanism may reuse parts of, or be integrated with, the nanolithography system per se and/or may exist as a separate dedicated component of the ink replenishment apparatus. Equipment, supplies, and control software (including the inking module in the InkCAD 2.2) that enable the aforementioned embodiments are available from NanoInk, Inc. (Chicago, Ill.).

U.S. Provisional Patent Application Ser. No. 60/367,514, previously incorporated as reference (14), teaches video alignment procedures using apparatuses that may be adapted to align the probe assembly with the ink source (e.g., ink well array, membrane, gel, fluid droplets, inkjet devices, etc.). Further, digital images of the probe tips and the ink delivery apparatus may be acquired and processed to provide feedback for adjusting the alignment. Reference marks may be added on the ink source (e.g., stamp, well arrays, etc.) and probe assembly during the fabrication process to guide alignment.

Scanning probe imaging of the ink source with the inking probe(s) or nearby auxiliary probe(s) (reading tip(s)) may also be used for fine alignment.

In one possible practical embodiment, wells may be fabricated at regular intervals on the substrate to be used as a sample (such as the DPN™ sample substrate fabricated by NanoInk, Inc.), so that wells can be found in close proximity to the locus of the tip(s), within the range of the high-speed, fine-motion (piezoelectric) actuator that translates the well and probe arrays relative to each other. Rapid inking and tip washing during the lithography run thus becomes possible. Image analysis software, processing video images of the tip(s) above the substrate, may be used to: (1) locate and align the probe(s) with reference mark(s) on the substrate; (2) identify the nearest well(s) containing the appropriate ink(s); and/or (3) control the motion of the probe, to dip the tip(s) one or more times in the appropriate wells.

Alternative alignment methods may include, but are not limited to: (1) the use of look-up tables storing information about the location of the ink source (blind alignment); the alignment accuracy and repeatability may be improved by using closed-loop actuators or stages and similar devices; (2) XYZ proximity sensors integrated with the probe assembly or the ink source; possible (magnetic, optical, electrical) detection methods may include eddy current, linear variable transformers, capacitance detection, optical deflection or optical intensity measurements, and interferometry; and (3) combinations of one or more methods disclosed herein.

Disposable/Interchangeable Replaceable Probe or Well Arrays

Another embodiment consists of a disposable probe or well array that may be inked through any of the methods previously described prior to use or sale and may be discarded after one or more uses. No ink replenishment is needed. Appropriate packaging, such as a gel-filled container under inert gas-filled, hermetic wrap, restrains the probe array assembly during transport and limits contamination and ink degradation.

At the core of this technology is the concept of interchangeable probe/well arrays, i.e., arrays manufactured with a standard mechanical, electrical and microfluidic snap-on interface, so that they can be easily replaced.

Preferred Embodiment 3

Simple Circuit Board-Based Probe Array

In this embodiment, the probe array is manufactured as a silicon nitride/Pyrex MEMS. The probe array may contain one or more (sealed) ink reservoir(s), from which the ink flow to the probe(s) is electrically controlled, e.g., via a MEMS valving or pumping device. The Pyrex chip is mounted directly on a printed circuit board (PCB). The chip is interconnected to the PCB either by (thermocompression/thermosonic) wire bonding or by flip-chip technology. In the first case, thin gold wires are bound between electrical pads on both the MEMS and the PCB. In the later case, vias are microfabricated in the MEMS main substrate and metallic balls are formed on the backside of the MEMS atop the via openings. The MEMS is soldered in place on matching electrical pads on the PCB or glued with conductive epoxy. The electrical interface between the PCB and the instrument consists of a miniature connector, such as those manufactured by SAMTEC, soldered on the PCB. Printed leads on the PCB electrically connect the connector pins and the MEMS-linked pads. The miniature connector preferably mates with a flexicable (also called a flexcircuit), i.e., a flat flexible strip with printed lines. The flexcircuit may be itself electrically connected to outputs of the instrument. This scheme allows for both regulated delivery of fluids to one or more probe(s) and rapid replacement of the probe array/ink source.

The mechanical interface to the instrument may consist of a kinematic mount, composed for example of three 120°-apart slots fabricated in or atop the PCB, which match three ruby balls on the instrument side. Such kinematic mount infers a high mechanical stability to the ensemble.

In a variant of this embodiment, the MEMS chip may be directly mounted on a flexcircuit, the electrical connections being established by direct connection of the MEMS pads to the printed lines on the flexcircuit.

Inking of Mold and Stamp Used in Nanofabrication Processes

The invention described herein extends to (automated) methods of ink deposition on micro-structured substrates to be directly used as a mold or stamp for nanofabrication purposes. This includes (but is not limited to): (1) elastomeric stamps and/or molds; (2) micromachined gratings and templates, such as those fabricated in silicon, quartz or other wafers; and (3) metal microstructures, e.g., produced by evaporation or sputtering on glass or mica. The templates may be used in nanolithography techniques such as microcontact printing, micromolding in capillaries, or nanoimprinting.

Inking may be uniform or selective, i.e., specific portions of the stamp may be inked and/or multiple inks may be deposited in a specific pattern.

FURTHER DESCRIPTION OF DRAWINGS 1–9

The accompanying drawings 1–34, which are incorporated in and constitute a part of the specification, illustrate embodiments of the present invention and, together with the description, serve to exemplify the principles of the present invention.

Figure 2:
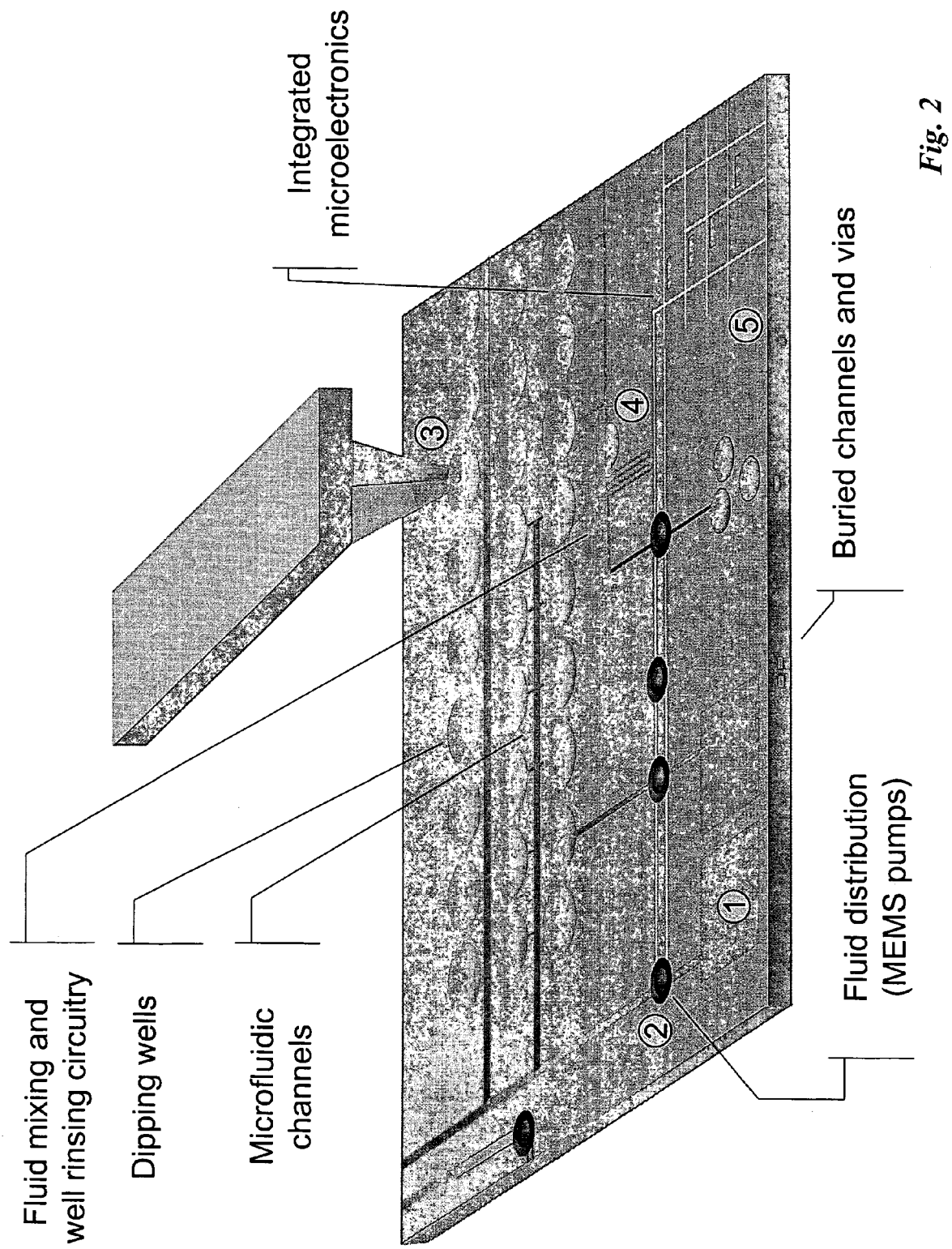
FIG. 2 shows a smart well array, including microfluidic, micromechanical and microelectronic circuitry.

FIG. 1 depicts a probe inking in an array of wells and method of ink delivery to the well array, in which FIG. 1A shows an Inkjet device deposits droplets of ink into the wells according to its program, in which FIG. 1B shows thin capillaries, previously filled with ink by dipping into ink reservoirs, deliver ink droplets by pneumatic actuation, and in which FIG. 1C shows a matching array of probes is dipped into the inked well array.

FIG. 2 shows a smart well array, including microfluidic, micromechanical and microelectronic circuitry: (1) Ink reservoirs store microliter amounts of ink. They may be filled manually or by automated pipettes. They may also be connected to external ink cartridges; (2) The ink is delivered to smaller wells via capillary, electrophoretic or pneumatic pumping through a network of channels. In this concept, membrane-based MEMS pumps deliver given amounts of fluids at preprogrammed intervals; (3) The tip or tip array is then dipped into the well(s); (4) The microfluidics may include ink mixing and/or well rinsing circuitry; (5) Microelectronic circuitry may be incorporated within or nearby the well array, e.g., to control the sequencing of ink delivery and to facilitate alignment.

FIG. 3 shows three methods of ink delivery from freeform fluids: (1) contact with a sessile drop; (2) contact with a droplet presented by a capillary or needle; (3) contact with a thin fluid film stretched on a wire frame.

Figure 4:
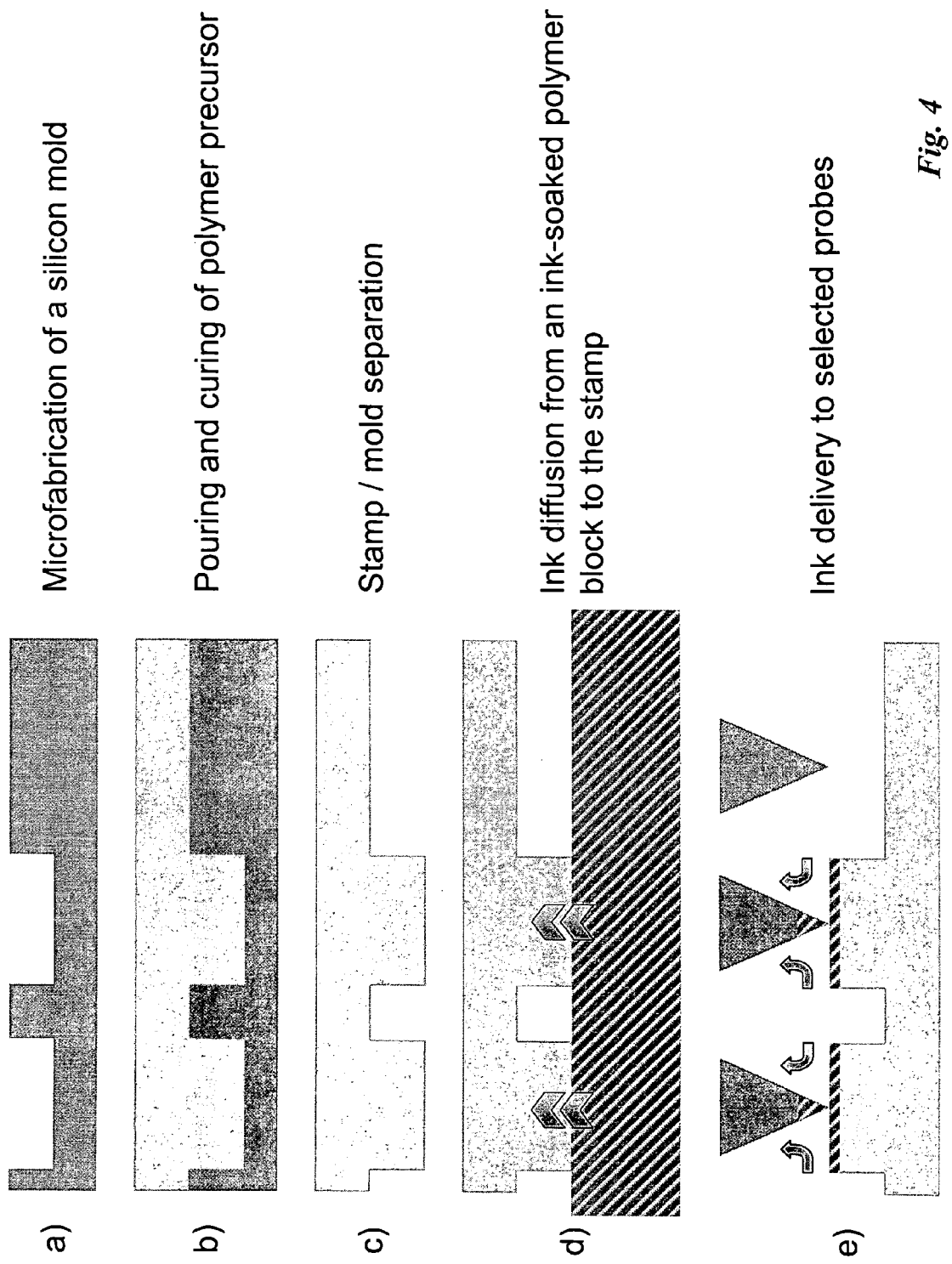
FIG. 4 shows ink delivery using contact-inked stamps.

FIG. 4 shows ink delivery using contact-inked stamps, in which FIG. 4A shows one or more mold(s) being fabricated using standard microfabrication technologies, in which FIG. 4B shows a polymer precursor solution (such as PDMS) is poured onto the mold(s) and cured, in which FIG. 4C shows each stamp being separated from its mold, in which FIG. 4D shows the stamps being pressed against an ink-soaked polymer block causing ink to diffuse within the stamp, in which FIG. 4E shows the array of probes being placed in contact with the stamp, selectively inking probes that match the stamp features (this step may be repeated with multiple complimentary stamps).

Figure 5:
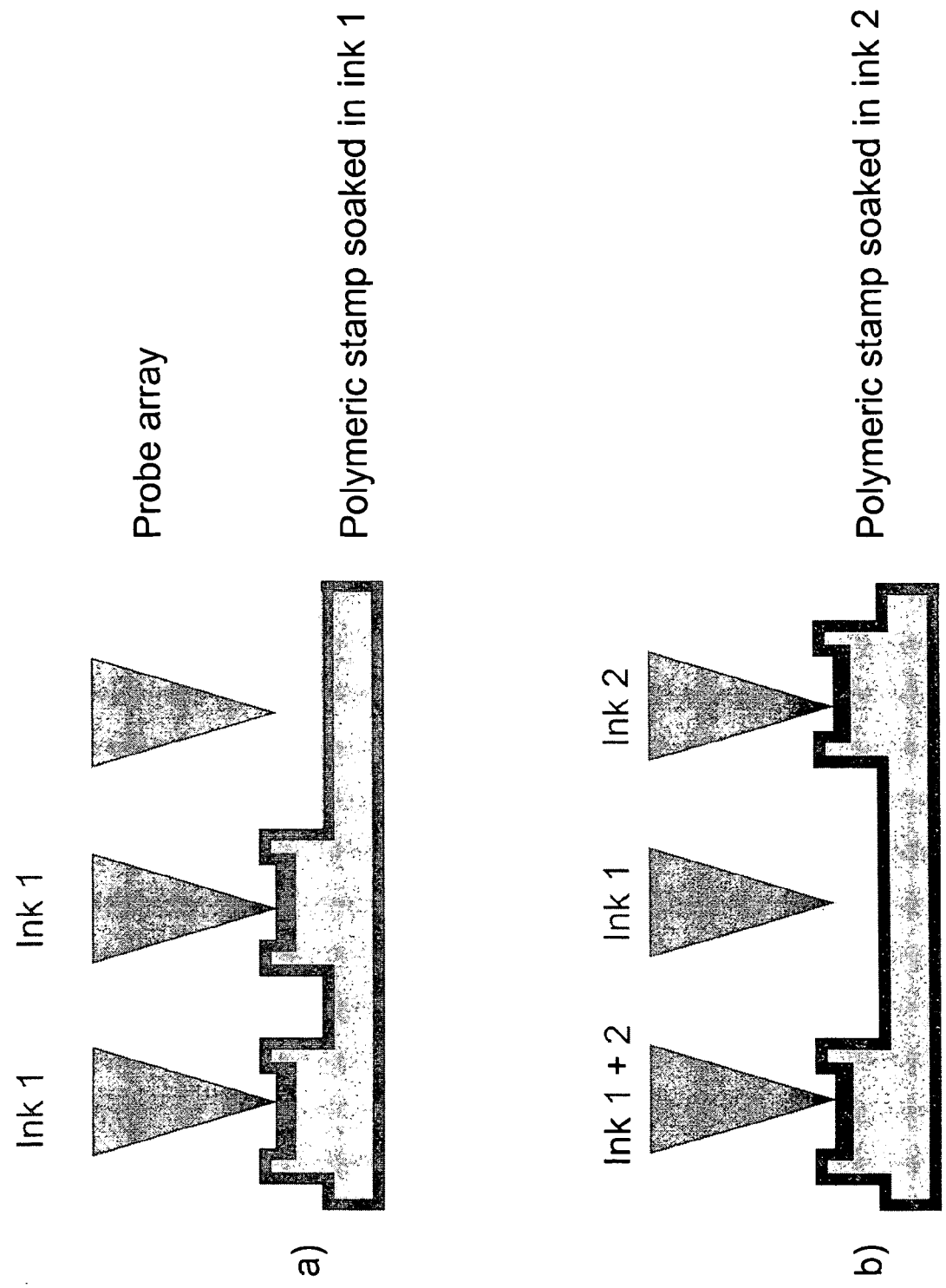
FIG. 5 shows a combinatorial ink delivery using stamp/well array which is brought into contact with several stamps having different feature configurations and which were previously immersed in different inks.

FIG. 5 shows a combinatorial ink delivery using stamp/well array which is brought into contact with several stamps having different feature configurations and which were previously immersed in different inks. A proper sequencing of these operations enables: (1) the deposition of multiple inks in predefinite patterns; and (2) ink mixing, diluting, rinsing, and reactive inking. This process may be entirely automated, for example by a robotic arm soaking the gel in the appropriate solution, then placing it on an XYZ motion-controlled stage close to a probe assembly holder. In this concept drawing, the stamps use protruding wells to store the inks.

FIG. 6 shows custom probe inking using stamps and inkjet technology, in which FIGS. 6A–6C show an inkjet printer head being rastered above a polymeric stamp, depositing one or more inks according to a programmed sequence, and in which FIG. 6D shows a matching array of probes comes into in contact with the inky stamp and ink(s) diffuse to the probe. The stamp, print head and array may be aligned under a microscope. Quick stamp replication and reprogramming of the inkjet head enables rapid custom probe inking.

FIG. 7 shows an example of non-contact inking of a probe array. A mobile carriage rasters one or more inkjet nozzle(s) in front of the probe array. Ink can be either ejected onto the probe tip or on a landing area, from where the ink will diffuse to the probe. Alternatively, the tip can be dipped into the nozzle orifice to coat the tip. In such case, an integrated optical microscope may be used to align the probe tip with the orifice.

FIG. 8 shows possible implementation of a cantilever array with integrated microfluidics. This embodiment includes: (1) a series of ink wells, possibly connected to one or more external ink source(s); (2) the ink wells are drained by a MEMS pumping and/or valving system; and (3) ink is delivered near and diffuses onto the probe; (4) integrated microelectronics regulate the ink delivery; and/or (5) sense and control the motion of self-actuated cantilevers.

FIG. 9 shows a schematic diagram of a well plate interface. A well plate may be placed on a deck and mated with a top plate that bears an array of capillaries with a pitch matching that of the well plate. The liquid in the well may be pumped via the capillaries through a microfluidic network to an ink delivery means, such as an array of wells, into which DPN probes may be dipped. Such a system allows interfacing an array of wells with millimeter separation to one with a pitch in the order of tens of microns.

PREFERRED EMBODIMENTS

Finally, a variety of preferred embodiments are specifically listed in numerical order:

Embodiment 1 is a substrate comprising: an array of wells, channels or posts, wherein the wells, channels, or posts are at least partially filled with a spongy or porous filler which is adapted to retain ink in the wells, channels, or posts while limiting ink evaporation. Embodiment 2 is a substrate according to embodiment 1, wherein the wells, channel, or posts are separated from each other in all dimension by a distance which is less than about 200 microns and which is greater than about 1 micron. Embodiment 3 is the substrate according to embodiment 1, wherein the filler is deposited in the channels, wells, or posts by (a) spin-coating a precursor on the array or dipping the array in a precursor solution; (b) removing excess filler; and (c) drying the deposited filler or curing it by UV exposure or heating. Embodiment 4 is the substrate according to embodiment 1, wherein the filler is deposited in the channels, wells, or posts by (a) spin-coating a precursor on the array or dipping the array in a precursor solution; (b) applying a vacuum; (c) removing excess filler; and (d) drying the deposited filler or curing it by UV exposure or heating. Embodiment 5 is the substrate according to embodiment 1, wherein the array of wells, channels, or posts is formed by micromachining. Embodiment 6 is the substrate according to embodiment 5, wherein the micromachining is selected from the group consisting of microfluidic technology, UV-laser ablation, and patterning of an oxide-covered silicon wafer followed by isotropic etching of exposed silicon. Embodiment 7 is the substrate according to embodiment 5, where the substrate is a substrate of silicon, glass, pyrex, quartz, ceramics, silicon nitride, silicon oxide deposited on wafer, or a metal deposited on wafer. Embodiment 8 is the substrate according to embodiment 5, wherein the fabrication technology is selected from the group consisting of (a) optical lithography technology, (b) UV-laser ablation (c) LIGA, (d) Soft lithography, and (e) a combination of one or more of (a)–(d). Embodiment 9 is the substrate according to embodiment 8, wherein the UV-laser ablation is by means of excimer and frequency-tripled or quadrupled YAG lasers. Embodiment 10 is the substrate of embodiment 8, where the micromachining includes: (a) providing an oxide-covered silicon wafer; (b) creating at least one window in the oxide layer; and (c) isotropically etching the exposed silicon to form at least one recess. Embodiment 11 is the substrate according to embodiment 7, where the filler is porous silicon. Embodiment 12 is the substrate according to embodiment 11, wherein the substrate is silicon, and wherein the silicon substrate is altered by: (a) depositing a layer of silicon nitride onto the silicon substrate; (b) etching a window in the silicon nitride masking layer; (c) etching the exposed areas of silicon to obtain porous silicon; (d) depositing silicon nitride on the top of the porous silicon areas; and (e) etching the areas surrounding the porous silicon areas to make porous posts. Embodiment 13 is a method of creating an array of inked probes for performing direct-write nanolithographic printing, the method comprising the steps of: (a) providing an array of wells, channels, or posts, wherein at least some of the wells, channels, or posts have an ink therein; (b) providing an array of probes or tips, wherein the probes or tips are adapted to be associated and aligned with said wells, channels, or posts; (c) transferring ink in at least some of the wells or channels or posts having ink therein onto the tips or probes associated therewith by: (c1) immersing the tips or probes in the wells or channels associated therewith; or (c2) contacting the tips or probes with the posts associated therewith. Embodiment 14 is the method according to embodiment 13, wherein the number of tips and the number of wells, channels, or posts is the same. Embodiment 15 is the method according to embodiment 13, wherein the number of tips is less than the number of wells, channels, or posts. Embodiment 16 is the method according to embodiment 13, wherein each of the wells, channels, or posts has a shape which facilitates prevention of evaporation of ink. Embodiment 17 is the method according to embodiment 13, further comprising the step of: controlling the surface chemistry of each of the wells, channels, or posts, and/or controlling the surface chemistry of surrounding areas which surround the wells, channels, or posts. Embodiment 18 is the method according to embodiment 17, wherein the step of controlling the surface chemistry of each of the wells or channels comprises: controlling the hydrophilicity or hydrophobicity of the wells, channels, or posts; and/or controlling the hydrophilicity or hydrophobicity of the surrounding areas. Embodiment 19 is the method according to embodiment 17, wherein the step of controlling the surface chemistry of each of the wells or channels is selected from the following group: (a) coating the wells, channels, posts or the surrounding areas with a thin film, (b) coating the wells, channels, posts or the surrounding areas with a self-assembled monolayer, (c) coating the wells, channels, posts or the surrounding areas with a fluorinated polymer material, (d) coating the wells, channels, posts or the surrounding areas with polyimide, wherein the polyimide is spinned-on and patterned by: (1) depositing a thick photoresist or metal film, (2) creating a window in the photoresist or metal film; and (3) treating with oxygen plasma, (e) coating the wells, channels, posts or the surrounding areas with a thermal, plasma-enhanced or low temperature deposited oxide, (f) coating the wells, channels, posts or the surrounding areas with silicon nitride, a metal or metal oxide, and (g) plasma treating the wells, channels, posts or the surrounding areas through a patterned resist. Embodiment 20 is the method according to embodiment 19, wherein the self-assembled monolayer is formed from a silane-functionalized or thiol-functionalized molecule. Embodiment 21 is the method according to embodiment 13, wherein the ink provided in at least some wells, channels, or posts is provided by an external device. Embodiment 22 is the method according to embodiment 21, wherein the external device is selected from the group consisting of an inkjet print head, a pipette, pin-and-ring or microcapillary micro spotter system. Embodiment 23 is the method according to embodiment 13, wherein the ink provided in at least some wells, channels, or posts is continuously provided by an integrated microfluidic network. Embodiment 24 is the method according to embodiment 23, wherein the microfluidic network is formed by: (a) patterning a silicon dioxide film on a silicon wafer; (b) coating the wafer with silicon nitride in a pattern; and (c) removing the sacrificial silicon dioxide. Embodiment 25 is the method according to embodiment 23, wherein the microfluidic network comprises a set of microfabricated reservoirs connected via microscopic channels to at least some wells, channels, or posts. Embodiment 26 is the method according to embodiment 23, wherein the microfluidic network is formed using stacked laminates. Embodiment 27 is the method according to embodiment 26, wherein Kapton films are laser etched and then bonded using FEP or a polyimide adhesive to one another. Embodiment 28 is the method according to embodiment 22, wherein the array is made of a polymer or a metal, and wherein the array is replicated from a microfabricated mold. Embodiment 29 is the method according to embodiment 27, wherein the polymer is polydimethylsiloxane (PDMS). Embodiment 30 is the method according to embodiment 13, wherein more than one probe or tip is associated with one well, channel, or post having ink therein. Embodiment 31 is the method according to embodiment 30, wherein the ink in the well, channel, or post associated with more than one probe or tip is at least one free-form fluid. Embodiment 32 is the method according to embodiment 13, wherein the ink in the well, channel, or post associated is at least one free-form fluid selected from a group consisting of: (a) a fluid mass contained in a reservoir of total volume less than about 300 µL and (b) a fluid mass primarily contained by its surface tension. Embodiment 33 is the method according to embodiment 32, wherein the reservoir of total volume of less than about 300 µL is a well of a microtiter plate. Embodiment 34 is the method according to embodiment 32, wherein the fluid mass primarily contained by its surface tension is (1) a thin fluid film suspended to a frame, (2) a droplet presented at the end of a pipette, needle or syringe, or (3) a continuous or pulsed stream or jet. Embodiment 35 is the method according to embodiment 13, wherein the ink in the well, channel, or post associated is at least one free-form fluid, and wherein the at least one free-form fluid forms an array of droplets on a substrate that has been engineered to prevent fluid spreading. Embodiment 36 is the method according to embodiment 13, wherein the ink in the well, channel, or post associated is at least one free-form fluid, and wherein the at least one free-form fluid is presented to the probe in an automated manner. Embodiment 37 is the method according to embodiment 13, wherein the ink in the well, channel, or post associated is at least one free-form fluid, and wherein the at least one free-form fluid forms a liquid-liquid interface with the fluid, the probe being immersed in the interface. Embodiment 38 is a method of inking an array of probes for performing direct-write nanolithographic printing, the method comprising the steps of: (a) providing a first stamp, having at least one ink thereon; (b) providing an array of probes; (c) contacting one or more of the probes and the first stamp; and (d) transferring the at least one ink from the stamp to the probes in contact therewith. Embodiment 39 is the method according to embodiment 38, further comprising the step of: (f) repeating steps (c) and (d) with different sets of probes. Embodiment 40 is the method according to embodiment 38, further comprising the step of: (f) repeating steps (a)–(d) with a second stamp. Embodiment 41 is the method according to embodiment 38, wherein the step of providing a first stamp comprises the steps of: (1) providing a microfabricated mold; (2) pouring a polymer precursor solution onto the mold; (3) curing the polymer precursor solution to create the first stamp; (4) separating the first stamp from the mold; and (5) pressing the first stamp against a block having the at least one ink thereon causing the at least one ink to be transferred onto the first stamp or immersing the first stamp in a solution of the at least one ink. Embodiment 42 is the method according to embodiment 38, wherein the first stamp is micromachined or obtained by molding a thermoplastic polymer on a microfabricated mold. Embodiment 43 is the method according to embodiment 40, wherein the ink on the second stamp is transferred to the same set of probes as the first ink. Embodiment 44 is the method according to any of embodiments 38–42, wherein the first stamp is uniformly coated with a first ink, and wherein the first ink is only transferred to a subset of the probes in the probe array. Embodiment 45 is the method according to embodiment 43, wherein a second ink is transferred to a different subset of probes from a second stamp having the second ink thereon. Embodiment 46 is the method according to embodiment 43, wherein a second ink is transferred to some of the probes to which the first ink is transferred. Embodiment 47 is the method according to embodiment 38, wherein the first stamp is a polymer, a membrane, a plate, or a gel. Embodiment 48 is a method of inking an array of probes for performing direct-write nanolithographic printing, the method comprising the steps of: (a) providing a membrane, plate, or gel used for analytical, separative or synthetic purposes, the membrane, plate, or gel having at least one ink thereon; (b) providing an array of probes; (c) contacting at least one of the probes and the membrane, plate, or gel; and (d) transferring the ink on the membrane, plate, or gel to the probes in contact therewith. Embodiment 49 is the method according to embodiment 47, further comprising the step of: (f) repeating steps (c) and (d) with different sets of probes. Embodiment 50 is the method according to embodiment 47, further comprising the step of: (f) repeating steps (a)≠(d) with a second membrane, plate, or gel. Embodiment 51 is the method according to embodiment 40, wherein the first stamp is a polymer, a membrane, a plate, or a gel, and wherein the second stamp is a polymer, a membrane, a plate, or a gel. Embodiment 52 is the method according to embodiment 47, wherein the ink is deposited on the stamp, gel, plate or membrane by an inkjet print head or by a micropipette. Embodiment 53 is the method according to embodiment 52, wherein the inkjet print head or micropipette is automatically controlled. Embodiment 54 is the method according to embodiment 47, wherein the gel is an electrophoresis gel, a TLC plate, or a culture medium. Embodiment 55 is the method according to embodiment 47, wherein the membrane is an ultracentrifuge filtration member, a hybridization member, or a blotting membrane. Embodiment 56 is a method of creating an array of inked probes for performing direct-write nanolithographic printing, the method comprising the steps of: providing a cylinder having at least one ink on an outer surface thereof; providing an array of probes; contacting at least some of the probes with the outer surface of the cylinder; and transferring ink on the outer surface of the cylinder to the at least some of the probes. Embodiment 57 is the method according to embodiment 56, wherein the ink is adsorbed or absorbed on the outer surface of the cylinder. Embodiment 58 is the method according to embodiment 56, wherein the at least one ink of the outer surface of the cylinder is provided from at least one reservoir. Embodiment 59 is the method according to embodiment 56, wherein the at least one ink of the outer surface of the cylinder is provided by rolling the cylinder on a substrate having the at least one ink thereon. Embodiment 60 is a method of creating an array of inked probes for performing direct-write nanolithographic printing, the method comprising the steps of: providing an array of probes, wherein each probe has a tip; providing a device having an end adapted to contact a probe tip to transfer ink to said probe tip; transferring ink on the end of the device to at least two probe tips either simultaneously or successively. Embodiment 61 is the method according to embodiment 60, wherein the device is a probe. Embodiment 62 is the method according to embodiment 60, wherein the device is a second array of probes. Embodiment 63 is a method of creating an array of inked probes for performing direct-write nanolithographic printing, the method comprising the steps of: providing an array of probes; providing a device adapted to spray ink onto one of said probes or simultaneously onto a subset of said probes; spraying the ink from said device onto at least two probes either simultaneously or successively. Embodiment 64 is the method according to embodiment 63, wherein said device is a fluid dispensing nozzle. Embodiment 65 is the method according to embodiment 63, wherein said device is an array of fluid dispensing nozzles. Embodiment 66 is the method according to embodiment 65, wherein said fluid dispensing nozzle is an inkjet print head. Embodiment 67 is the method according to embodiment 66, wherein said fluid dispensing nozzle array is an array of inkjet print heads. Embodiment 68 is the method according to embodiment 63, wherein the step of spraying the ink is thermally controlled. Embodiment 69 is the method according to embodiment 63, wherein the step of spraying the ink is electromechanically or piezoelectrically controlled. Embodiment 70 is the method according to embodiment 63, wherein the ink is sprayed in a direction substantially parallel to the array of probes. Embodiment 71 is a method of creating an array of inked probes for performing direct-write nanolithographic printing, the method comprising the steps of: providing an array of probes; providing a substrate having an ink thereon; transferring ink from the substrate, by sublimation or ablation, onto at least one of the probe either simultaneously or successively. Embodiment 72 is the method according to embodiment 71, wherein the sublimation is caused by light being focused onto the ink on the substrate. Embodiment 73 is the method according to embodiment 72, wherein the light is emitted by a coherent light source. Embodiment 74 is the method according to embodiment 73, wherein the coherent light source is a laser. Embodiment 75 is the method according to embodiment 71, wherein the sublimation is caused by heat being applied to the ink on the substrate. Embodiment 76 is a method of creating an array of inked probes for performing direct-write nanolithographic printing, the method comprising the steps of: providing an array of probes, wherein at least some of said probes have a first property selected from the group consisting of charge, polarity, electric quadrupolar, magnetic quadrupolar, diamagnetic, paramagnetic, ferromagnetic, and anti-ferromagnetic; exposing said array of probes to a mist or stream of ink in the form of droplets or clusters, the ink having a second property selected from the group consisting of charge, polarity, electric quadrupolar, magnetic quadrupolar, diamagnetic, paramagnetic, ferromagnetic, and anti-ferromagnetic; and depositing at least some of the ink on the at least some of said probes having a first charge, wherein the first and second properties are opposite, and wherein the ink having the second property is deposited on the probes by magnetic attraction or by chemical attraction. Embodiment 77 is the method according to embodiment 76, wherein the first property held by one or more of the at least some probes having a first property is derived from one or more of (a) being electrostatically charged, (b) having an applied voltage, (c) being associated with one or more magnetic domains, and (d) being immersed in an electric or magnetic field. Embodiment 78 is the method according to embodiment 77, wherein the second property held by the ink is derived from one or more of (a) being associated with one or more magnetic domains, (b) interacting with said electric or magnetic field through an ability of molecules forming the ink to polarize. Embodiment 79 is the method according to embodiment 78, wherein the molecules forming the ink are dipolar, tripolar, or quadrupolar.

Embodiment 80 is the method according to embodiment 78, wherein the molecules forming the ink are ferromagnetic, diamagnetic, paramagnetic, or anti-ferromagnetic. Embodiment 81 is the method according to embodiments 76, wherein the ink having the second property is ferromagnetically charged, and wherein the probes having the first property are diamagnetically charged. Embodiment 82 is the method according to embodiment 76, wherein the step of depositing at least some of the ink on the at least some of said probes having a first property comprises deflecting or guiding ink droplets or clusters to the proper location. Embodiment 83 is the method according embodiment 76, further comprising the step of: providing means adapted to aid in the interaction of the ink and the at least some of said probes having a first property. Embodiment 84 is the method according to embodiment 82, wherein the step of deflecting or guiding ink droplets or clusters to the proper location uses at least one of (a) deflection plates, (b) an electrical quadrupole filter, (c) at least one electromagnet coil, and (d) at least one laser beam. Embodiment 85 is a system comprising: an array of probes; at least one ink source having an ink therein; a microfluidic delivery system adapted to carry said ink to said array of probes; means for transferring the ink onto selected probes; and a substrate adapted to be contacted by said array of probes, and wherein when the array of probes is in contact with the substrate, those probes having ink thereon will deposit the ink onto the substrate through direct-write nanolithographic printing. Embodiment 86 is the system according to embodiment 85, wherein the ink source is a reservoir. Embodiment 87 is the system according to embodiment 85, further comprising: an environmental control system. Embodiment 88 is the system according to embodiment 87, wherein the environmental control system is a controlled atmosphere container. Embodiment 89 is the system according to embodiment 88, wherein the environmental control system is also a light-tight container. Embodiment 90 is the system according to embodiment 87, wherein the environmental control system is a container in which at least one parameter is controlled, the parameter being selected from the group consisting of temperature, humidity, airborne particulate density, and pressure. Embodiment 91 is the system according to embodiment 85, further comprising: an alignment mechanism adapted to align the probes with the means for transferring the ink onto the selected ones of said probes. Embodiment 92 is the system according to embodiment 85, wherein the means for transferring the ink onto the selected ones of said tips comprises dipping said selected ones of said tips in at least one reservoir containing the ink. Embodiment 93 is the system according to embodiment 85, wherein the means for transferring the ink onto the selected ones of said tips comprises a device having ink thereon. Embodiment 94 is the system according to embodiment 93, wherein the device is a cylinder, a stamp, or a probe. Embodiment 95 is the system according to embodiment 85, wherein the means for transferring the ink onto the selected ones of said tips comprises at least one nozzle adapted to spray the ink. Embodiment 96 is the system according to embodiment 85, wherein the means for transferring the ink onto the selected ones of said tips comprises sublimation or ablation of the ink. Embodiment 97 is the system according to embodiment 85, wherein the means for transferring the ink onto the selected ones of said tips comprises attraction between the ink and the selected ones of said tips. Embodiment 98 is the system according to embodiment 97, wherein the attraction is chemical attraction or magnetic attraction. Embodiment 99 is the method according to embodiment 98, wherein the chemical attraction is selected from the group consisting of ionic bonding, hydrogen bonding, and polar interaction. Embodiment 100 is a method comprising the steps of: providing an array of wells, channels or posts, wherein each of the wells, channels or posts is filled or topped with a spongy or porous filler which is adapted to retain ink in the wells, channels, or posts while limiting evaporation; filling the wells, channels or posts, with at least one ink dissolved in a solvent; removing the solvent by applying heat and/or vacuum; and storing the inked well array in a packaging proper to storage and shipping. Embodiment 101 is a method for preparing a scanning probe microscopic tip for direct write nanolithographic printing comprising the step of forming a solid-phase ink compound in situ on the tip surface. Embodiment 102 is the method according to embodiment 101, wherein the forming is carried out by chemical reaction. Embodiment 103 is the method according to embodiment 101, wherein the forming is carried out by electrochemical reaction. Embodiment 104 is the method according to embodiment 101, wherein the forming is carried out with use of the tip as a catalyst. Embodiment 105 is the method according to embodiment 101, wherein the forming is carried out by photochemical reaction. Embodiment 106 is a method for preparing an ink array of wells or spots for use in direct write nanolithography, wherein the ink is formed on the array by solid-phase synthesis. Embodiment 107 is use of the substrate according to embodiment 1 to prepare peptide nanoarrays. Embodiment 108 is use of the substrate according to embodiment 1 to prepare nucleic acid nanoarrays. Embodiment 109 is use of the substrate according to embodiment 1 to repair photomasks. Embodiment 110 is the method according to embodiment 13, wherein the ink is a sol-gel ink. Embodiment 111 is the substrate according to embodiment 1, wherein the array is disposable.

In embodiment 32, a fluid mass is contained in a reservoir of total volume less than about 300 µL. In other embodiments, this total volume can be, for example, 1 mL to 500 microliters, 500 microliters to 100 microliters, 100 microliters to 1 microliter, one microliter to 500 nanoliters, and the like including down to 500 picoliters.

HYDROPHOBIC AND HYDROPHILIC EMBODIMENTS

Additional embodiments relate to microchannel fabrication using hydrophobic and hydrophilic barrier layers to prevent cross contamination. In particular, hydrophobic barrier layers are preferred. Microfluidic devices can be used to implement microlithographic and nanolithographic fabrication and printing strategies in MEMS and nanotechnology. Typically, microchannels of microfluidic devices can be fabricated in Si wafers by dry or wet etching using photolithography. To prevent bubble formation and improve the capillary driven flow characteristics of aqueous solutions, various surface treatments can be performed to increase, decrease, or otherwise adjust as necessary, the contact angle of the aqueous solutions to the microchannel surface. A typical strategy to decrease the contact angle can be to deposit oxide or to oxidize the exposed Si surface in the microchannels. This can result in a uniform hydrophilic layer covering the whole surface of the wafer or die containing the microfluidic channels. However, this can be a source of cross contamination between closely spaced microchannels containing different solutions or liquids. This can occur because surface tension drives the hydrophilic liquids to flow and spread out on hydrophilic surfaces. This problem of cross contamination can be particularly troublesome when microfluidic devices with inkwells are used in nanolithographic applications, wherein ink material is added to a substrate in direct-write, positive print mode and multiple inks and multiple delivery tips are used.

Alternatively, the contact angle for some inks such as organic solutions can be decreased by depositing fluorinated polymers on an exposed Si surface in the microchannels.

Hydrophobic capillary valves have been used (see, e.g., Zeng, J., Banerjee, D., Deshpande, M., Gilbert, J, Kellog, G., Duff, C., "Design Analysis of Capillary Burst Valves", *Proceedings of the Micro Total Analysis Systems Conference* (µ-TAS 2000), Amsterdam.). However, prior efforts do not generally provide for using hydrophobic barriers on the substrate between the microchannels for preventing cross contamination between closely spaced microchannels.

The present invention also relates to the use of hydrophobic barriers between microchannels of microfluidic devices. The invention can be used, for example, in the fabrication of inkwells for applications including lab-on-a-chip, microarryas, nanoarrays, microfabrication, nanofabrication, microlithography, and nanolithography, including direct-write lithography methods such as, for example, Dip Pen Nanolithography™ printing and fabrication methods.

The present invention provides, for example, a microfluidic device comprising: (A) a substrate comprising a surface and a plurality of microchannels which are hydrophilicly surface treated, and (B) at least one hydrophobic barrier layer on the surface between the microchannels which prevents cross contamination between the plurality of microchannels when liquid flows through the microchannels. The hydrophobic barrier layer can be a polymeric layer, including a fluorinated polymeric layer. The hydrophobic barrier layer can be produced by a plasma, including by a plasma with use of a deep reactive ion etching instrument. The microchannels can be configured to deliver liquid ink to or from one or more reservoirs which are adapted for use in transferring the ink to a nanolithography tip. The device can be an ink well for use in nanolithography. The hydrophobic layer can be, for example, about 10 microns thick or less, or more particularly, about one micron thick or less. The substrate is not particularly limited but hard, crystalline materials are preferred including semiconductor materials such as silicon. The substrate should be a material which can be etched so that microchannels can be formed.

The present invention also provides an inkwell device adapted for use for dipping of a nanoscopic tip to transfer ink from the inkwell device to the tip, wherein the inkwell device comprises at least one hydrophobic barrier layer on a substrate which prevents ink from travelling out of a microchannel disposed next to the hydrophobic barrier layer.

Additional embodiments, including methods of making and using the devices, are described further below.

Ink delivery and microfluidic devices in the context of nanolithography are known. For example, prior provisional application Ser. No. 60/425,252 filed Nov. 12, 2002 (METHODS AND APPARATUS FOR INK DELIVERY TO NANOLITHOGRAPHIC PROBE SYSTEMS) to Cruchon-Dupeyrat, Fragala, et al. is hereby incorporated by reference in its entirety, including figures, claims, description of microfluidic devices, inkwells, and surface modifications, and integration of microfluidics and direct-write nanolithographic methods including tip-based methods such as DPN printing. One skilled in the art can rely on this patent application in the practice of the present invention. In addition, provisional application Ser. No. 60/508,286 to Fragala and Banerjee filed Oct. 6, 2003 is hereby incorporated by reference in its entirety including the figures and claims. See, also, *Microfluidic Technology and Applications*, by Koch, Evans, and Brunnschweiler, 2000 (Research Studies Press) including fabrication technology (chapter 5) and integrated microfluidic systems (chapter 8), which are hereby incorporated by reference.

Another reference which can be used in the practice of the present invention is Marc J. Madou" *Fundamentals of Microfabrication: The Science of Miniaturization, $2^{nd}$ Ed.*, CRC Press, 2002. In particular, Chapter 2 on "Pattern Transfer with Dry Etching Techniques" is useful and is incorporated herein by reference in its entirety (pages 77–122), including its description of DRIE (see below) beginning at page 104.

In addition, microfluidic devices are described in the following illustrative references which can be used to practice the present invention: U.S. Pat. Nos. 6,610,499 to Fulwyler et al. (Aug. 26, 2003); U.S. Pat. No. 6,602,791 to Ouellet et al. (Aug. 5, 2003); and U.S. Pat. No. 6,561,224 to Cho (May 13, 2003). Additional patents include U.S. Pat. Nos. 6,251,343 to DuBrow et al. (Jun. 26, 2001) including use of hydrophobic polymers in cover layers; U.S. Pat. No. 6,482,364 to Parce (Nov. 19, 2002); U.S. Pat. No. 6,509,085 to Kennedy (Jan. 21, 2003); and U.S. Pat. No. 6,168,948 to Anderson et al. (Jun. 2, 2001). U.S. Pat. No. 6,270,946 to Miller (Aug. 7, 2001) describes microfluidics, but little disclosure and no working examples are provided to allow one to practice the invention.

To prevent cross contamination between microfluidic channels, the present invention provides that a hydrophobic layer or deposition zone of hydrophobic polymer or polymeric-like material can be deposited or applied on the surface of the wafer in the region between microchannels. The deposition or application can be carried out before or after surfaces are hydrophilized by oxidation, oxide deposition or other surface treatments such as anodic oxidation. The hydrophobic layer can serve as a barrier and restricts the free flow of the hydrophilic liquids as they flow through the microchannels. This can prevent cross contamination between closely spaced microchannels containing different liquids.

The sizes of the microchannels, including width, length, depth, and other geometric parameters, and the distances between the microchannels can be determined by one skilled in the art for a particular application. In addition, sizes of reservoirs, alignment marks, and inkwells can be also determined by one skilled in the art.

Generally, the inkwells are engineered to be used with inks which are aqueous based inks, or inks which are generally repelled by a hydrophobic barrier layer. If desired, small reservoirs can be included in the path of the microchannels to function as bubble traps.

Figure 10:
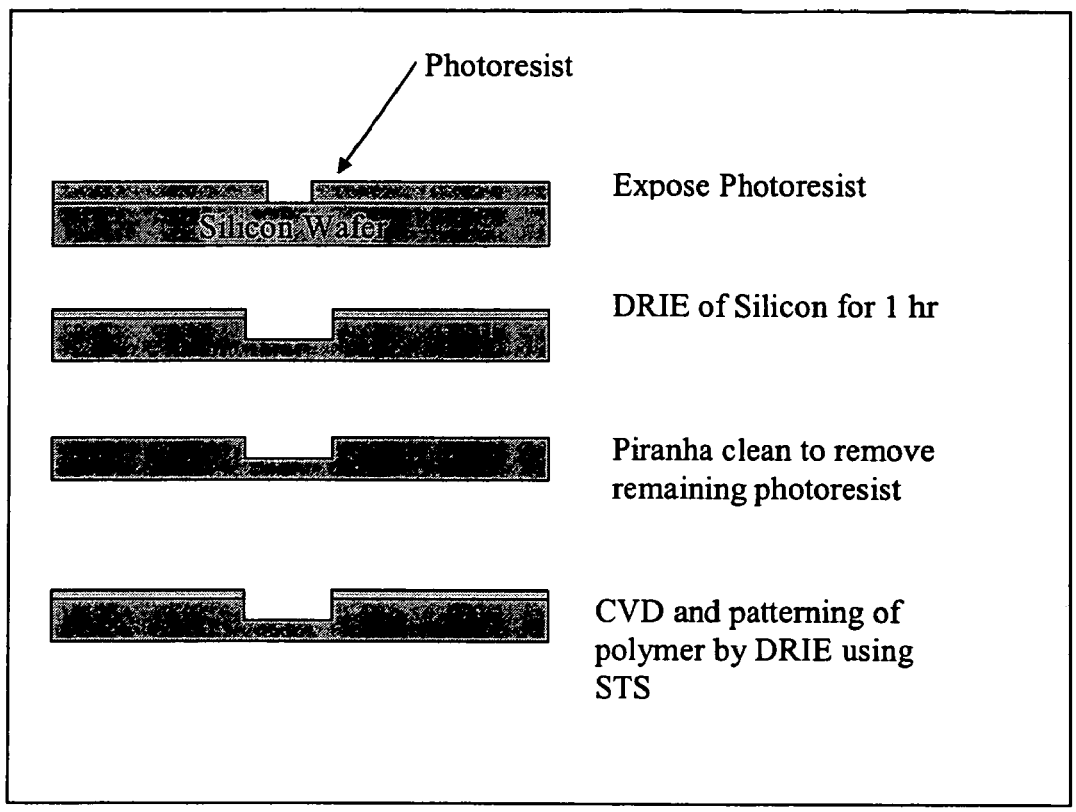
FIG. 10 illustrates a hydrophobic material embodiment using DRIE.
Figure 11:
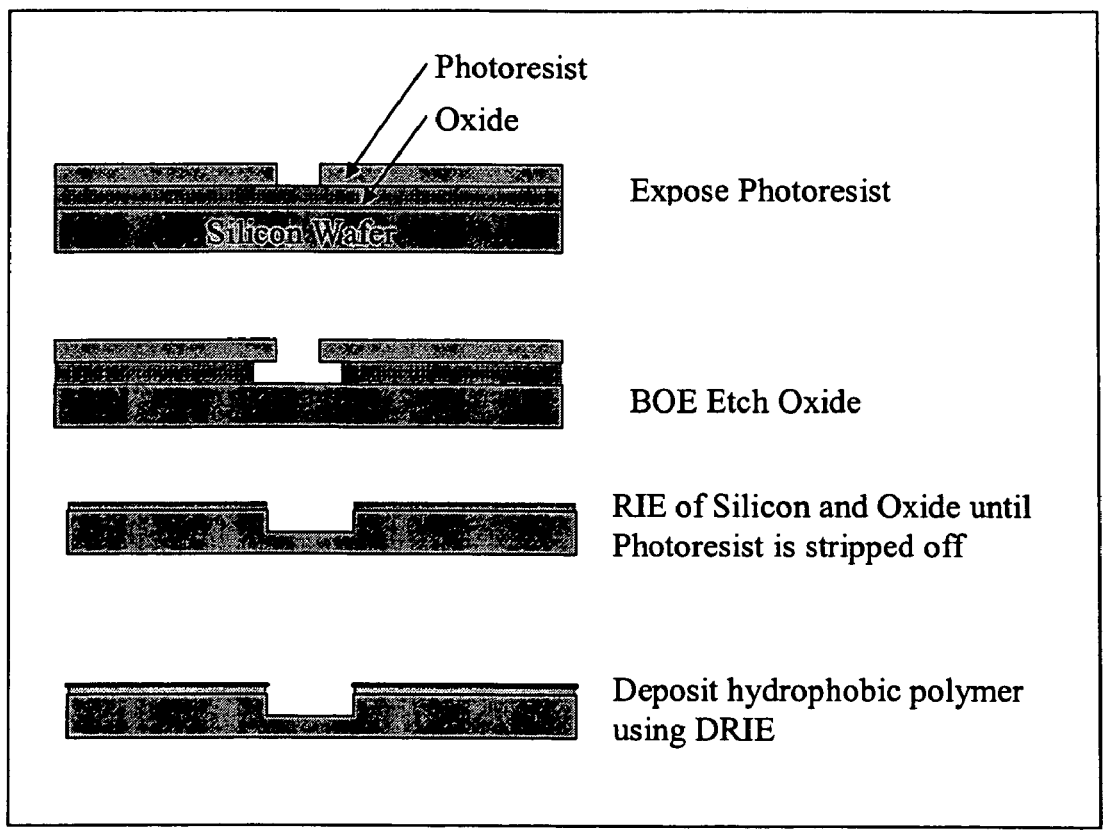
FIG. 11 illustrates a hydrophobic material embodiment using DRIE.
Figure 12:
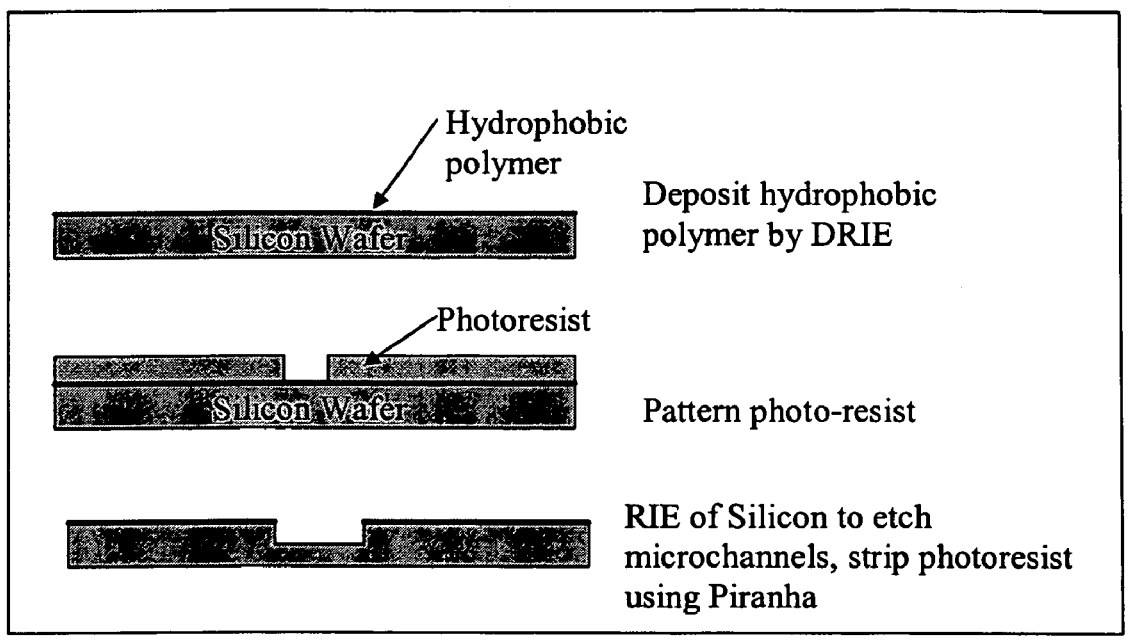
FIG. 12 illustrates a hydrophobic material embodiment using DRIE.
Figure 13:
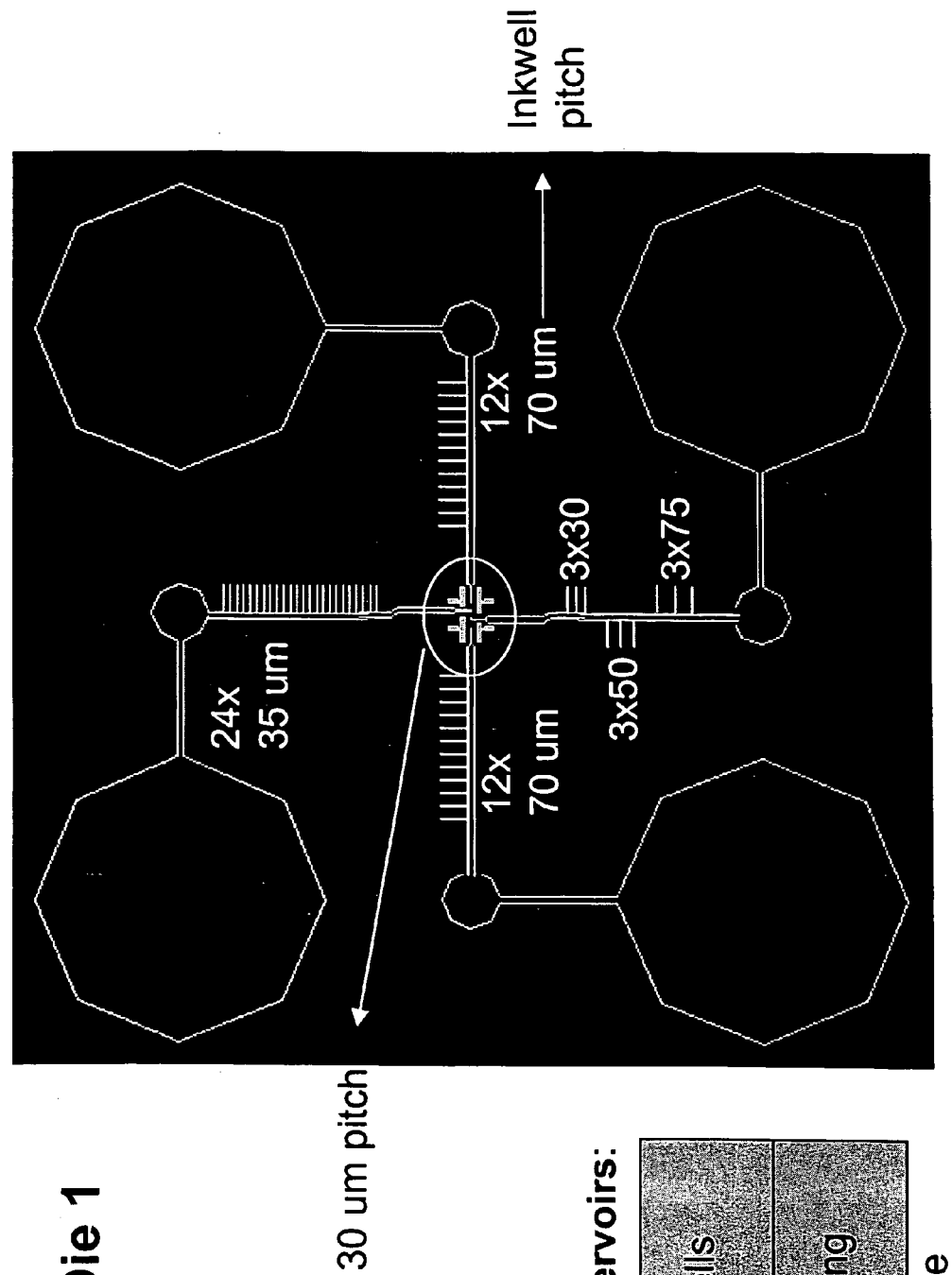
FIG. 13 illustrates a schematic of an inkwell.
Figure 14:
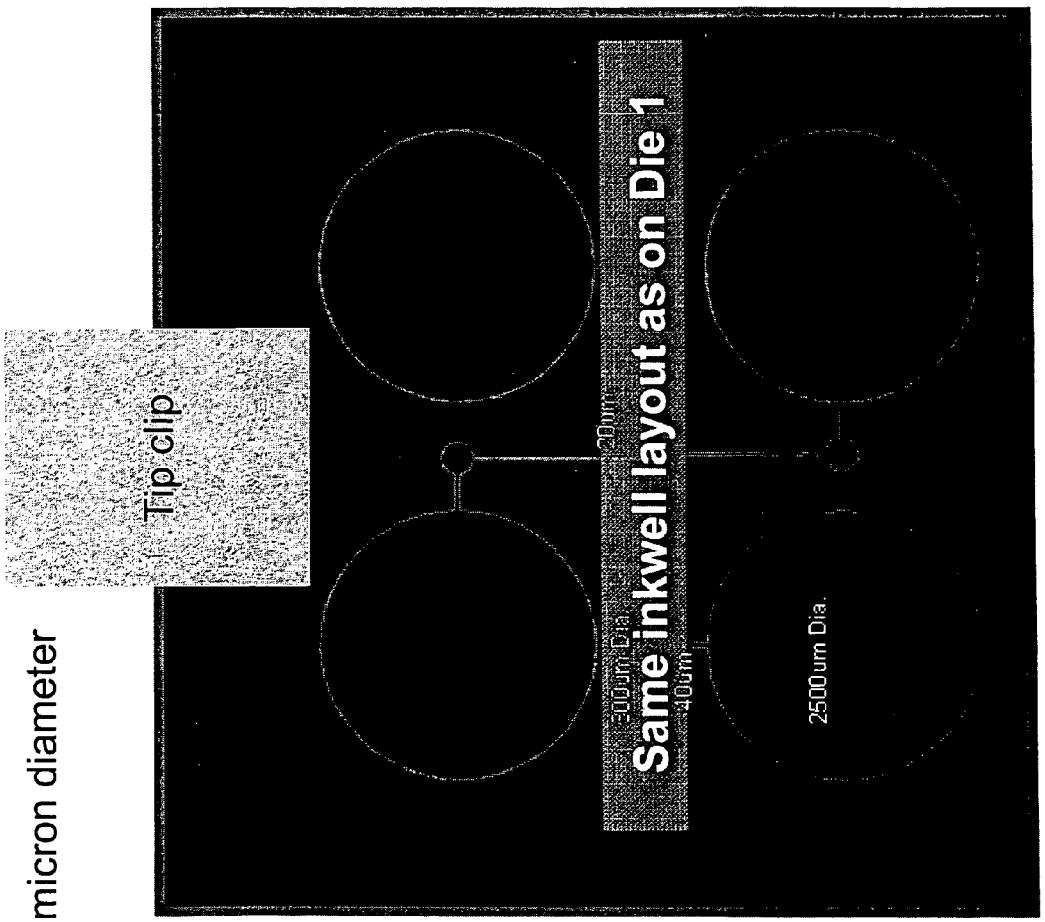
FIG. 14 illustrates an additional schematic of an inkwell.
Figure 14:
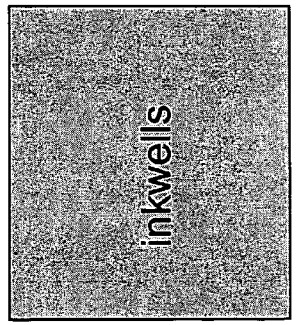
Figure 15:
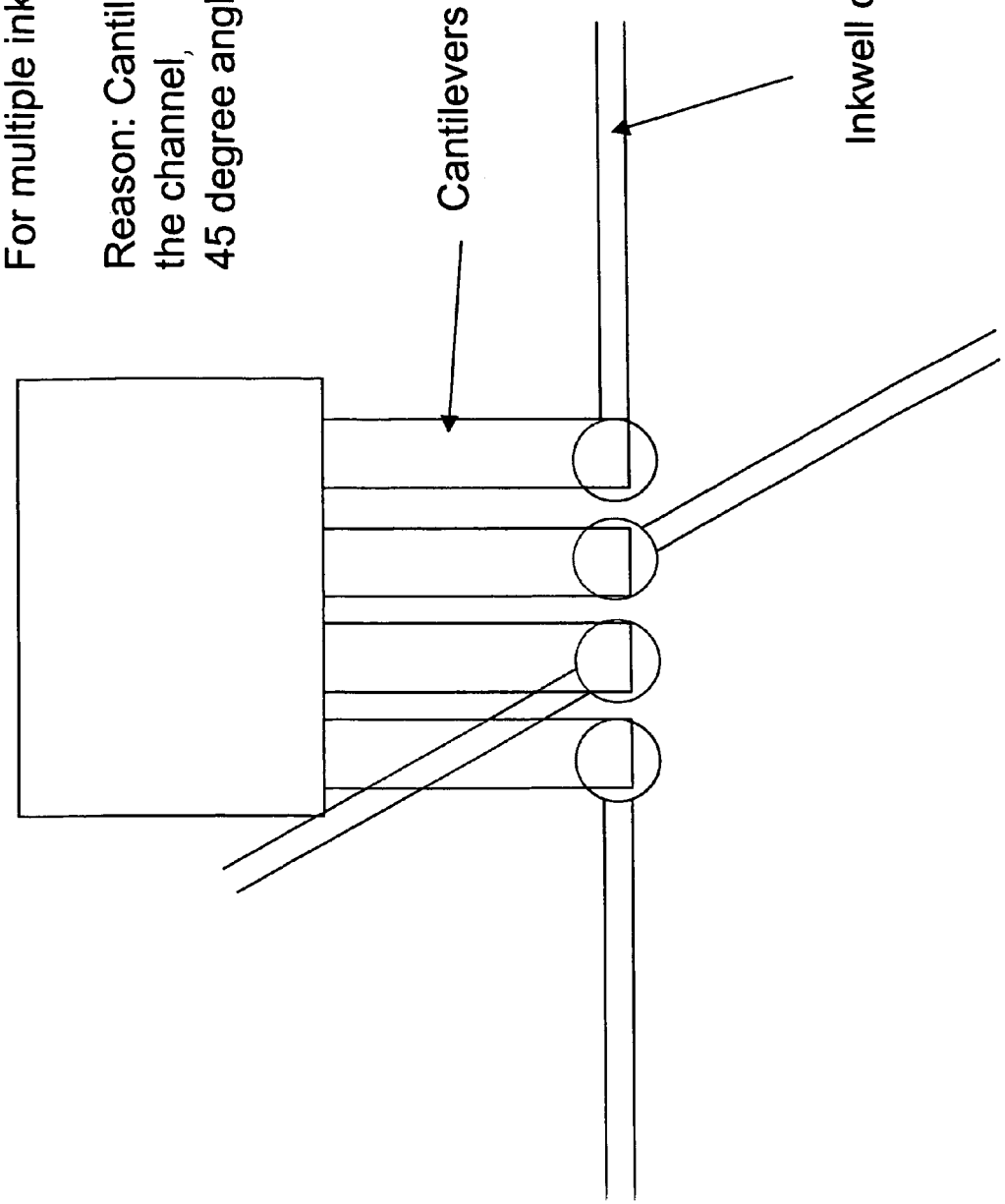
FIG. 15 illustrates a design for multiple inkwells in association with cantilevers.
Figure 16:
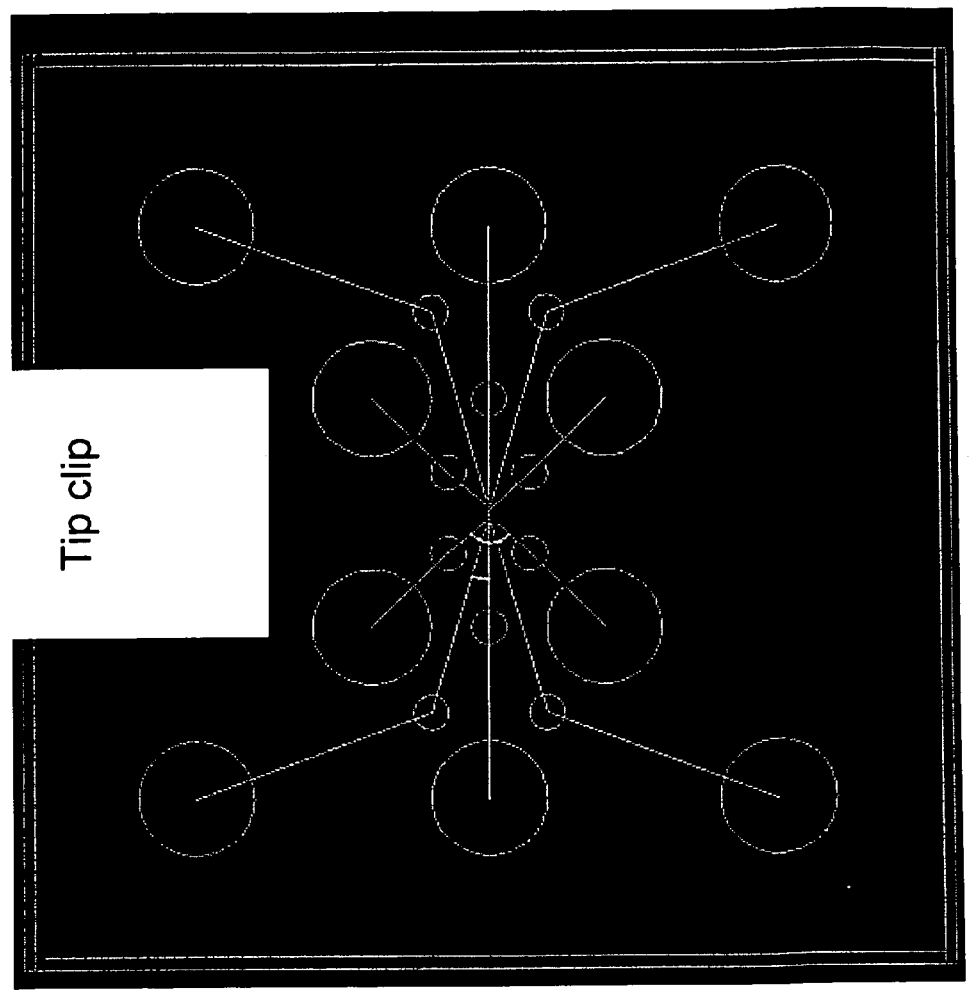
FIG. 16 illustrates another schematic of an inkwell.

The present invention provides a variety of embodiments, including process embodiments for methods of manufacture as well as articles of manufacture and uses of those articles in applications such as, for example, DPN printing. FIGS. 10–12 represent three embodiments.

A typical embodiment would be to oxidize a silicon wafer to obtain oxide of a certain desired thickness. This would be followed by deposition or application of a hydrophobic material layer such as a polymer-like substance using, for example, Deep Reactive Ion Etching (DRIE). An advantage arises when the same instrumentation can be used (e.g., DRIE instrumentation) to both provide deep etching as well as provide the hydrophobic layer, but different instrumentation can be used. Also, DRIE provides narrow channels which are deep. More surface area is provided along the walls of the channel which help pull the fluid down the channel by capillary force. This also reduces the surface area open to the atmosphere which can reduce evaporation.

FIG. 10 illustrates a method for keeping liquid inside a microchannel as it flows through the microchannel and prevent cross contamination comprising the steps of: (A) providing a patterned photoresist on a substrate, (B) etching the substrate to form a microchannel, (C) removing photoresist, and (D) deposition of hydrophobic barrier layer on the substrate surrounding the microchannel. The substrate can be a wafer of solid, crystalline material including a semiconductor material such as silicon. Conventional photoresists can be used and the selection thereof is not particularly limited, although in preferred embodiments, it can be used in conjunction with DRIE and Bosch process methods. The length of time for the DRIE process is not particularly limited but can be, for example, 30 min to 5 h, or 30 min to 2 h. Conventional methods can be used to remove the photoresist including piranha cleaning solution.

In addition, FIG. 11 illustrates a method for keeping liquid inside a microchannel as it flows through the microchannel comprising the steps of: (A) providing a patterned photoresist on a substrate, wherein the substrate comprises an underlying substrate layer and an oxidized overlayer which contacts the photoresist, (B) etching of the oxidized overlayer, (C) removal of the photoresist, and (D) deposition of hydrophobic barrier layer on the substrate surrounding the microchannel.

In FIGS. 10 and 11, the hydrophobic barrier layer is applied as the final step, after the microchannels are formed.

In an alternative embodiment, the hydrophobic barrier layer can be applied initially, before the microchannel is formed by etching. For example, FIG. 12 illustrates a method for keeping liquid inside a microchannel as it flows through the microchannel and prevent cross contamination comprising the steps of: (A) deposit a hydrophobic barrier layer onto a substrate, (B) pattern a photoresist onto the hydrophobic barrier layer, (C) etch microchannels into the substrate, and (D) remove the photoresist.

The surface of the microchannel can be made hydrophilic by use of, for example, sulfuric acid and hydrogen peroxide (piranha) which can remove photoresist and oxide the surface of a silicon microchannel.

The hydrophobic barrier layer can be deposited by a variety of processes, although plasma based processes are preferred. Alternatively, polytetrafluoroethylene can be spun on. Contact angle measurements can be used to measure the hydrophobic properties of the barrier layer.

DRIE is a preferred embodiment and is described in the literature including, for example, *Fundamentals of Microfabrication* noted above at pages 104–107. Processes and instruments from Surface Technology Systems (STS) and Robert Bosch GmbH (Stuttgart, Germany) can be used, including instructions and guidance provided by these companies along with instrumentation. For example, processes for anisotropically etching of silicon are described in, for example, U.S. Pat. Nos. 5,501,893 to Laermer et al. and 6,531,068 to Laermer et al. (Mar. 11, 2003) (Robert Bosch GmbH). The methods involve use of inductively coupled plasma (ICP) reactors and multiplex series with precision thin film etching and deposition. DRIE is a method known in the art used for making structures with deep vertical side walls, including descriptions in the following U.S. Pat. Nos.: 6,582,987 to Jun et al. (Jun. 24, 2003); U.S. Pat. No. 6,368,871 to Christel (Apr. 9, 2002); U.S. Pat. No. 6,443,179 to Benavides et al. (Sep. 3, 2002); and U.S. Pat. No. 6,454,924 to Jedrzejewski et al. (Sep. 24, 2002).

In a typical "Bosch process," a variety of process parameters can be varied for a given application including, for example, $SF_6$ flow (e.g., 30–150 sccm), $C_4F_8$ flow (e.g., 20–100 sccm), etch cycle time (e.g., 5–15 seconds), deposition cycle time (e.g., 5–12 seconds), pressure (e.g., 0.25–10 Pa), temperature (e.g., 20–80° C.), etch rate (1.5–4 microns/min), sidewall angle (e.g., about 90°), selectivity to photoresist (about 100 to 1), and selectivity to $SiO_2$ (about 200 to 1). See, for example, N. Maluf, *An Introduction to Microelectromechanical Systems Engineering*, Artech House, Boston, 2000.

Materials which can form a hydrophobic barrier layer are known in the art. Typical hydrophobic polymers include, for example, Polytetrafluoroethylene, or PTFE, or materials resembling these structures with $CF_2$ and $CF_3$ moieties which are fluorinated, polymeric, and hydrophobic. The hydrophobic polymer would be patterned using photolithography and a photoreactive polymer mask. The selection of the polymer is not particularly limited as long as it can be deposited in a controlled manner and is sufficiently hydrophobic. Fluorinated polymers are particularly preferred. The hydrophobic polymer layer could serve as a etch mask for subsequent etch steps for the underlying oxide and silicon layers. The underlying layers can be etched using wet or dry etch. Contact angle measurements can be used to measure the hydrophobic effect of including the hydrophobic barrier layer. Another example of a hydrophobic material is HMDS, hexamethyldisilazane.

The hydrophobic barrier layer preferably is not formed in a microchannel itself but is in surfaces between microchannels.

Typically, the DRIE can be used to etch deep, high aspect ratio microchannels into the Si substrate which would serve as microchannels and reservoirs for fluid handling. A cap wafer or other material can be bonded by adhesion on top of the substrate to cover the etched microchannels and reservoirs. Use of cap wafers or other materials in bonding means that generally hydrophobic materials may not be desired on the surfaces, particularly if they interfere with bonding. Cover slips can be used as desired as long as they accommodate the application such as, for example, DPN printing.

In another embodiment, an oxidized Silicon wafer can be patterned to include hydrophobic polymer to prevent cross contamination.

The simplest embodiment of this process is to start with a silicon wafer, deposit hydrophobic polymer on the bare wafer followed by photolithographic patterning of photoresist on the polymer. The wafer is then processed by DRIE to etch the hydrophobic polymer and the silicon layer to form microchannels.

The invention is of particular interest for applications in DPN™ printing. Instrumentation and equipment related to this nanolithographic method can be obtained from NanoInk (Chicago, Ill.). Generally, although nanolithography and nanostructures are preferred in the present invention, microlithography and microstructures can be also carried out by the DPN printing method.

The methods and articles described herein can be also used for the fountain pen nanolithography embodiments of DPN printing, wherein hollow tips are used. Inkwells can be used in the practice of DPN printing. Each of the separate inkwells can be filled with different ink solutions if desired. Parallel pen arrays can be used to dip into and ultimately transport the inks to substrates. For example, as many as 4, 8, 16, 32, 64, 128, 1,000 or more, or even 100,000 and 1,000,000 or more separate ink wells can be used. Parallel pen arrays are of particular interest for genomics applications.

WORKING EXAMPLES

The fabrication and testing of inkwells according to the present invention was experimentally verified. Although these experiments are not limited to any one application, DPN printing is a preferred application. An initial objective was the fabrication of ink wells for dipping unique chemistry for a parallel pen array. Four inks were examined for use in, for example, genomics. The design was for open channel flow.

Numerical simulations were carried out including examination of filling time with microchannel width. In general, the simulations showed that wider microchannels filled faster in simulation. Capillary motion in a microchannel was examined by numerical simulation using CFD-ACE Software (from CFD Research Corporation, Huntsville, Ala.).

Simulations were also carried out with Computational Fluid Dynamics to study the dynamics of microchannel filling in the inkwells. The simulations were for open channel flow and pipe flow. Pipe flows tends more to form bubbles, is slower, and generally is less reliable. However, the evaporative loss of liquids is minimal. In contrast, open channel flow suffers from higher evaporation loss but is also more reliable with less chance of bubble formation and the filling speeds are faster. See, for example, "Planar Capillary Pumped Ink Delivery Apparatus for Dip Pen Nanolithography (DPN" by D. Banerjee et al.; Proceedings of the Micro Total Analyses Systems, 2003, Oct. 5–9, Sqauw Valley, Calif., which is hereby incorporated by reference in its entirety including the figures and simulations and working examples.

Inkwells were fabricated, and inkwell designs are provided in FIGS. 13–16.

Figure 17:
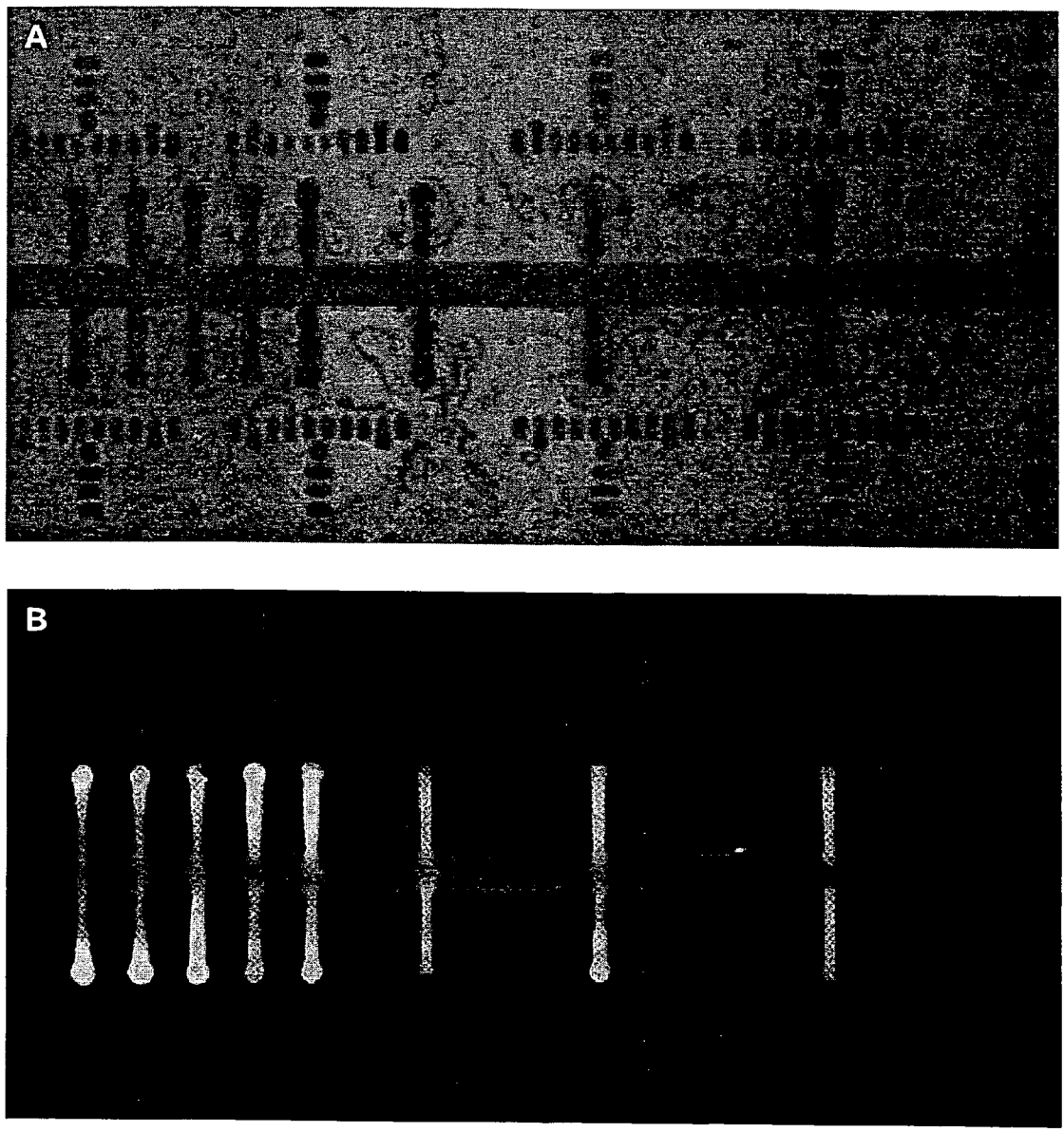
FIG. 17 illustrates testing of inkwells using fluorescent die.
Figure 18:
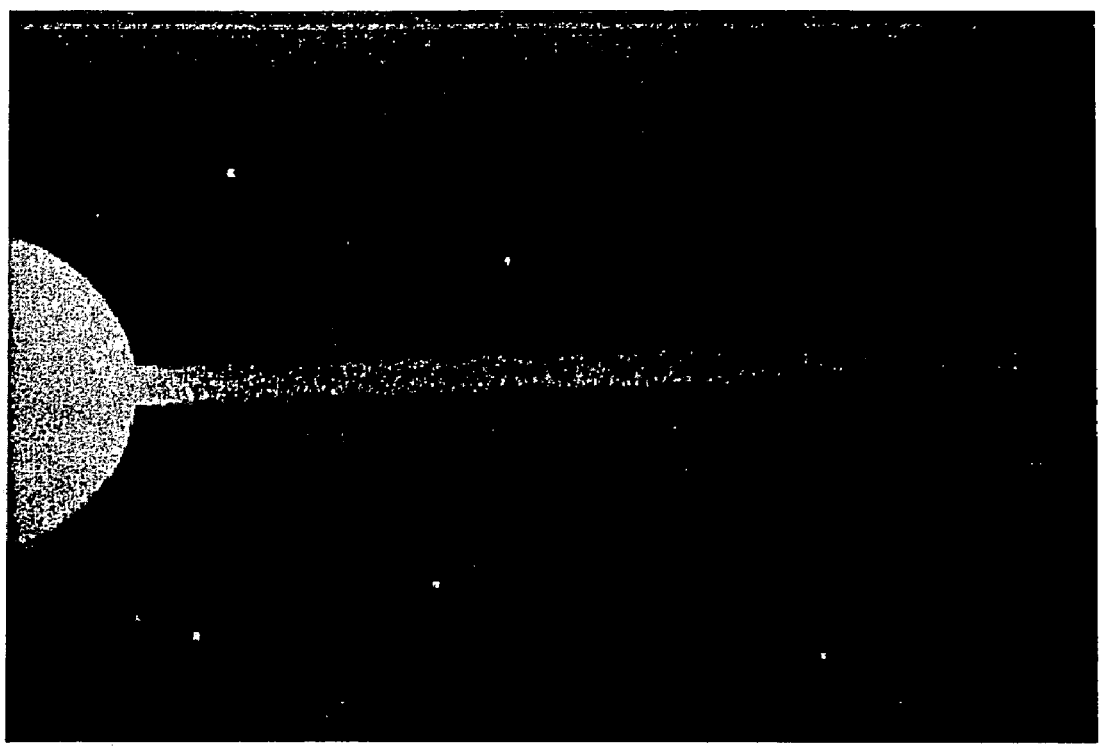
FIG. 18 illustrates further testing of inkwells using fluorescent die.
Figure 19:
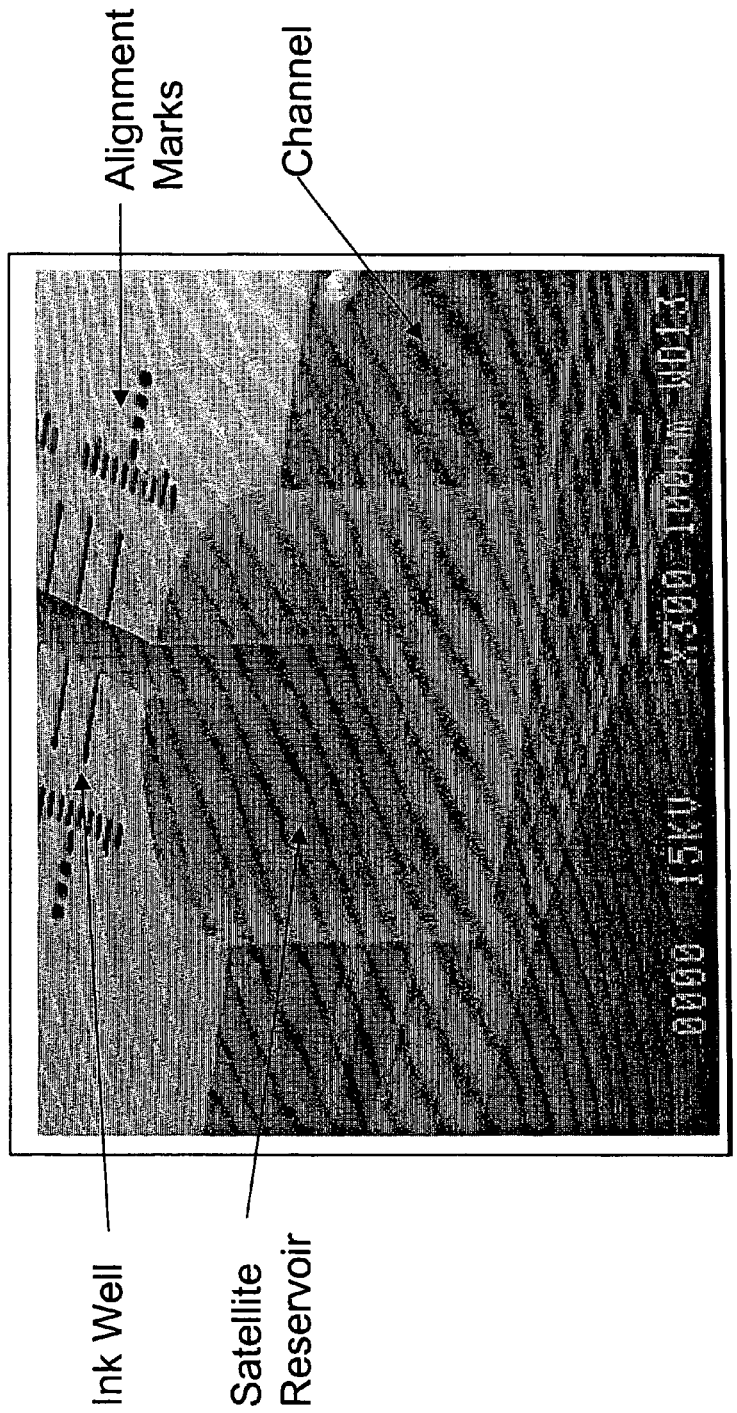
FIG. 19 illustrates SEM picture of inkwells.
Figure 20:
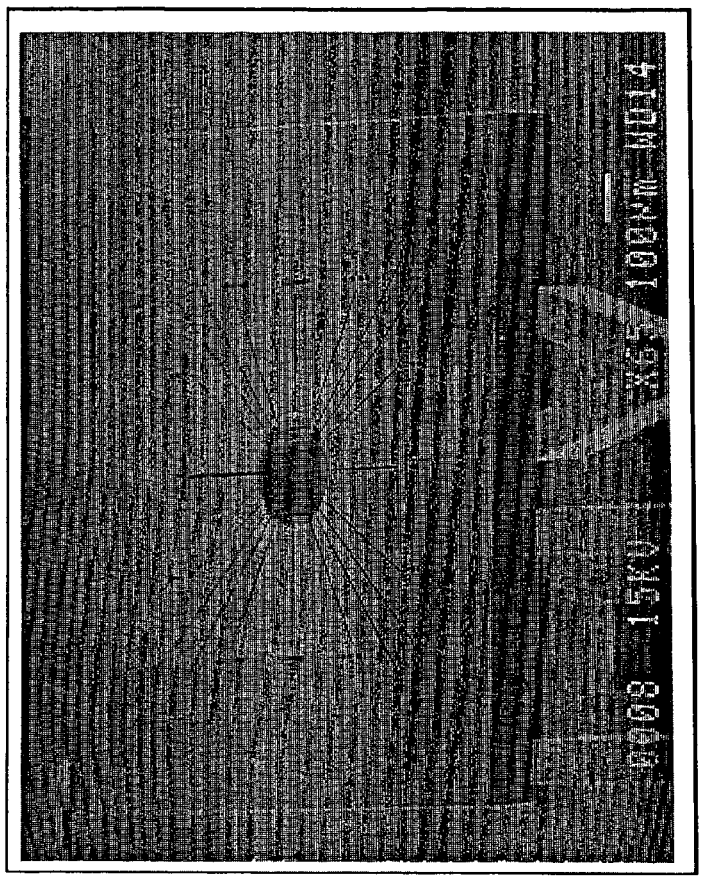
FIG. 20 illustrates SEM picture of inkwells.
Figure 21:
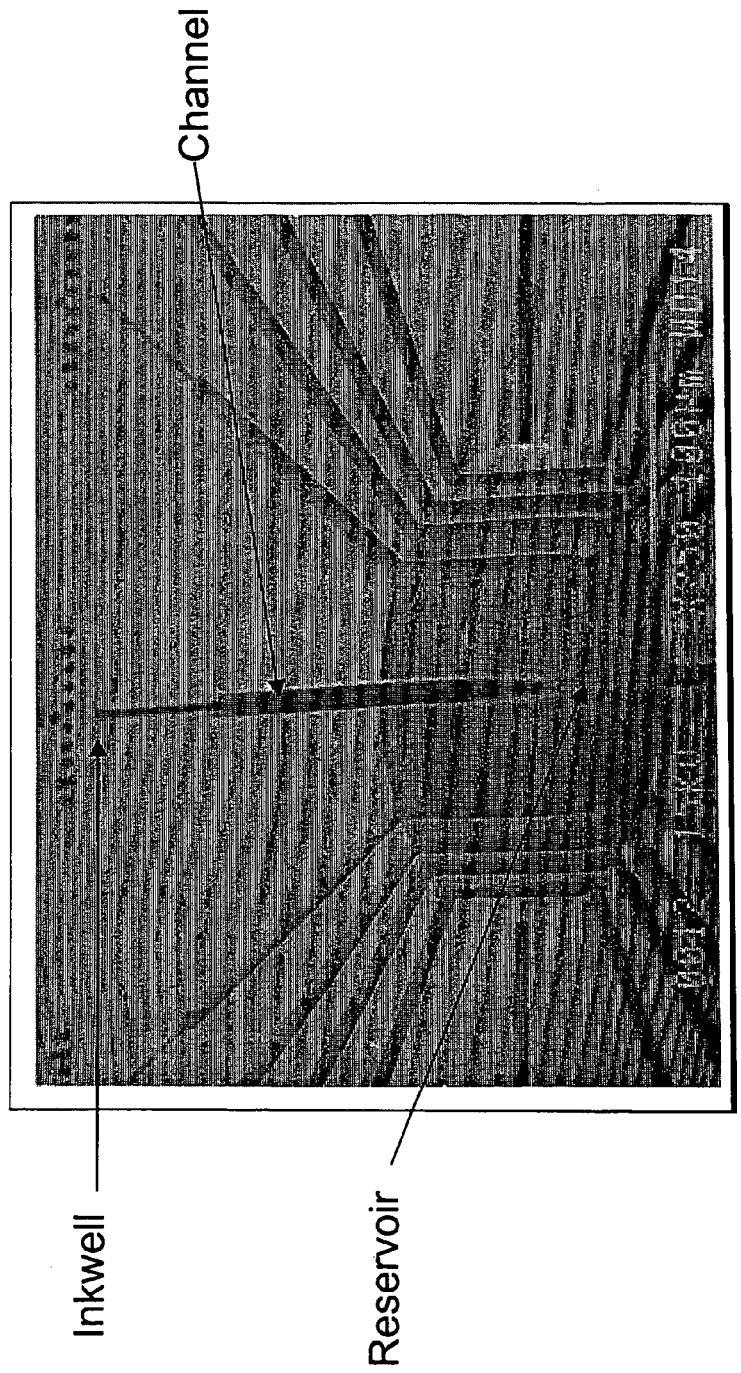
FIG. 21 illustrates SEM picture of inkwells.
Figure 22:
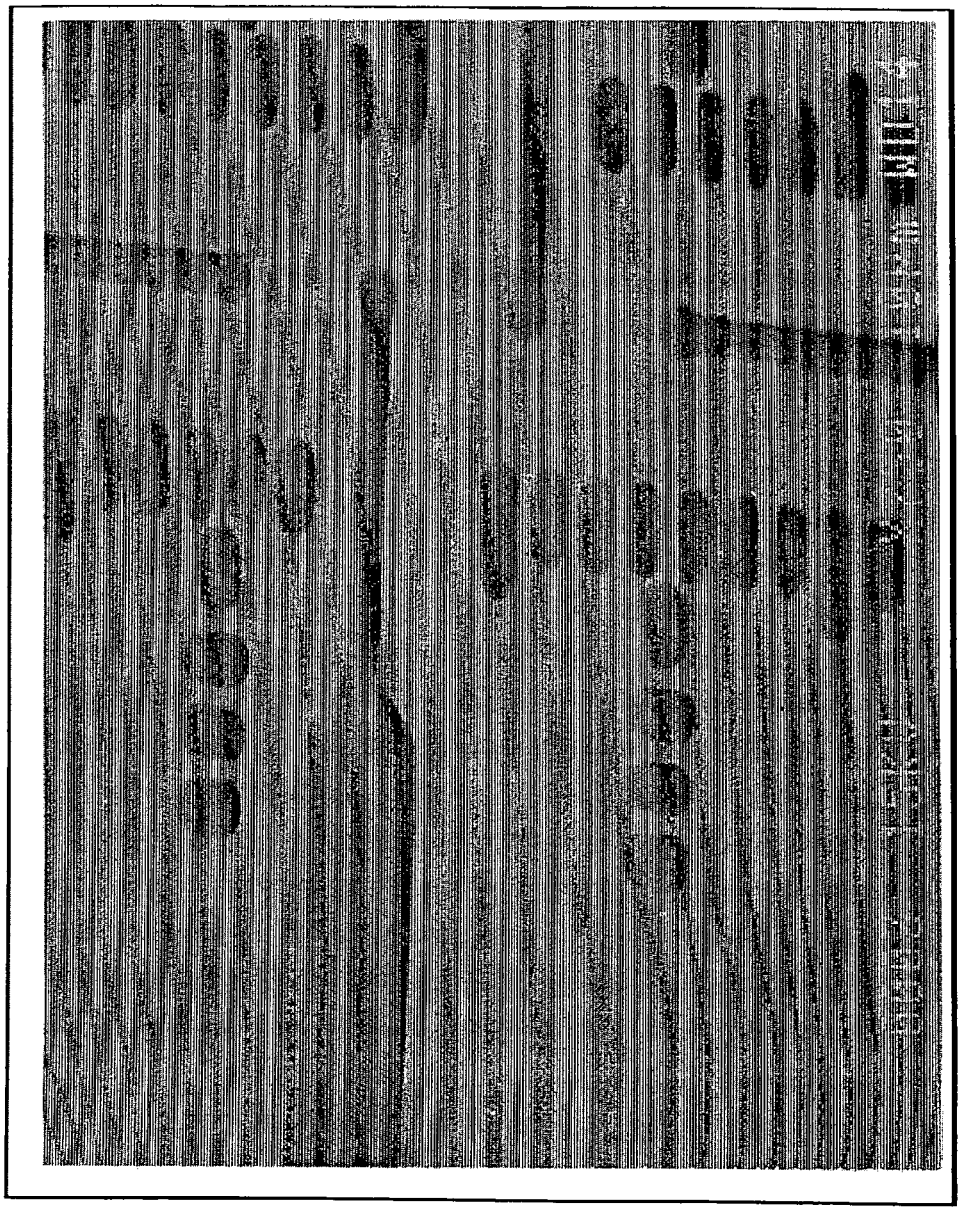
FIG. 22 illustrates SEM picture of inkwell and alignment marks.

FIG. 17 shows results for testing of ink wells using fluorescent dye. FIG. 17A shows phase contrast image of the ink well containing a fluorescent dye. FIG. 17B and FIG. 18 also shows fluorescent microscope image of the same sample, showing the fluorescent ink flowing inside the micro ink wells.

Inkwells were fabricated together with alignment marks, channels, and satellite reservoirs. The layout of the different features can be imaged by SEM methods, as illustrated in FIGS. 19–22.

Figure 23:
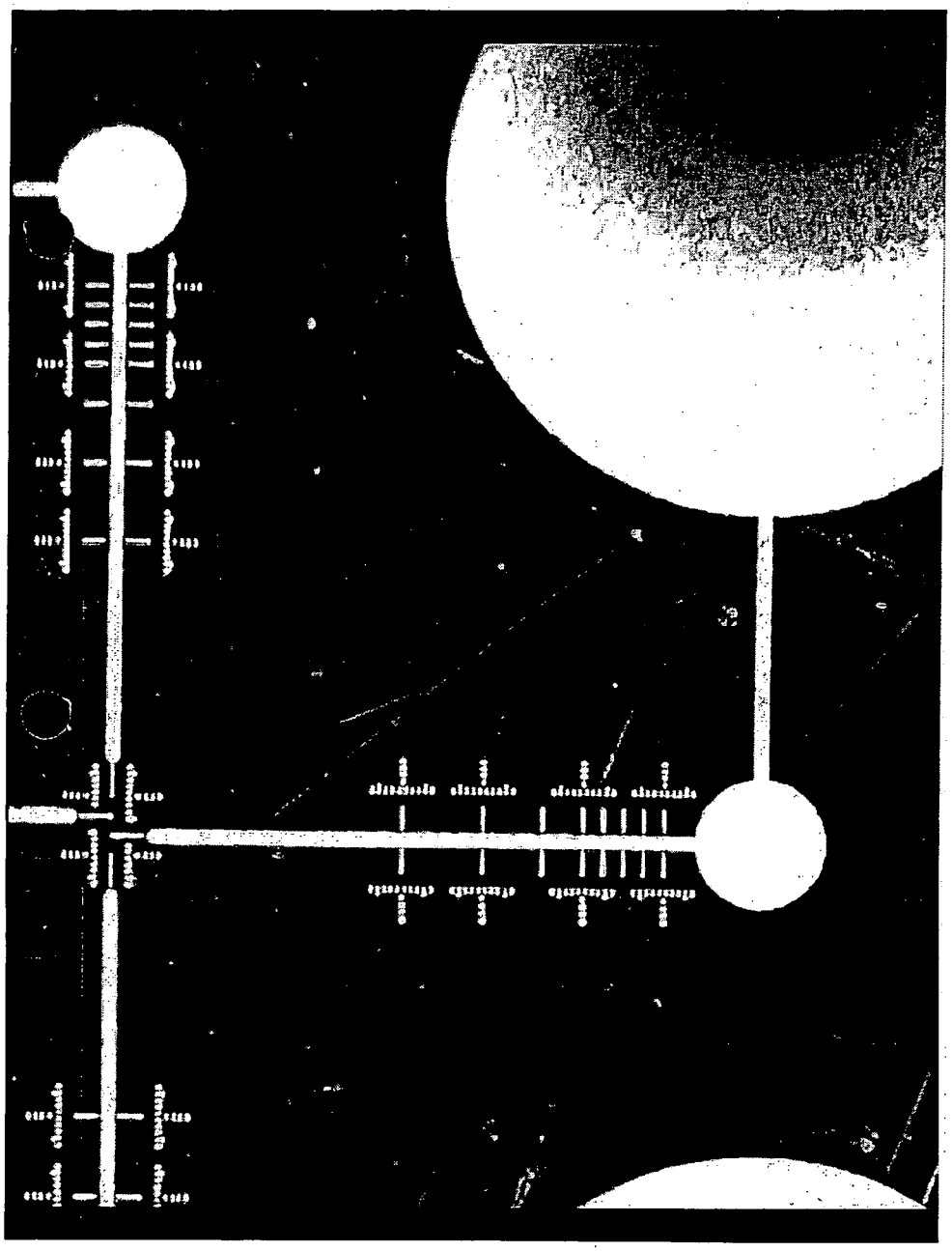
FIG. 23 illustrates ink flow from the reservoir.
Figure 24:
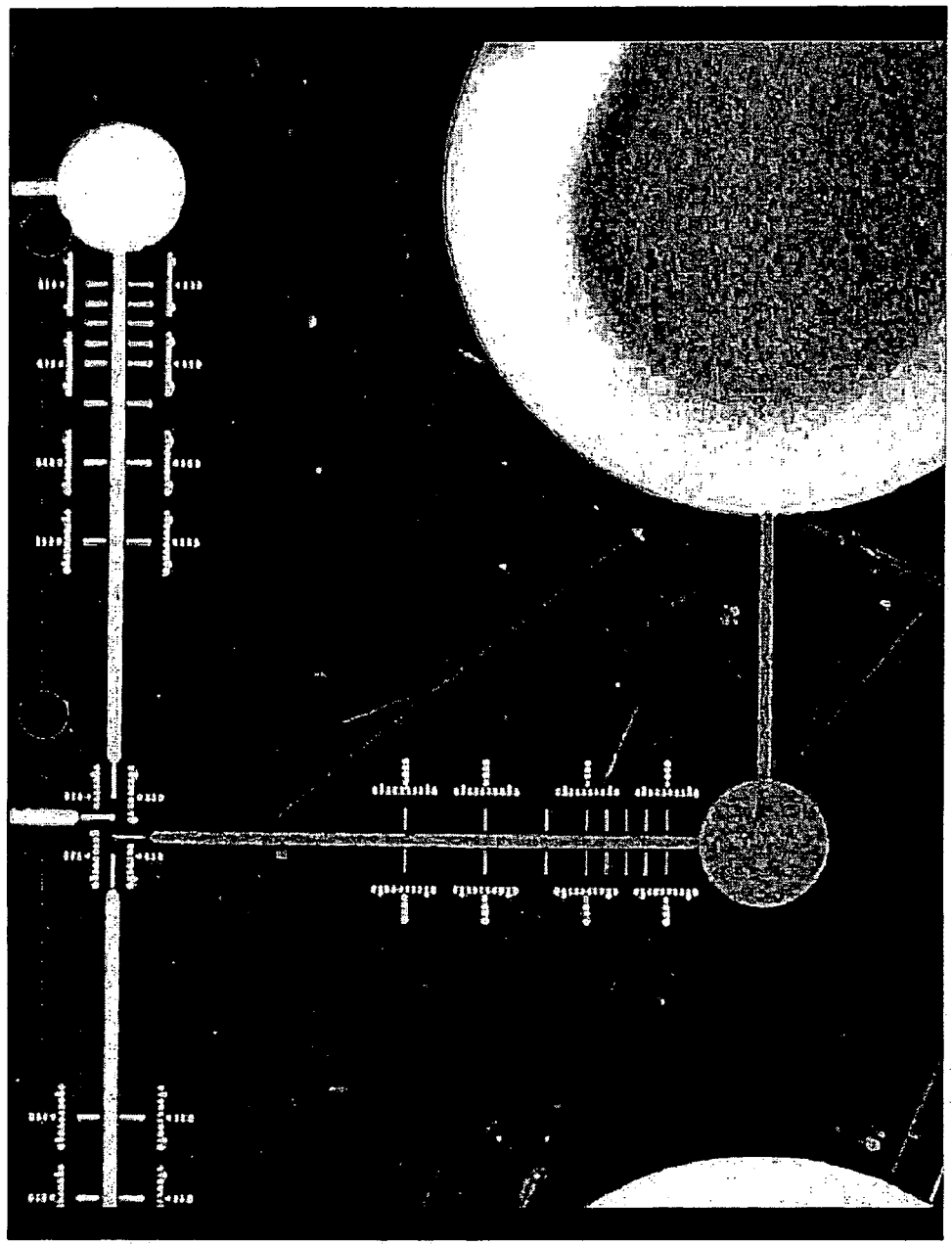
FIG. 24 illustrates ink flow from the reservoir.
Figure 25:
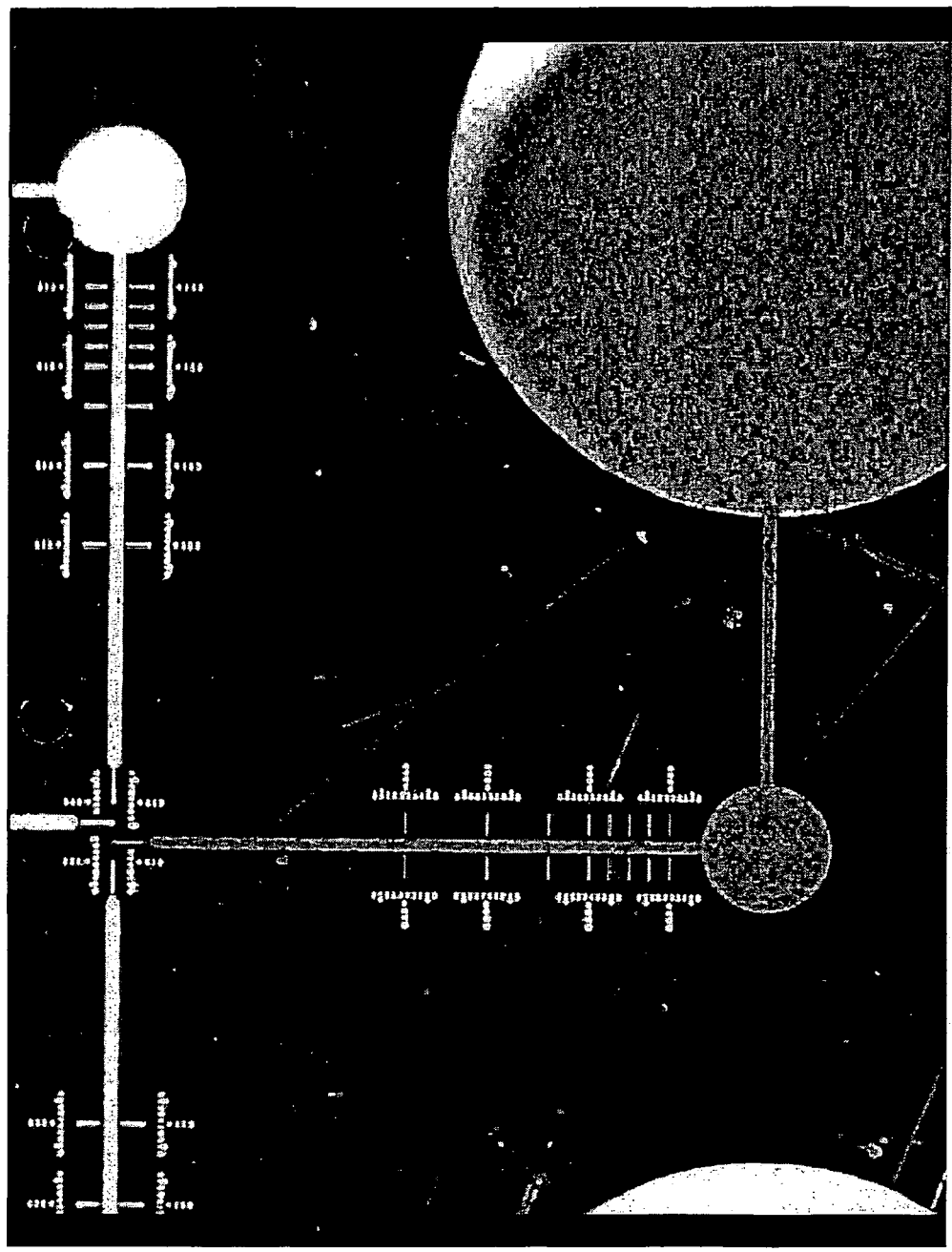
FIG. 25 illustrates ink flow from the reservoir.

Finally, video images were used to monitor the effectiveness of the hydrophobic barrier layer. The movies showed the ink flowing in the channels and not flowing out of the reservoir or channels. The inks were trapped by the hydrophobic barrier layer. Still photos were taken from the movies, and three photos are shown in FIGS. 23, 24, and 25. FIG. 23 shows at a point in time of only a few tenths of a second after the ink is placed in the reservoir. The ink had not moved all the way across the reservoir. FIG. 24 shows after about 1 sec, the full channel and subchannels and inkwells. The meniscus was starting to build up vertically in the reservoir. FIG. 25 is after about four seconds. The meniscus was fully developed and there is no ink moving across the surface (hydrophobic coated) or moving into the other channels.

When the hydrophobic barrier layer was not present, the ink left the channels and moved to undesired places, which is a source of undesired cross-contamination.

For the video monitoring experiments, an Olympus SM-10A stereo zoom microscope was used with a photoport. Attached to the photoport was a Pultronix 1300 progressive scan video camera. The video camera was attached to a Dell computer with video capture software. A Hamilton Micro Syringe (10 nanoliter) was used to deposit the ink into the reservoir. The syringe was mounted to a modified holder for inking wafers on a wafer prober which was mounted to a Miller Design micropositioner. The wafer was placed onto a machined aluminum disk which was mounted onto a Newport DS-40 xy stage. All the hardware was mounted to a Newport 12"×24" aluminum mounting plate with drilled and tapped holes on 1" centers. The wafer was illuminated with light from a halogen light source using a fiber optic coupler. Two different lighting options were used; one with two gooseneck arms and the other which mounts to the bottom of the microscope to provide illumination similar to brightfield and darkfield on a compound microscope.

ADDITIONAL ASPECTS

A number of these embodiments of the invention can be further summarized as different aspects of the invention, which are numerically listed below. For example, aspect 1 is a microfluidic device comprising: a substrate comprising a surface and a plurality of microchannels which are hydrophilicly surface treated, and at least one hydrophobic barrier layer on the surface between the microchannels which prevents cross contamination between the plurality of microchannels when liquid flows through the microchannels. Aspect 2 is the microfluidic device according to aspect 1, wherein the hydrophobic barrier layer is a polymeric layer. Aspect 3 is the microfluidic device according to aspect 1, wherein the hydrophobic barrier layer is a fluorinated polymeric layer. Aspect 4 is the microfluidic device according to aspect 1, wherein the hydrophobic barrier layer is produced by a plasma. Aspect 5 is the microfluidic device according to aspect 1, wherein the hydrophobic barrier layer is produced by a plasma with use of a deep reactive ion etching instrument. Aspect 6 is the microfluidic device according to aspect 1, wherein the microchannels are configured to deliver liquid ink to or from one or more reservoirs and are adapted for use in transferring the ink to a nanolithography tip as an inkwell. Aspect 7 is the microfluidic device according to aspect 1, wherein the device is an ink well for use in nanolithography and further includes alignment marks. Aspect 8 is the microfluidic device according to aspect 1, wherein the hydrophobic layer is about 10 microns thick or less. Aspect 9 is the microfluidic device according to aspect 1, wherein the hydrophobic layer is about one micron thick or less. Aspect 10 is the microfluidic device according to aspect 1, wherein the hydrophobic layer comprises at least one monolayer. Aspect 11 is an inkwell device adapted for use for dipping of a nanoscopic tip to transfer ink from the inkwell device to the tip, wherein the inkwell device comprises at least one hydrophobic barrier layer on a substrate surface which prevents ink from travelling out of a microchannel disposed next to the hydrophobic barrier layer. Aspect 12 is the inkwell device according to aspect 11, wherein the device further comprises alignment marks. Aspect 13 is the inkwell device according to aspect 11, wherein the device further comprises ink reservoirs. Aspect 14 is the inkwell device according to aspect 11, wherein the device further comprises an ink reservoir with microchannels radiating from the reservoir. Aspect 15 is a method for keeping liquid inside a microchannel as it flows through the microchannel and prevent cross contamination comprising the steps of: providing a patterned photoresist on a substrate, etching the substrate to form a microchannel, removing photoresist, and deposition of hydrophobic barrier layer on the substrate surrounding the microchannel. Aspect 16 is a method for keeping liquid inside a microchannel as it flows through the microchannel comprising the steps of: (A) providing a patterned photoresist on a substrate, wherein the substrate comprises an underlying substrate layer and an oxidized overlayer which contacts the photoresist, (B) etching of the oxidized overlayer, (C) removing the photoresist, and (D) depositing of hydrophobic barrier layer on the substrate surrounding the microchannel. Aspect 17 is a method for keeping liquid inside a microchannel as it flows through the microchannel and prevent cross contamination comprising the steps of: deposit a hydrophobic barrier layer onto a substrate, pattern a photoresist onto the hydrophobic barrier layer, etch microchannels into the substrate, and remove the photoresist. Aspect 18 is the method according to aspect 17, wherein removal of the photoresist provides a hydrophilic layer in the microchannels. Aspect 19 is the method according to aspect 17, further comprising etching of at least one reservoir and at least one inkwell. Aspect 20 is the method according to aspect 19, wherein removal of the photoresist provides a hydrophilic layer in the microchannels, the reservoir, and the inkwell. Aspect 21 is a method for preventing cross contamination in closely spaced microchannels in a microfluidic device comprising the step of forming a hydrophobic barrier layer between the microchannels, wherein the hydrophobic layer is disposed on the substrate surface surrounding the microchannels. Aspect 22 is a method for improving nanolithographic printing of ink from a tip to a substrate using a nanolithographic delivery device comprising the step of providing a hydrophobic barrier layer between a plurality of microchannels which are configured to assist in the transport of ink in the nanolithographic delivery device. Aspect 23 is a method for improving the ability of an inkwell microchannel device to retain ink in the inkwell as it fills with ink comprising the step of disposing a hydrophobic barrier layer on a surface next to the microchannel. Aspect 24 is a method of fabricating an inkwell device comprising etching microchannels into a substrate, and depositing a hydrophobic barrier layer on surfaces next to the microchannels, wherein the same instrument is used for both the etching step and the depositing of the hydrophobic barrier layer. Aspect 25 is a nanolithography kit comprising an inkwell device, wherein the inkwell device is surface treated with a hydrophobic barrier layer to prevent cross contamination.

ADDITIONAL EMBODIMENTS AND WORKING EXAMPLES

Additional description is provided in this embodiment.

The following embodiments further demonstrate a microfluidic device comprising microfluidic components such as microchannels, microwells and fluid reservoirs. The microfluidic device can be used to simultaneously coat an array of DPN pen tips with different inks. An objective of this embodiment is to demonstrate the ability to deliver different inks from reservoirs into appropriately spaced microwells using micro-capillary flow, and to use this device for multi-pen array dipping. In this embodiment the reservoirs, microwells and their connecting micro-channels were etched in silicon wafers using photolithography and deep Reactive Ion Etching (or "deep RIE" or "DRIE") micromachining process.

Figure 26:
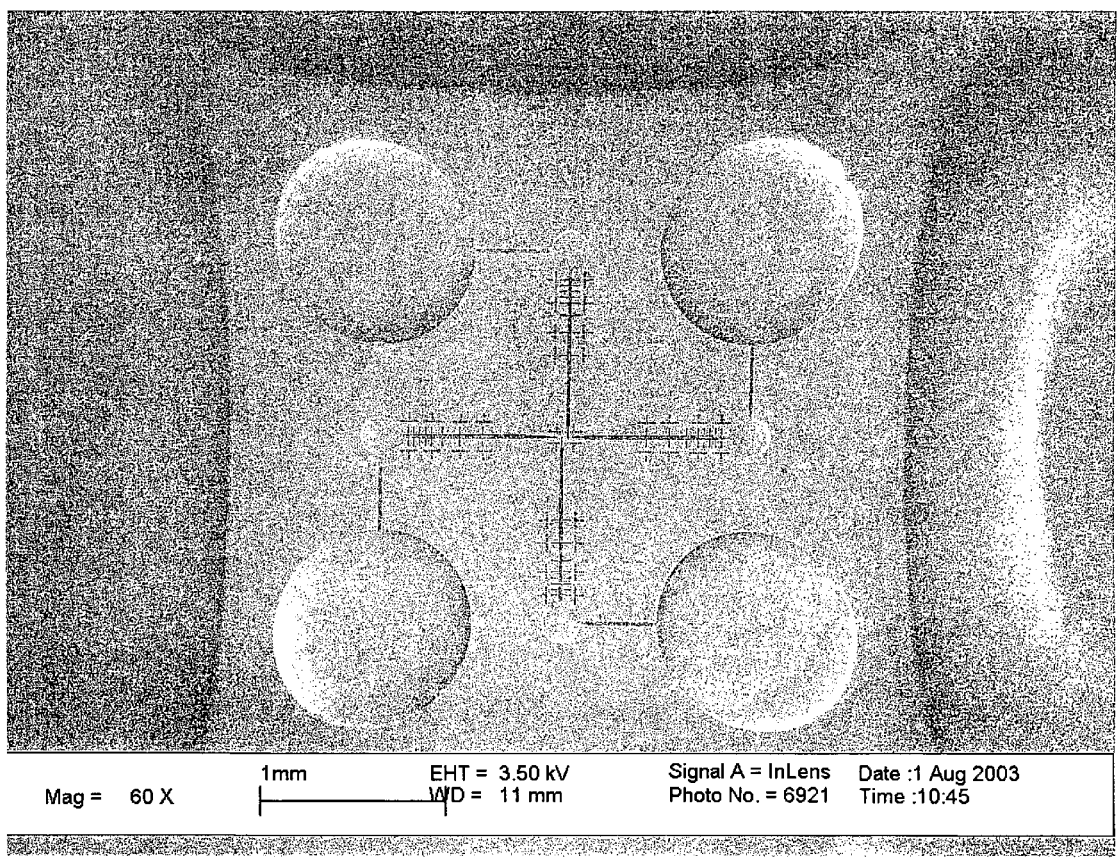
FIG. 26 illustrates SEM picture of inkwells.
Figure 27:
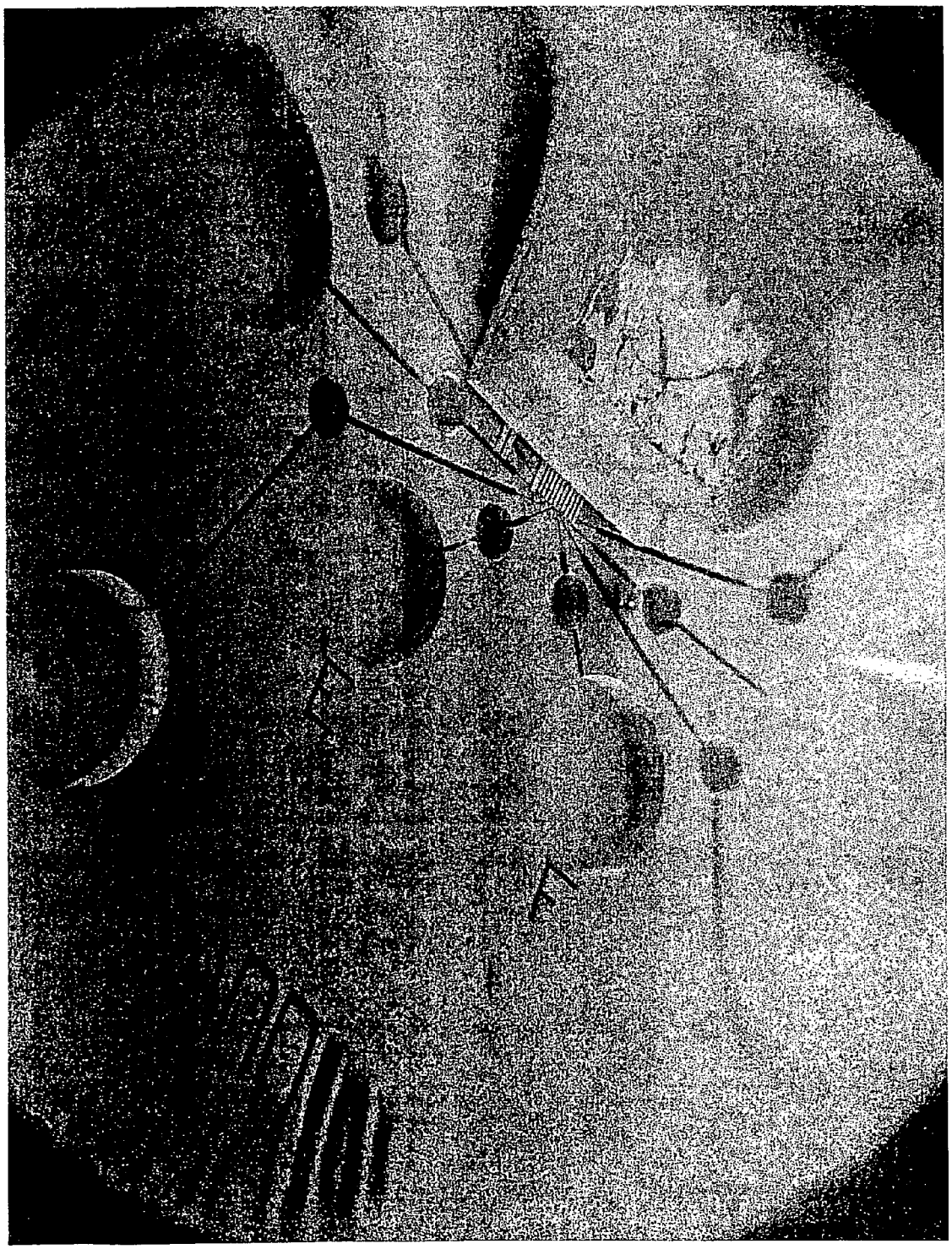
FIG. 27 illustrates SEM picture of inkwells with probe.
Figure 28:
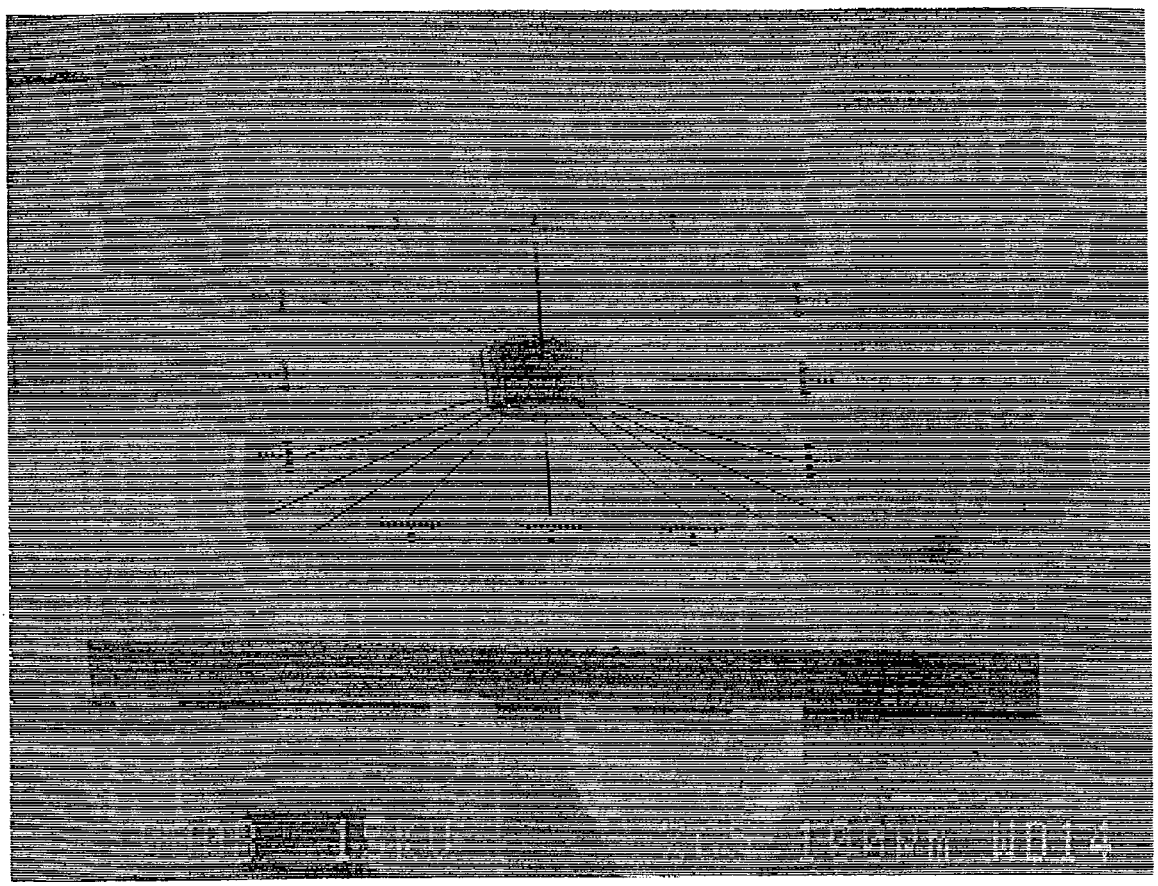
FIG. 28 illustrates SEM picture of inkwell.
Figure 29:
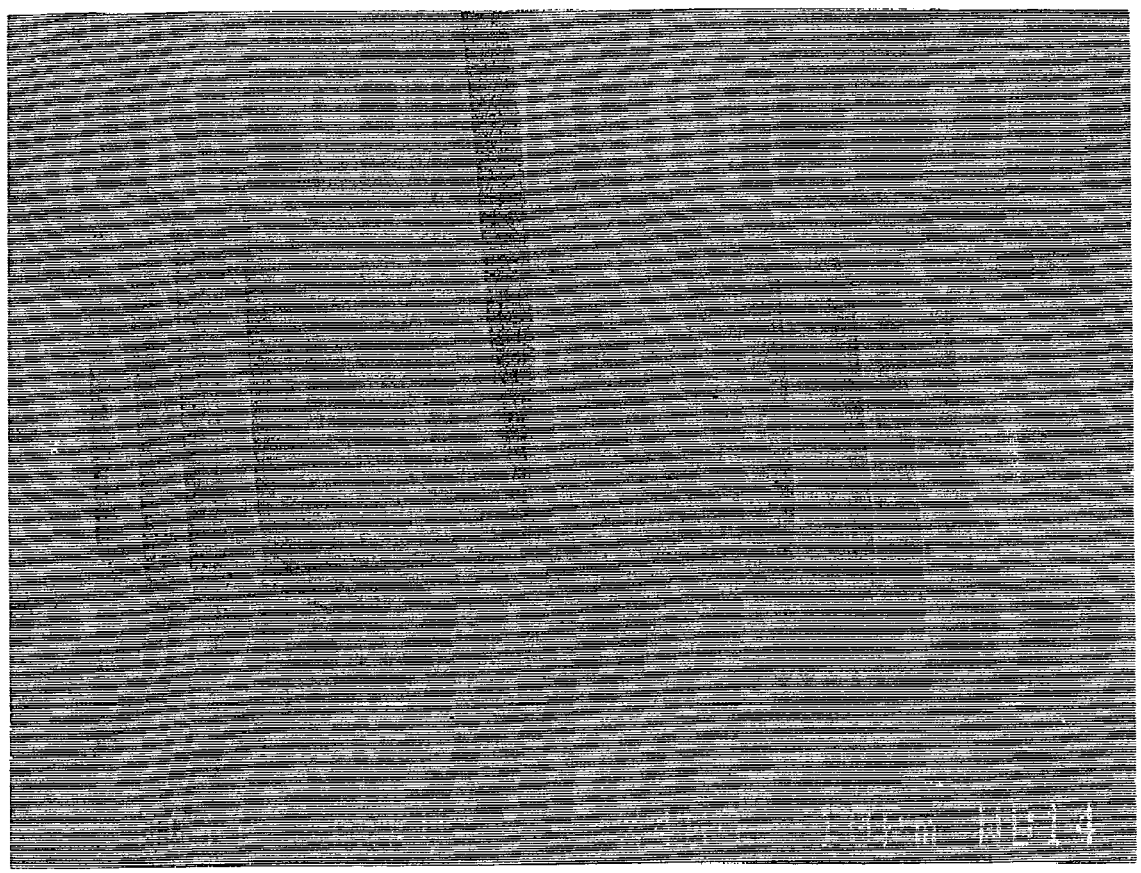
FIG. 29 illustrates SEM picture of inkwell.
Figure 30:
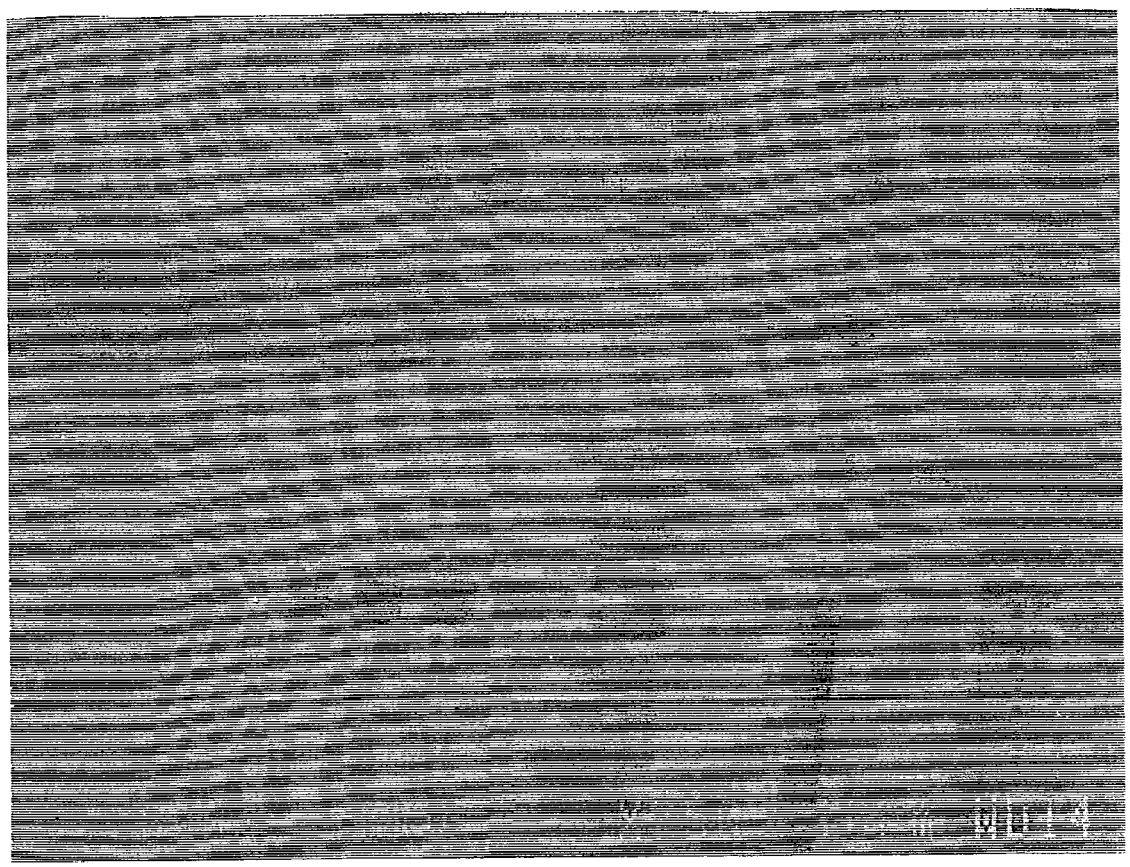
FIG. 30 illustrates SEM picture of inkwell.
Figure 31:
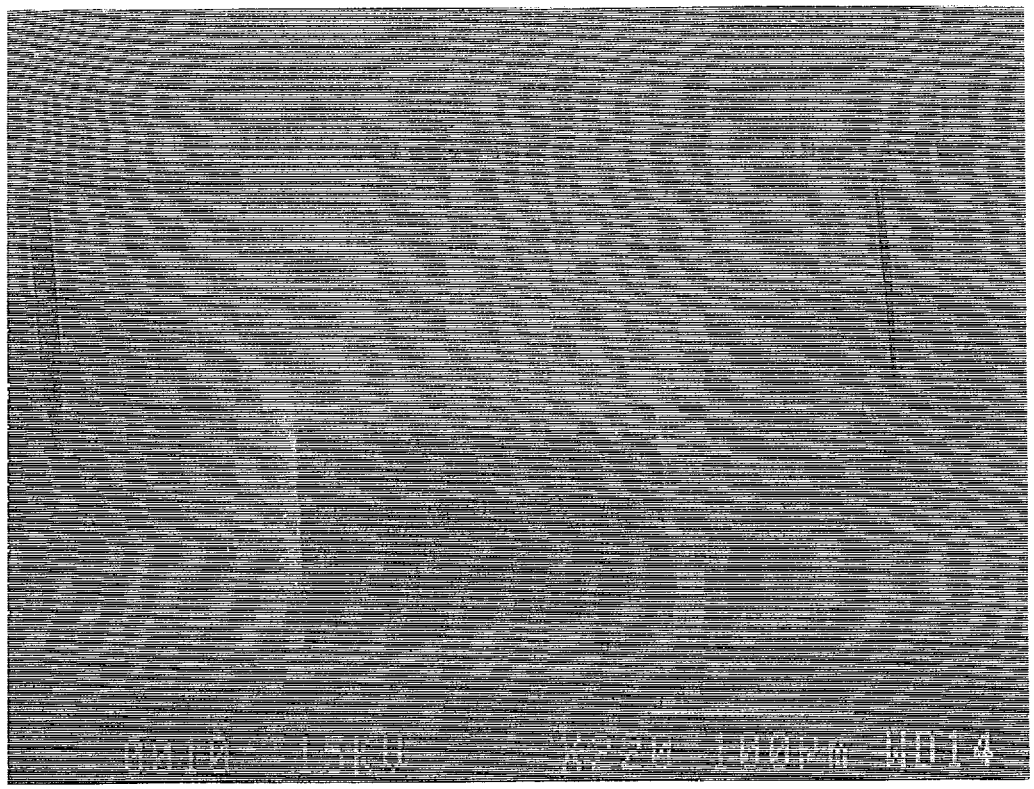
FIG. 31 illustrates SEM picture of inkwell.

To multiplex the writing process using an array of multiple DPN pens with different inks, this embodiment enables selective deposition of ink chemistries onto the individual pens. This is accomplished by "dipping" the multi-pen array into an array of microwells, where each microwell can contain inks of different chemical composition. This particular embodiment demonstrates the ability to deliver 4 to 10 different inks from 4 to 10 different reservoirs respectively, into appropriately spaced microwell array. FIG. 26 shows the top view of an SEM image of an embodiment incorporating 4 reservoirs for handling 4 different inks and can be used to coat an array of DPN pens with 4 different inks or an array with the same ink. FIG. 27 shows the top view of the SEM image of an embodiment of this device which has 10 reservoirs and can be used to coat a DPN pen tip array with 10 different inks. FIG. 27 shows the ink delivery device with the DPN pens aligned on top of the microwells. These embodiments can be modified to handle more than, for example, 1,000 different inks by incorporating more reservoirs, microchannels and microwells in a multi-dimensional array layout of the microfluidic components. In this embodiment fluid actuation can occur by open channel meniscus driven flow (wicking) in open microchannels, which distribute liquid from reservoirs into an array of terminal microwells connected by microchannel tributaries. As fluid flows, the width of channel can be reduced. This embodiment can be modified by bonding a wafer on top of the substrate to achieve fluid actuation by closed channel meniscus driven flow (wicking) in closed microchannels.

Finally, tips for a writing pen can have a variety of sizes at the end, away from the tip base. In general, smaller tip sizes can be used. Size can be measured by methods known in the art and include tip radius for the end of the tip. For example, tip radius of less than about 100 nm, and more particularly, less than about 25 nm can be used. Another useful range is about one micron to about 5 nm, and more particularly, about 500 nm to about 5 nm, and more particularly, about 250 nm to about 5 nm.

The microfluidic device can be fabricated using a variety of micromachining methods. The microchannels, reservoirs and microwells can be etched on a variety of substrates such as germanium, silicon, metals, polymer, and the like. The substrates could be formed from wafers and can also include polymers which have been cast into moulds, or by imprinting polymers with a master, and the like. Molded plastic, embossed plastic, and laser micromachined plastic can be used. The substrates could have multiple layers formed on them by various types of chemical treatments such as oxidation, precipitation, surface or volumetric chemical reaction with the substrate, vapor deposition, electroless deposition, electrochemical deposition, etc. The materials forming the layers could be oxide, metals, polymers, organic and inorganic substances. The layers could be formed in various ways with the purpose of modifying the surface properties of the microfluidic components or to serve as masks for fabrication process steps. The microfluidic components, which include the microchannels, reservoirs and microwells can be fabricated by molding, imprinting. wet etching, dry etching or a combination of these processes. This particular embodiment was fabricated by deep RIE and etching to a depth of more than 100 microns. This embodiment can also be fabricated to a shallower or deeper depth than 100 microns to afford more favorable operation of the device depending on the type of ink used, the phase change properties (e.g., evaporation), filling, bubble formation in the filling process and dipping of the DPN tips. The etching process can be followed or preceded by selective deposition and patterning of materials to modify the surface properties of the substrate and the microfluidic components. In this embodiment a hydrophobic polymer layer was deposited by chemical vapor deposition using the deep RIE process on the top surface of the silicon wafer while leaving the etched region (microchannel, reservoirs, microwells) free of the polymer. In one embodiment the hydrophobic polymer layer was deposited prior to the etch operation and in another embodiment the hydrophobic polymer was selectively deposited on the substrate after the deep RIE process. The hydrophobic polymer served as barrier for preferred inks that have contact angles less than 90 degrees with silicon and more than 90 degrees with the polymer layer. The polymer barrier serves to prevent capillary wicking of preferred inks contained in microfluidic components (reservoirs, microchannels, and microwells) which are in close proximity. This helps to prevent cross contamination between different inks contained in the device.

Figure 32:
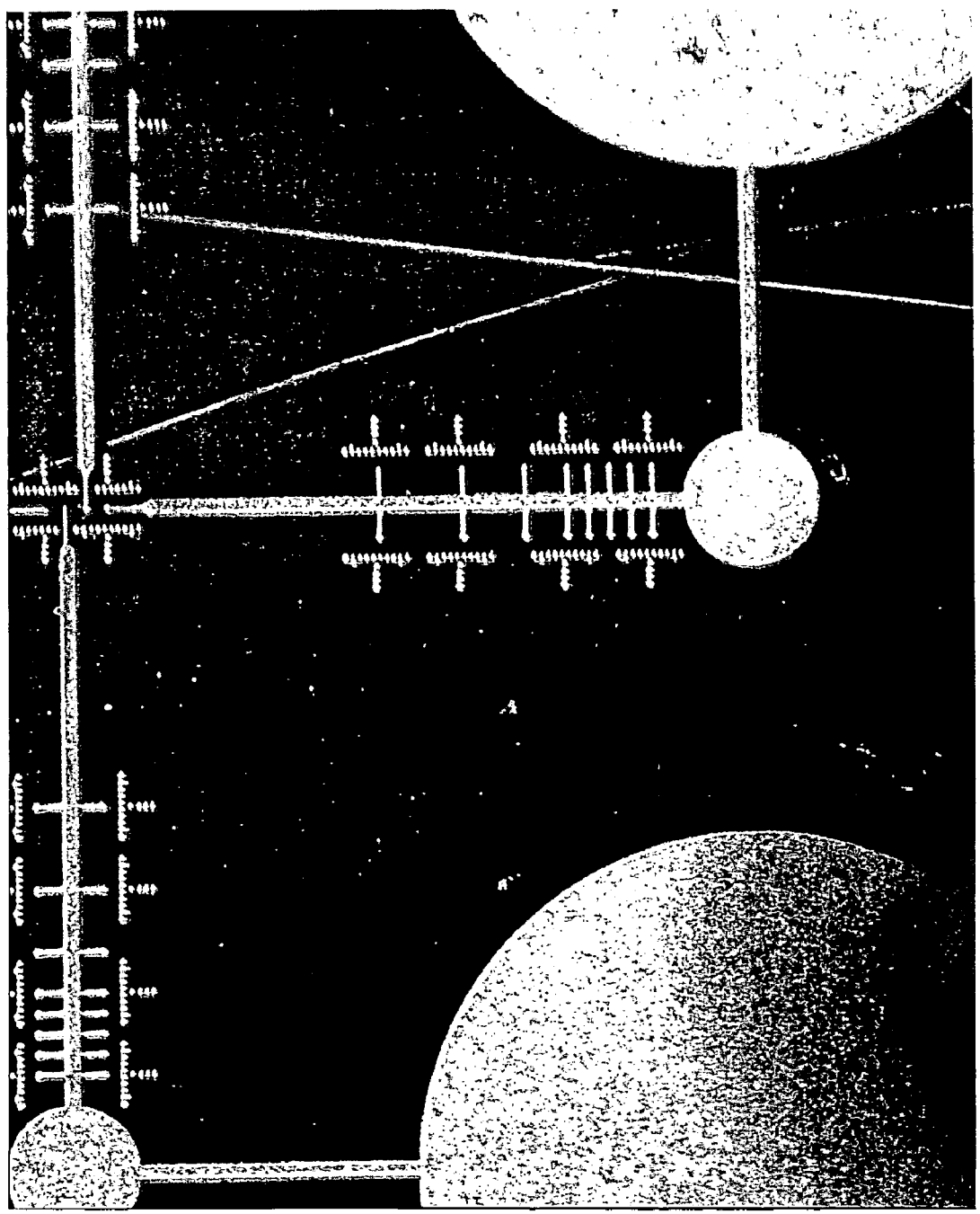
FIG. 32 illustrates SEM picture of inkwell with satellite reservoir.
Figure 33:
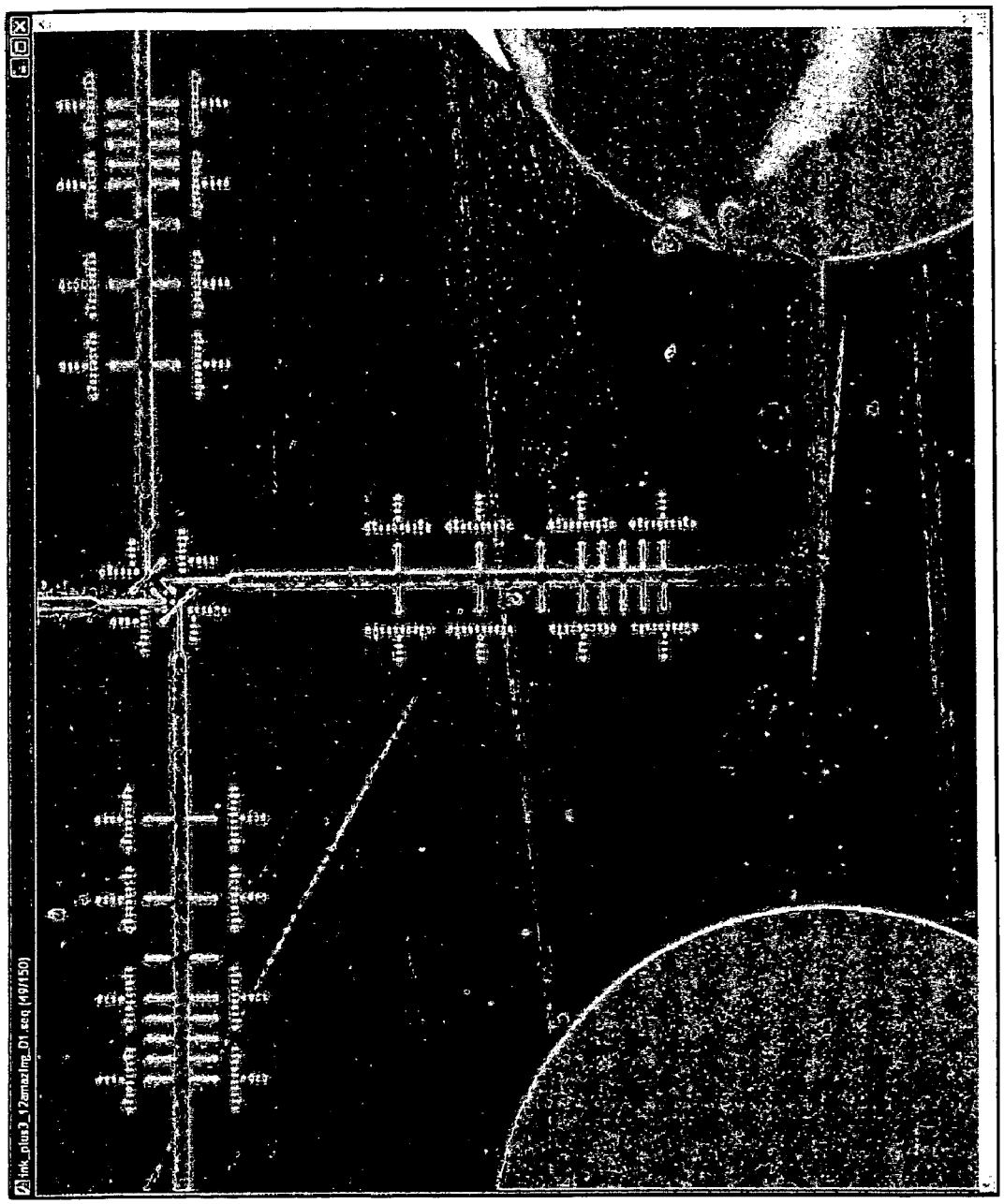
FIG. 33 illustrates SEM picture of inkwell and microchannel filling with ink.
Figure 34:
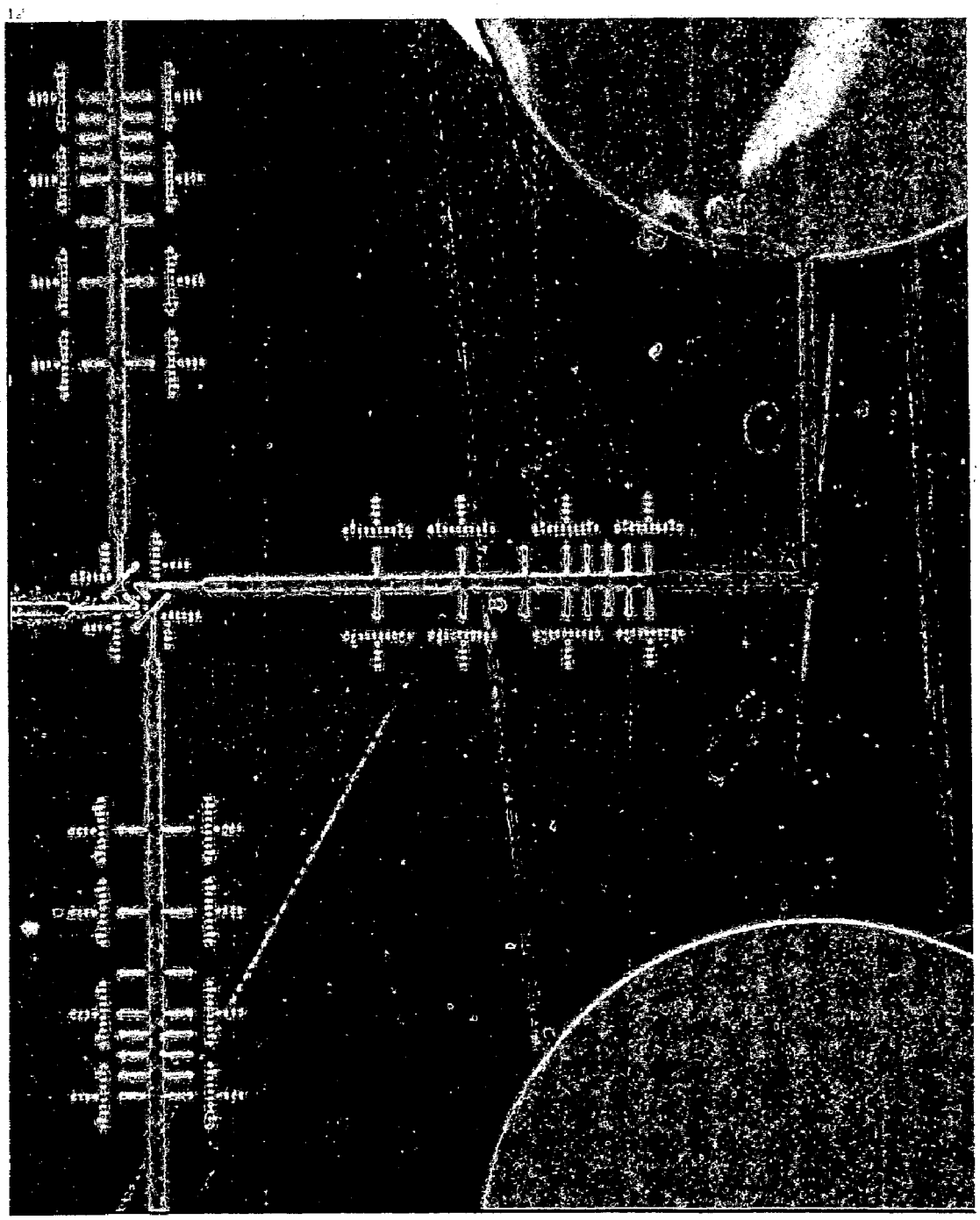
FIG. 34 illustrates SEM picture of inkwell and microchannel with further filling with ink.
Figure 35:
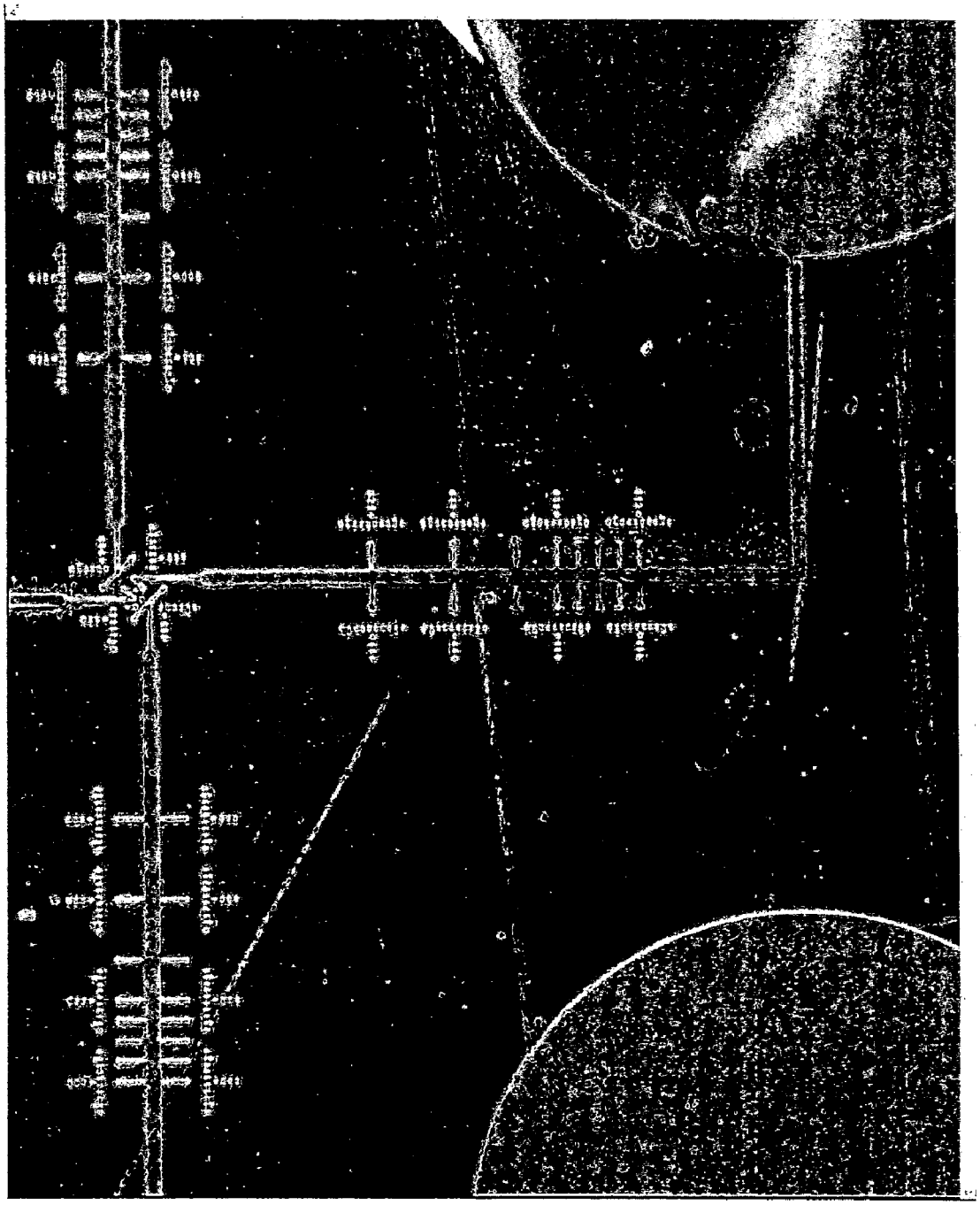
FIG. 35 illustrates SEM picture of inkwell and microchannel with further filling with ink.
Figure 36:
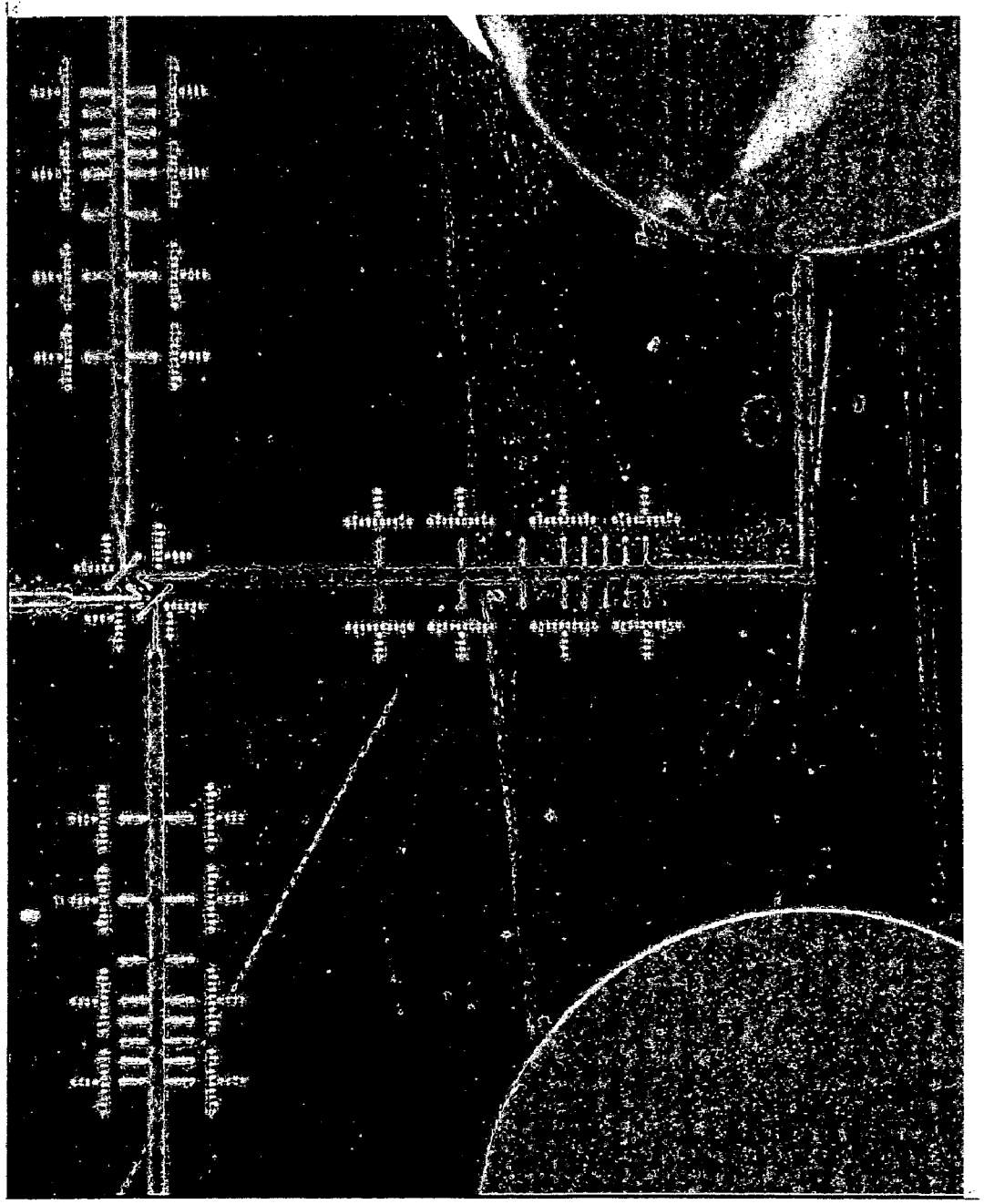
FIG. 36 illustrates SEM picture of inkwell and microchannel with further filling with ink.

Several enhancements can be performed to the design of the microfluidic device demonstrated in this embodiment. The microwell, microchannel and reservoir sizes can be modified to accommodate different rheological properties of the ink. The base of the substrate could be heated or cooled to manipulate the phase change (e.g., evaporation) characteristics of the inks used. The design can modified to incorporate a satellite reservoir or multiple satellite reservoirs to improve the flow characteristics in the device, such as, to trap bubbles from the fluid flowing in the microchannels and to increase the resident time of the fluids in the device by providing supplemental storage for the inks that can be used for replenishment of inks lost by evaporation or other means. The physical dimensions of the microfluidic components (microwells, microchannels, reservoirs, etc.) can be varied to provide flexibility to fluid filling and DPN pen dipping requirements, such as ease of use and robustness of operation. Additionally, alignment features (such as alignment marks) can be fabricated near the microfluidic components to ease the alignment of the pens with the microwells. FIGS. 28–31 show SEM images of different layouts of this microfluidic device that can be used to achieve filling of microwells by capillary action. In FIGS. 28–31, SEM images of inkwells are shown as follows: (FIG. 28) Overview of reservoir and inkwells. (FIG. 29) Close-up view of reservoir. (FIG. 30) Close up of inkwells. (FIG. 31) Cross-section of reservoir. These are demonstrative images. Other types of layouts are also possible which have not been shown in this Figure. FIG. 32 shows an embodiment of the microfluidic device with satellite reservoir incorporated in the layout.

Figure 37A:
FIGS. 37A–C illustrate alignment of multi-pen array with inkwells.
Figure 37B:
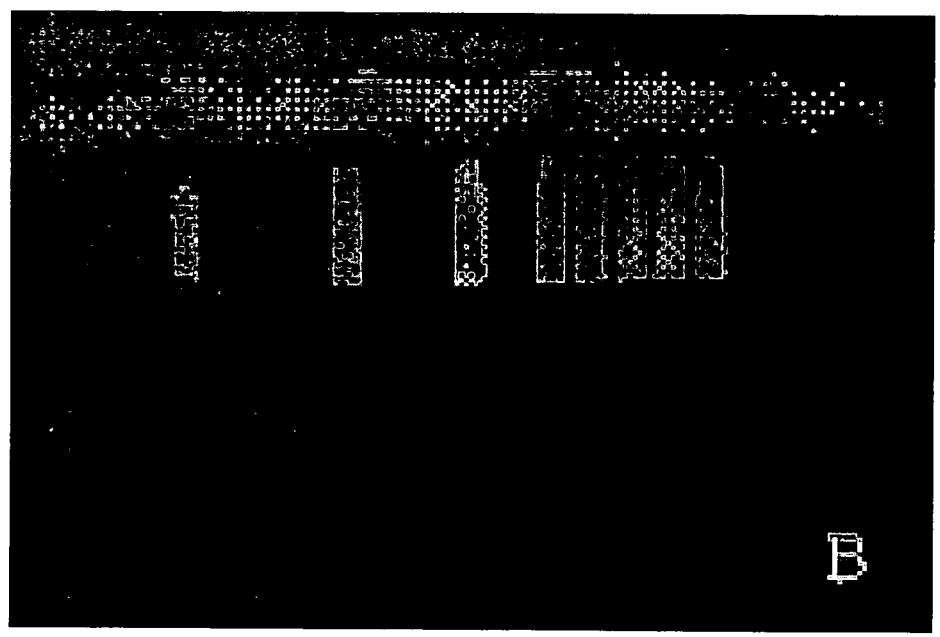
Figure 37C:
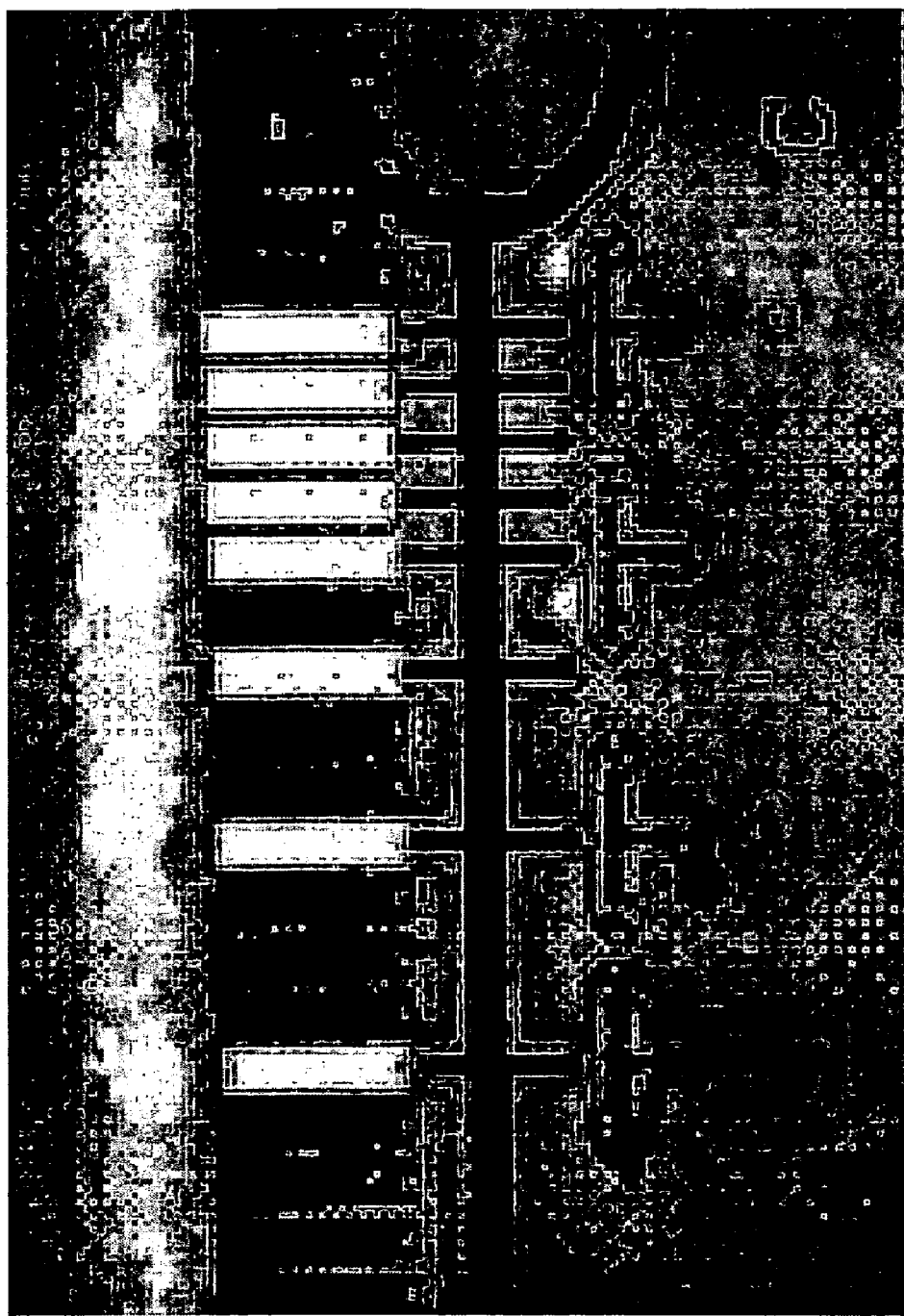

The device operation can be achieved by filling the reservoirs with with nano-liter volume droplets of preferred inks. The device can be filled with multiple inks by different methods. By pushing a commercial syringe, pneumatically, hydraulically or mechanically, the droplets are formed at the tip of a commercially available micro-needle. The droplet can be then deposited into the reservoir by touching it into the reservoir. This can be performed by hand or by robotic manipulation or by any other physical contraption. The reservoirs can also be filled by ink-jet dispensing. The filled reservoirs deliver the inks to the microwells by capillary wetting of the microchannels. The DPN pens are then dipped into the microwells or into the microchannels to coat the DPN pens and or tips with different inks or with the same ink. FIGS. 33–36 show a series of images depicting the filling of microchannel and successive filling of microwells from a reservoir. In FIGS. 33–36, time sequence images of microchannel filling with liquid at 10 ms intervals are shown. FIG. 37A-C shows an image of DPN pens aligned with the microwells which are filled with poly-ethylene glycol solution in water. FIG. 37 illustrates as follows: (A) Multi-pen array is aligned with the inkwells (light on). (B) Tips are dipped into the wells. (C) Illuminated image showing dipped pens reflecting light differently. The images show the dipped pens are identified by the differing intensity of the reflected light.

Figure 38:
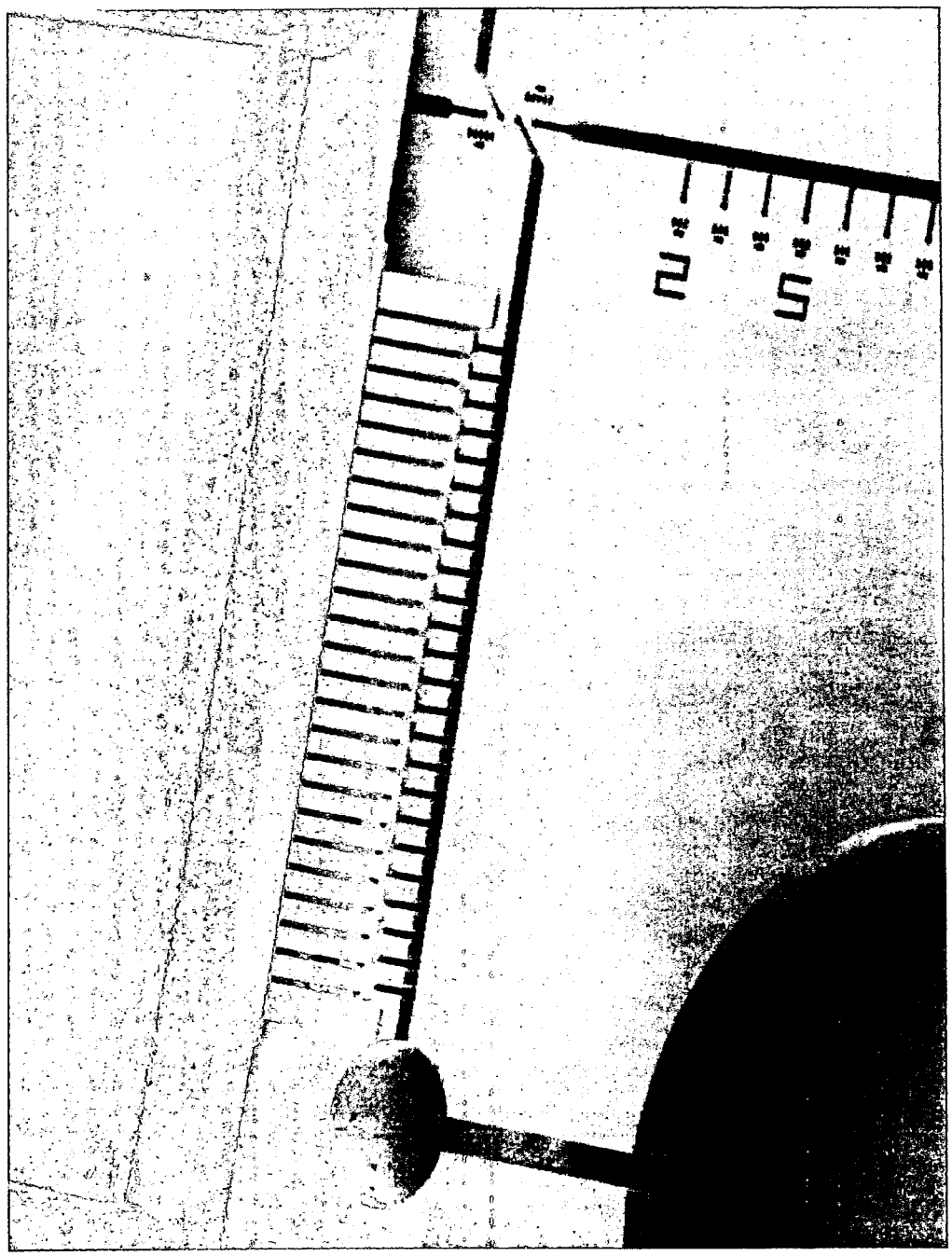
FIG. 38 illustrates SEM picture of inkwell with cantilevers.
Figure 39:
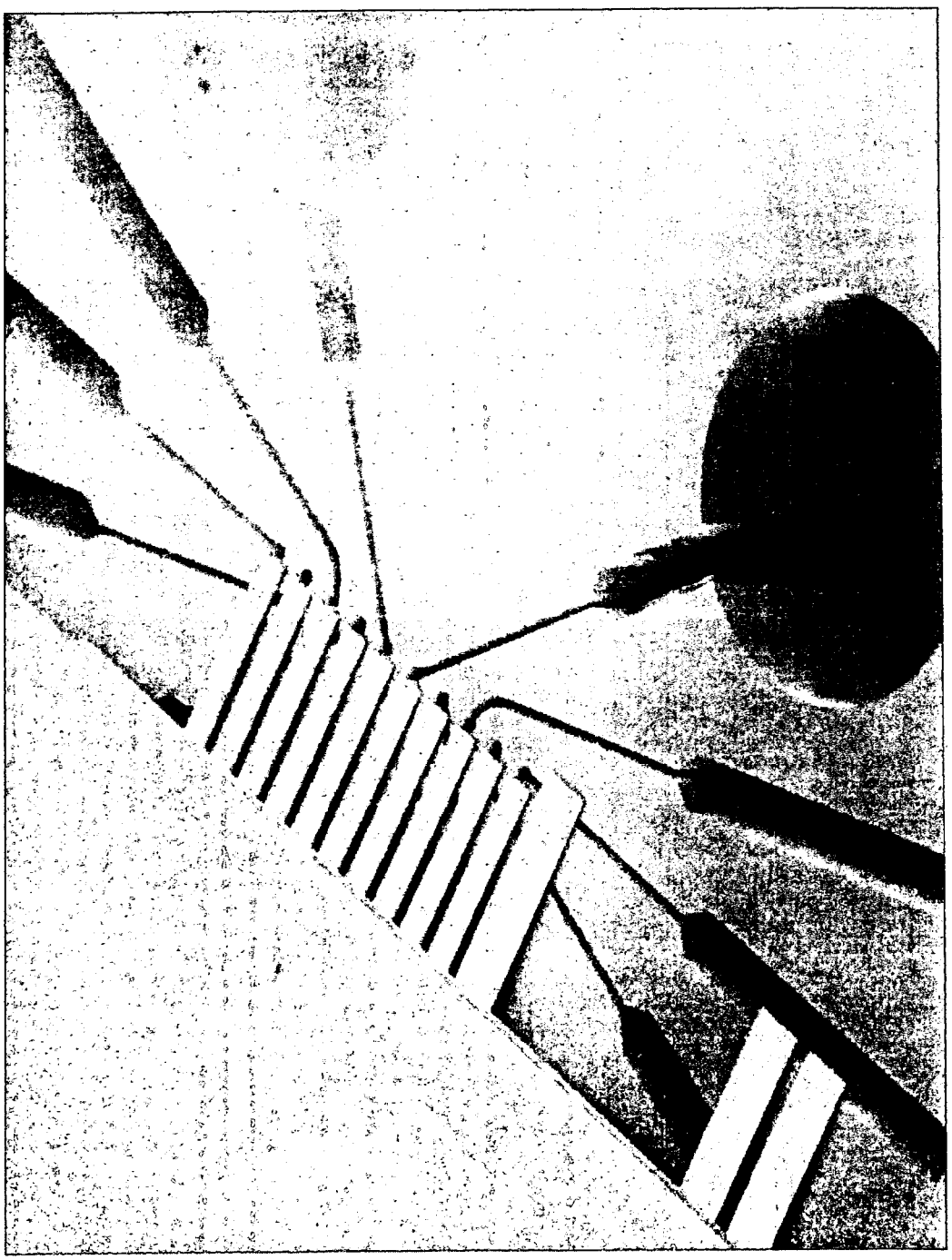
FIG. 39 illustrates SEM picture of inkwell with cantilevers.
Figure 40:
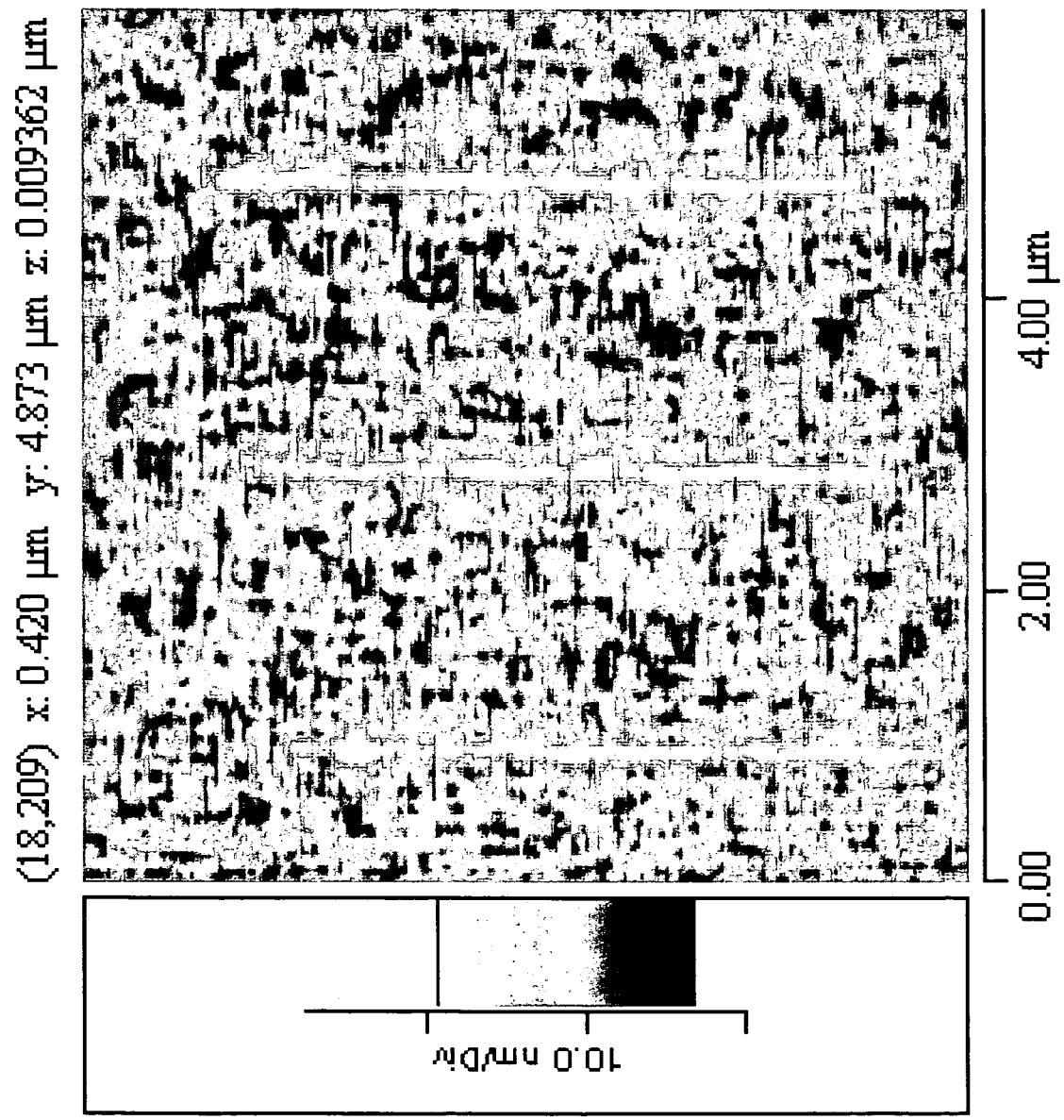
FIG. 40 illustrates LFM image of pattern written with tip.

FIGS. 38 and 39 show magnified SEM images of DPN pens aligned with microwell array in embodiments of the microfluidic device. The pen array dipped in poly-ethylene glycol was used to write patterns on a glass substrate. The patterns written on the glass substrate were then imaged by Lateral Force Microscopy (LFM). FIG. 40 shows an LFM image of the pattern written by one of the tips, from the DPN pen array dipped in polyethylene glycol, onto a glass substrate.

Additional non-limiting examples are provided below.

WORKING EXAMPLE (SATELLITE RESERVOIRS AS BUBBLE TRAPS)

Figure 41:
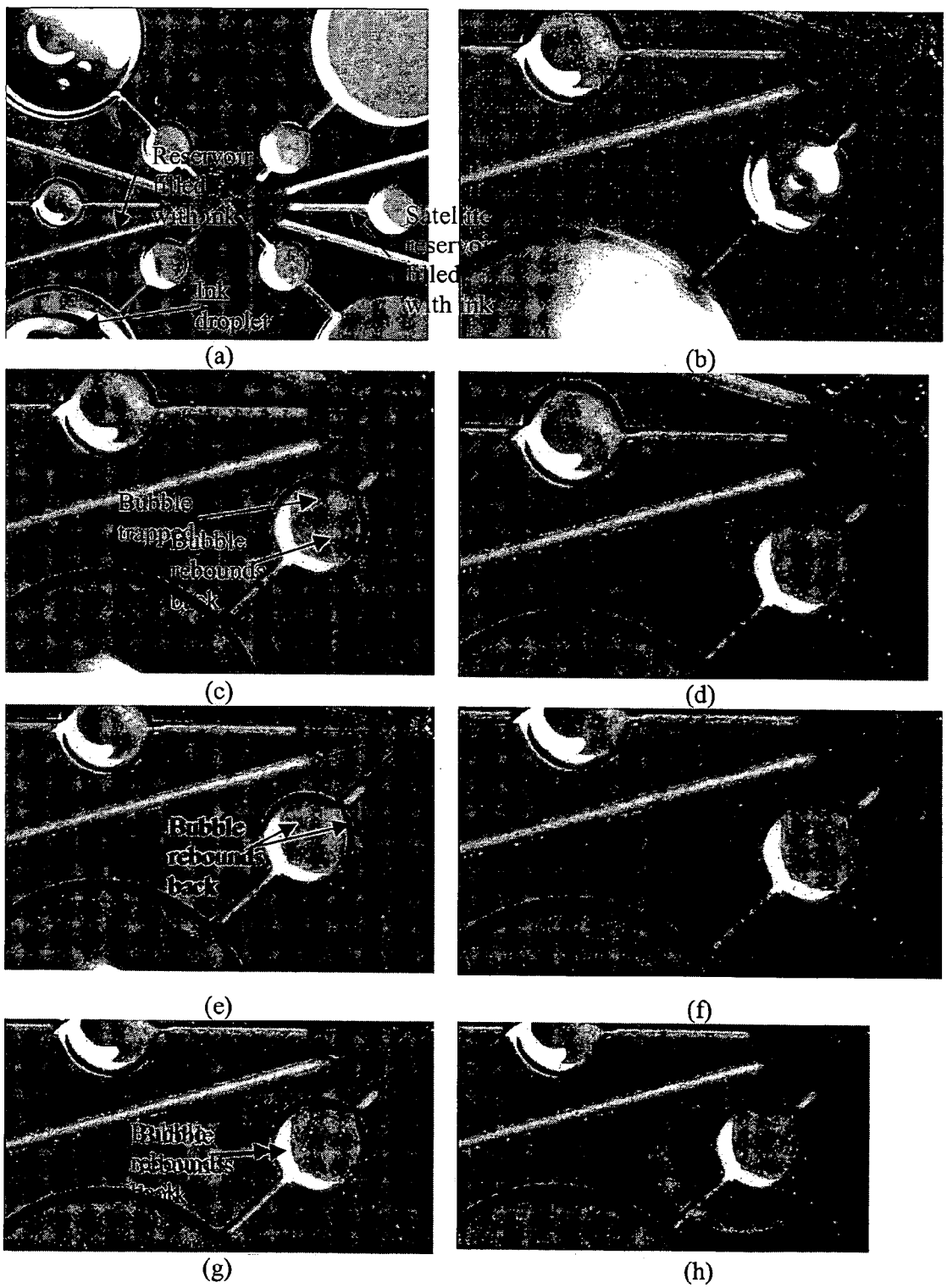
FIG. 41 illustrates time sequence images of an inkwell filling and the trapping of a bubble in a satellite reservoir.

The inkwell design was modified to incorporate a satellite reservoir or multiple satellite reservoirs to improve the flow characteristics in the device such as, for example, to trap bubbles from the fluid flowing in the microchannels and to increase the resident time of the fluids in the device by providing supplemental storage for the inks that can be used for replenishment of inks lost by evaporation or other means. FIGS. 41(a)–(h) demonstrate an example of reduction to practice for an embodiment of this invention. FIG. 41 is a time sequence of images captured by a digital camera at 100 ms intervals.

FIG. 41(a) shows the inkwell apparatus prior to loading with an aqueous ink. The image shows an ink droplet, hanging from the tip of a micro-needle syringe (not shown in the image) just prior to dropping into the reservoir. The reservoir, and the corresponding microwells, and microchannels were empty in this picture. The ink composition was an aqueous solution of 40% ethylene glycol. FIG. 41(b) shows the microchannel, microwells, and the reservoir filled with ink. FIG. 41(c) shows a bubble trapped in the satellite reservoir and rebounding from the wall of the satellite reservoir. The trapped bubble looks like a black dot since it is lying in the shadow of the wall. FIGS. 41(d)–(h) shows the image of the bubble as it rebounds from the wall in a backward motion (from the flow direction). The working example images demonstrated the efficacy of the satellite reservoir as a bubble trap.

WORKING EXAMPLE (INK LOADING APPARATUS)

An ink loading apparatus, and inker, was used to fill the individual reservoirs in the Inkwell with inks. The apparatus comprises a micro-needle syringe (manufacturer: Hamilton Company, Reno, Nev.) mounted on an inker bracket which is attached to a micropositioner model P10 (manufacturer: Miller Design, San Jose, Calif.). The syringe was initially filled with the ink and then mounted on the inker bracket attached to the micropositioner. The P10 has three knobs for moving the inker bracket individually in three orthogonal directions: horizontally, vertically and sideways. The plunger in the syringe was pushed to get a droplet of desired volume to form on the tip of the micro-needle. The knobs of the P10 were then moved to position the droplet over a reservoir. The knob for vertical motion was then rotated to bring the droplet in close proximity of the reservoir bottom. The droplet was then transferred by touching it to the bottom of the reservoir. The reservoir, microchannels and microwells then fill up from the deposited droplet by capillary action. If desired, the syringe plunger may then be pushed further in this position of the micropositioner to deposit additional volumes of ink. The micropositioner can then be used to retract the syringe from the reservoir to break the contact with the deposited droplet. The micropositioner knobs can be moved to position the microneedle tip on top of the next reservoir on the Inkwell.

Figure 42:
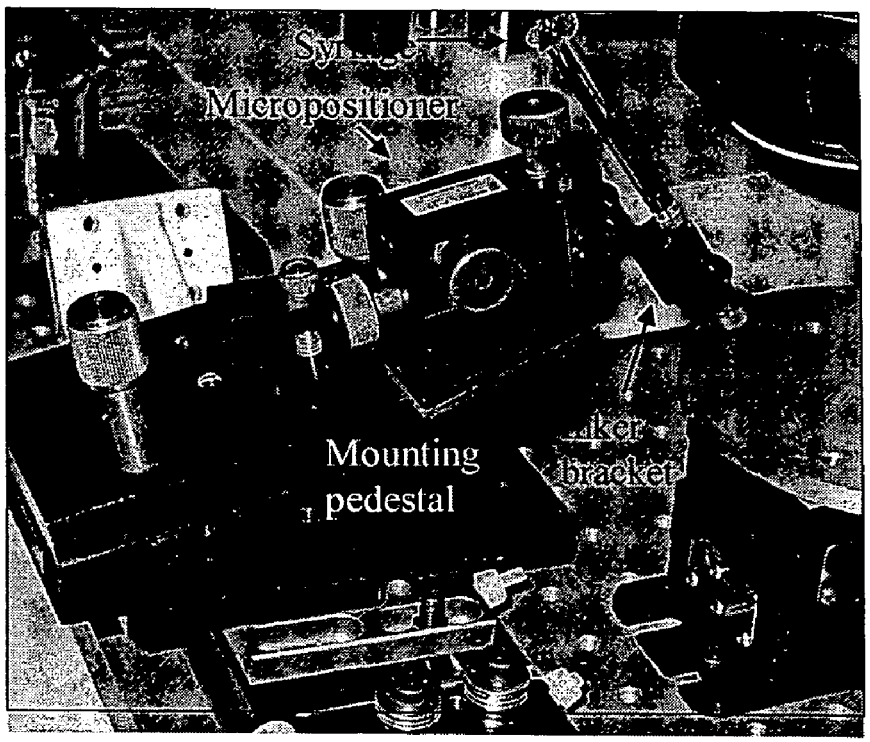
FIG. 42 illustrates use of a microsyringe for positioning next to an inkwell using a mounting pedestal.
Figure 43:
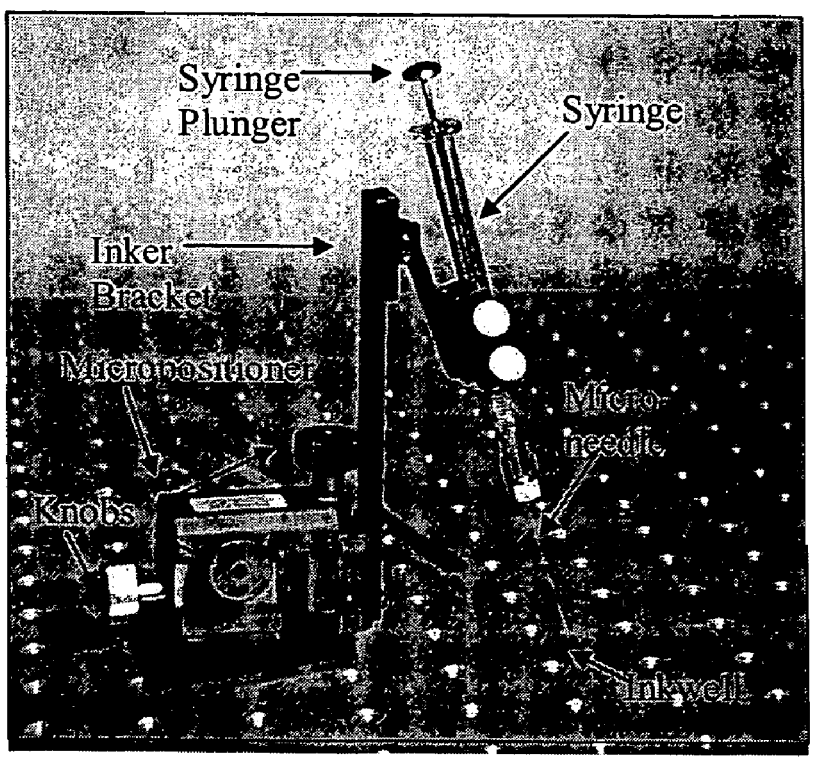
FIG. 43 illustrates use of a microsyringe for position next to an inkwell using a larger inker bracket.

FIG. 42 shows the first embodiment of the inker apparatus. In this arrangement the micropositioner was mounted on a pedestal. FIG. 43 shows an improvement of this embodiment wherein the inker bracket was modified to a different size. This resulted in a simpler arrangement and a pedestal was not required to mount the inker apparatus.

Additional information about probes, tips, inkwells, parallel arrays, and nanolithographic printing can be obtained from the NanoInk, Inc. (Chicago, Ill.) including the NanoInk web site (nanoink.net) including product data sheets and specifications for, for example, dimensions, spring constants, variations of spring constants, tip radius, and tip-to-tip separation.

Although the aforementioned describes preferred embodiments of the invention, the invention is not so restricted. It will be apparent to those skilled in the art that various modifications and variations can be made to the disclosed preferred embodiments of the present invention without departing from the scope or spirit of the invention. Accordingly, it should be understood that the apparatus and method described herein are illustrative only and are not limiting upon the scope of the invention.

All references are hereby incorporated by reference in their entirety.

What is claimed is:

1. An ink delivery device for direct-write nanolithographic printing of inks with use of a tip or tip array comprising:
   ink reservoirs,
   microfluidic channels connected to the ink reservoirs;
   dipping wells connected to the microfluidic channels,
   wherein the dipping wells have a geometry for dipping the tip or tip array into the dipping wells.

2. The ink delivery device according to claim 1, wherein the dipping wells have a geometry such that evaporation of the ink is minimized.

3. The ink delivery device according to claim 1, wherein the microfluidic channels have a geometry such that evaporation of the ink is minimized.

4. The ink delivery device according to claim 1, wherein the ink reservoirs have a geometry such that evaporation of the ink is minimized.

5. The ink delivery device according to claim 1, wherein the dipping wells, the microfluidic channels, and the ink reservoirs have a geometry such that evaporation of the ink is minimized.

6. The ink delivery device according to claim 1, wherein the surface chemistry of the wells and channels, or their surrounding areas, is modified to guide ink to precise locations.

7. The ink delivery device according to claim 5, wherein the surface chemistry is modified with a hydrophilic modification or a hydrophobic modification.

8. The ink delivery device according to claim 1, wherein the device further includes integrated microelectronics.

9. The ink delivery device according to claim 1, wherein the device further includes alignment marks.

10. The ink delivery device according to claim 1, wherein the device further includes posts.

11. The ink delivery device according to claim 1, wherein the microfluidic channels are open channels.

12. The ink delivery device according to claim 1, wherein the microfluidic channels are closed channels.

13. The ink delivery device according to claim 1, wherein the wells are micromachined wells.

14. The ink delivery device according to claim 1, wherein the microfluidic channels become more narrow with the flow of ink to the wells.

15. The ink delivery device according to claim 1, wherein reservoir, channels, and wells are disposed on a silicon wafer.

16. The ink delivery device according to claim 1, wherein the wells or channels are filled with a filler.

17. The ink delivery device according to claim 1, wherein the wells or channels are filled with a filler capable of retaining ink with minimum evaporation.

18. The ink delivery device according to claim 1, further comprising micromechanical pumps and microvalves.

19. A delivery device for direct-write nanolithographic printing using a tip array comprising:
   reservoirs,
   microfluidic channels connected to the reservoirs;
   an array of dipping wells connected to the microfluidic channels,
   wherein the array of dipping wells has a geometry which matches the arrangement of the tip array.

20. A microfluidic device comprising:
   a substrate comprising a surface and a plurality of microchannels which are hydrophilicly surface treated, and
   at least one hydrophobic barrier layer on the surface between the microchannels which prevents cross contamination between the plurality of microchannels when liquid flows through the microchannels.

* * * * *